(12) United States Patent
Horiuchi et al.

(10) Patent No.: US 9,899,613 B2
(45) Date of Patent: *Feb. 20, 2018

(54) ORGANIC LIGHT-EMITTING ELEMENT

(71) Applicant: CANON KABUSHIKI KAISHA, Tokyo (JP)

(72) Inventors: Takayuki Horiuchi, Tokyo (JP); Tetsuya Kosuge, Yokohama (JP); Hirokazu Miyashita, Tokyo (JP); Yosuke Nishide, Kawasaki (JP); Shigemoto Abe, Yokohama (JP); Naoki Yamada, Inagi (JP); Jun Kamatani, Tokyo (JP); Akihito Saitoh, Gotemba (JP); Kengo Kishino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 14/758,683

(22) PCT Filed: Jan. 20, 2014

(86) PCT No.: PCT/JP2014/051598
§ 371 (c)(1),
(2) Date: Jun. 30, 2015

(87) PCT Pub. No.: WO2014/112658
PCT Pub. Date: Jul. 24, 2014

(65) Prior Publication Data
US 2015/0357586 A1 Dec. 10, 2015

(30) Foreign Application Priority Data

Jan. 21, 2013 (JP) .................................. 2013-008464

(51) Int. Cl.
*H01L 51/50* (2006.01)
*H01L 51/00* (2006.01)
(Continued)

(52) U.S. Cl.
CPC .......... *H01L 51/0085* (2013.01); *C09K 11/06* (2013.01); *H01L 27/322* (2013.01);
(Continued)

(58) Field of Classification Search
None
See application file for complete search history.

(56) References Cited

U.S. PATENT DOCUMENTS 6,824,894 B2  11/2004  Takiguchi et al.
7,078,115 B2   7/2006  Takiguchi et al.
(Continued)

FOREIGN PATENT DOCUMENTS

JP    2004-91444 A    3/2004
WO    2007/143201 A1  12/2007
(Continued)

OTHER PUBLICATIONS

Extended European Search Report dated Aug. 8, 2016, in counterpart EP application No. 14740483.4 (5 pages).
(Continued)

*Primary Examiner* — Gregory Clark
(74) *Attorney, Agent, or Firm* — Fitzpatrick, Cella, Harper & Scinto

(57) ABSTRACT

Provided is an organic light-emitting element having high light-emitting efficiency and a long element lifetime. Specifically, provided is an organic light-emitting element, including: an anode; a cathode; and an organic compound layer placed between the anode and the cathode, in which: the organic compound layer includes an emission layer; the emission layer includes at least a host and a guest; the guest is an iridium complex of a specific structure; the host is a heterocycle-containing compound; and a content of the host is 50 wt % or more with reference to a total amount of constituent materials for the emission layer.

28 Claims, 1 Drawing Sheet

(51) Int. Cl.
*H01L 51/52* (2006.01)
*H01L 27/32* (2006.01)
*C09K 11/06* (2006.01)

(52) U.S. Cl.
CPC ...... *H01L 27/3209* (2013.01); *H01L 51/0054* (2013.01); *H01L 51/0058* (2013.01); *H01L 51/0073* (2013.01); *H01L 51/0074* (2013.01); *H01L 51/5004* (2013.01); *H01L 51/5206* (2013.01); *H01L 51/5234* (2013.01); *C09K 2211/1007* (2013.01); *C09K 2211/1011* (2013.01); *C09K 2211/1029* (2013.01); *C09K 2211/1088* (2013.01); *C09K 2211/1092* (2013.01); *C09K 2211/185* (2013.01); *H01L 51/5016* (2013.01); *H01L 51/5024* (2013.01); *H01L 2251/305* (2013.01)

(56) References Cited

U.S. PATENT DOCUMENTS

| | | | |
|---|---|---|---|
| 7,232,618 | B2 | 6/2007 | Yamada et al. |
| 7,976,958 | B2 | 7/2011 | Takiguchi et al. |
| 8,330,153 | B2 | 12/2012 | Ooishi et al. |
| 2008/0210930 | A1 | 9/2008 | Kamatani et al. |
| 2008/0265491 | A1 | 10/2008 | Yamauchi et al. |
| 2010/0219407 | A1 | 9/2010 | Kamatani et al. |
| 2010/0289406 | A1 | 11/2010 | Ma et al. |
| 2013/0323719 | A1 | 12/2013 | Cysewski et al. |
| 2016/0145281 | A1 | 5/2016 | Cysewski et al. |

FOREIGN PATENT DOCUMENTS

| | | |
|---|---|---|
| WO | 2009/060995 A1 | 5/2009 |
| WO | 2010/028151 A1 | 3/2010 |
| WO | 2010/137285 A1 | 12/2010 |
| WO | 2012/107419 A1 | 8/2012 |

OTHER PUBLICATIONS

Y. Terao, et al., "Palladiuim-Catalyzed Cross-Coupling of Benzyl Ketones and Alpha, Beta-Unsaturated Carbonyl and Phenolic Compounds with o-Dibromobezenes to Produce Cyclic Products", Bull. Chem. Soc. Jpn., vol. 72, pp. 2345-2350 (1999).
Pending U.S. Appl. No. 14/648,095, filed May 28, 2015 (not yet published).
Pending U.S. Appl. No. 14/648,494, filed May 29, 2015 (not yet published).
Pending U.S. Appl. No. 14/649,048, filed Jun. 2, 2015 (not yet published).
Pending U.S. Appl. No. 14/764,204, filed Jul. 29, 2015 (not yet published).
Pending U.S. Appl. No. 14/764,376, filed Jul. 29, 2015 (not yet published)
Pending U.S. Appl. No. 14/761,049, filed Jul. 15, 2015 (not yet published).
Pending U.S. Appl. No. 14/760,093, filed Jul. 9, 2015 (not yet published).

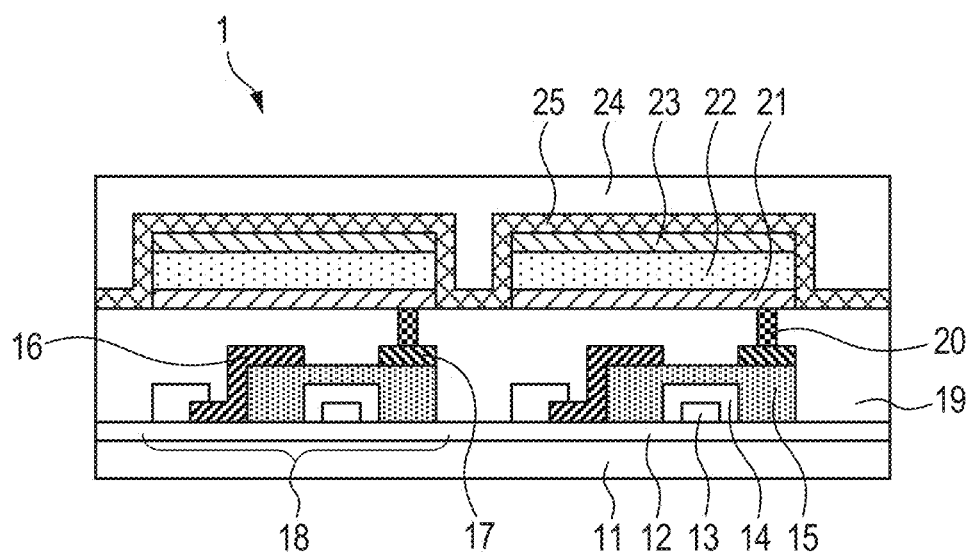

ORGANIC LIGHT-EMITTING ELEMENT

TECHNICAL FIELD

The present invention relates to an organic light-emitting element.

BACKGROUND ART

Organic light-emitting elements (organic electroluminescent elements or organic EL elements) are each an electronic element including an anode, a cathode, and an organic compound layer placed between both of these electrodes. A hole and electron injected from both the electrodes recombine in the organic compound layer to produce an exciton, and the organic light-emitting element emits light upon return of the exciton to its ground state. Recent advance of the organic light-emitting elements is significant and the advanced light-emitting elements have, for example, the following features. The elements can be driven at low voltages, emit light beams having various wavelengths, have high-speed responsiveness, and can be reduced in thickness and weight.

Of the organic light-emitting elements, a phosphorescent light-emitting element is an organic light-emitting element that: includes, in its organic compound layer, a material that emits phosphorescence; and provides light emission derived from a triplet exciton of the material that emits phosphorescence. In recent years, creation of a novel phosphorescent light-emitting material has been vigorously performed for providing a high-performance phosphorescent light-emitting element.

For example, a trivalent iridium complex having a metal-carbon bond has been frequently used as a guest material for a phosphorescent light-emitting element because of its high phosphorescence quantum yield. Meanwhile, PTL 1 describes an iridium complex shown below in which three different kinds of bidentate ligands coordinate to iridium.

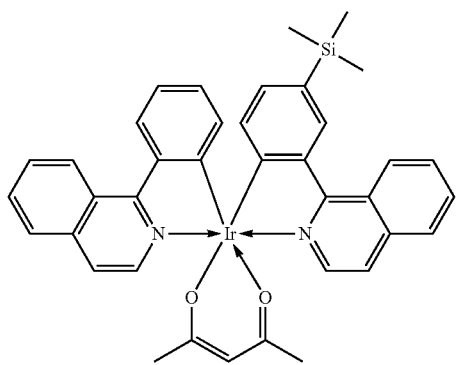

CITATION LIST

Patent Literature

PTL 1: International Publication No. WO2007/143201
PTL 2: International Publication No. WO2010/028151
PTL 3: International Publication No. WO2009/060995
PTL 4: International Publication No. WO2010/137285
PTL 5: Japanese Patent Application Laid-Open No. 2004-091444

Non Patent Literature

NPL 1: Bull. Chem. Soc. Jpn. (1999), Vol. 72, 2345-2350

SUMMARY OF INVENTION

Solution to Problem

Thus, according to one aspect of the present invention, there is provided an organic light-emitting element, including: an anode; a cathode; and an organic compound layer placed between the anode and the cathode, in which: the organic compound layer includes an emission layer; the emission layer includes at least a host and a guest; the guest includes an iridium complex represented by the following general formula [1]; the host includes a heterocycle-containing compound; and the content of the host is 50 wt % or more with reference to the total amount of constituent materials for the emission layer:

$$Ir(L_1)(L_2)(L_3) \quad [1]$$

in the general formula [1], a partial structure $IrL_1$ includes a partial structure represented by the following general formula [2]:

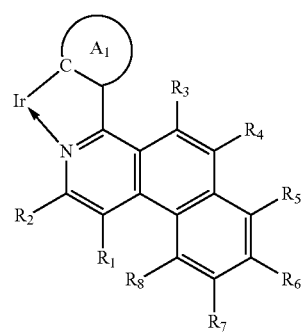

[2]

In the general formula [2], a ring $A_1$ represents an aromatic ring or an aromatic heterocycle, and the aromatic ring and aromatic heterocycle each represented by the ring $A_1$ may each further have a substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

$R_1$ to $R_8$ each represent a hydrogen atom, an alkyl group having 1 or more and 4 or less carbon atoms, an aralkyl group, an aryl group, a heterocyclic group, a substituted amino group, an alkoxy group, an aryloxy group, a halogen atom, or a cyano group, and may be identical to or different from one another, and when any one of substituents represented by the $R_1$ to $R_8$ is an alkyl group having 1 or more and 4 or less carbon atoms, an aralkyl group, an aryl group, a heterocyclic group, a substituted amino group, an alkoxy group, or an aryloxy group, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

In the general formula [1], a partial structure $IrL_2$ includes a partial structure represented by the following general formula [3].

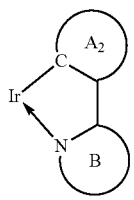

In the general formula [3], a ring $A_2$ represents an aromatic ring or an aromatic heterocycle, and the aromatic ring and aromatic heterocycle each represented by the ring $A_2$ may each further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

A ring B represents a nitrogen-containing aromatic heterocycle, and the nitrogen-containing aromatic heterocycle represented by the ring B may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

$L_1$ and $L_2$ represent ligands that are different from each other and are not identical to each other.

In the general formula [1], $L_3$ represents a monovalent bidentate ligand having a first atom that forms a coordinate bond with iridium and is selected from N, O, S, and P, and a second atom that forms a coordinate bond with iridium and is selected from N, O, S, and P. It is to be noted that the first atom and the second atom may be identical to or different from each other.

Further features of the present invention will become apparent from the following description of exemplary embodiments with reference to the attached drawing.

BRIEF DESCRIPTION OF DRAWING

FIG. 1 is a schematic sectional view illustrating an example of a display apparatus including an organic light-emitting element and a switching element to be connected to the organic light-emitting element.

DESCRIPTION OF EMBODIMENTS

No reference has been made to the sublimability and heat stability of the complex proposed in PTL 1, and hence whether or not its sublimation purification or vacuum deposition can be performed is unclear.

The present invention has been accomplished to solve the problems, and an object of the present invention is to provide an organic light-emitting element having high light-emitting efficiency and a long element lifetime.

Hereinafter, the present invention is described in detail.
(1) Organic Light-Emitting Element An organic light-emitting element of the present invention is a light-emitting element including at least: an anode and a cathode; and an organic compound layer placed between the anode and the cathode. In addition, the organic compound layer of the organic light-emitting element of the present invention includes at least an emission layer, and the emission layer includes at least a host and a guest. In the present invention, the host is a heterocycle-containing compound and the guest is an iridium complex represented by the following general formula [1].

$$Ir(L_1)(L_2)(L_3) \qquad [1]$$

It is to be noted that details about the heterocycle-containing compound as the host and the iridium complex represented by the general formula [1] as the guest are described later. In addition, in the present invention, the content of the host is 50 wt % or more with reference to the total amount of the constituent materials for the emission layer.

The element construction of the organic light-emitting element of the present invention is, for example, a multi-layer-type element construction obtained by sequentially stacking, on a substrate, electrode layers and an organic compound layer described in each of the following constructions (1) to (4). It is to be noted that in each of the element constructions, the organic compound layer necessarily includes an emission layer including a light-emitting material.
(1) Anode/emission layer/cathode
(2) Anode/hole transport layer/emission layer/electron transport layer/cathode
(3) Anode/hole injection layer/hole transport layer/emission layer/electron transport layer/cathode
(4) Anode/hole transport layer/emission layer/hole/exciton blocking layer/electron transport layer/cathode It is to be noted that those element construction examples are only very basic element constructions and the element construction of the organic light-emitting element of the present invention is not limited thereto.

For example, the following various layer constructions can each be adopted: an insulating layer, an adhesion layer, or an interference layer is provided at an interface between an electrode and the organic compound layer, the electron transport layer or the hole transport layer is constructed of two layers having different ionization potentials, or the emission layer is constructed of two layers including different light-emitting materials.

In the present invention, the aspect according to which light output from the emission layer is extracted (element form) may be the so-called bottom emission system in which the light is extracted from an electrode on a side closer to the substrate or may be the so-called top emission system in which the light is extracted from a side opposite to the substrate. In addition, a double-face extraction system (tandem system) in which the light is extracted from each of the side closer to the substrate and the side opposite to the substrate can be adopted.

In the organic light-emitting element of the present invention, the iridium complex represented by the general formula [1] as the guest and the heterocycle-containing compound as the host are incorporated into the emission layer. The applications of the compounds to be incorporated into the emission layer in this case vary depending on their content concentrations in the emission layer. Specifically, the compounds are classified into a main component and a sub-component depending on their content concentrations in the emission layer.

The compound serving as the main component is a compound having the largest weight ratio (content concentration) out of the group of compounds to be incorporated into the emission layer and is a compound also called a host. In addition, the host is a compound present as a matrix around the light-emitting material in the emission layer, and is a compound mainly responsible for the transport of a carrier to the light-emitting material and the donation of an excitation energy to the light-emitting material.

In addition, the compound serving as the sub-component is a compound except the main component and can be called a guest (dopant), a light emission assist material, or a charge-injecting material depending on a function of the compound. The guest as one kind of sub-component is a compound (light-emitting material) responsible for main light emission in the emission layer. The light emission assist material as one kind of sub-component is a compound that assists the light emission of the guest and is a compound having a smaller weight ratio (content concentration) in the emission layer than that of the host. The light emission assist material is also called a second host by virtue of its function.

The concentration of the guest with respect to the host is 0.01 wt % or more and 50 wt % or less, preferably 0.1 wt % or more and 20 wt % or less with reference to the total amount of the constituent materials for the emission layer. The concentration of the guest is particularly preferably 1 wt % or more and 15 wt % or less from the viewpoint of preventing concentration quenching.

In the present invention, the guest may be uniformly incorporated into the entirety of the layer in which the host serves as a matrix, or may be incorporated so as to have a concentration gradient. In addition, the guest may be partially incorporated into a specific region in the emission layer to make the layer a layer having a region free of the guest and formed only of the host.

In the present invention, both the iridium complex represented by the general formula [1] and the heterocycle-containing compound to be described later are incorporated as the guest and the host, respectively, into the emission layer. In this case, in addition to the iridium complex represented by the general formula [1], another phosphorescent light-emitting material may be further incorporated into the emission layer for assisting the transfer of an exciton or a carrier.

In addition, a compound different from the heterocycle-containing compound as the host may be further incorporated as the second host (or the light emission assist material) into the emission layer for assisting the transfer of the exciton or the carrier. When the second host (or the light emission assist material) is incorporated into the emission layer, the content of the second host (or the light emission assist material) is desirably less than 50 wt % with reference to the total amount of the constituent materials for the emission layer.

(2) Iridium Complex

In the organic light-emitting element of the present invention, the iridium complex to be incorporated as the guest into the emission layer is a compound represented by the following general formula [1].

$$Ir(L_1)(L_2)(L_3) \qquad [1]$$

In the general formula [1], $L_1$, $L_2$, and $L_3$ represent bidentate ligands different from one another. Here, a partial structure $IrL_1$ is specifically a partial structure represented by the following general formula [2].

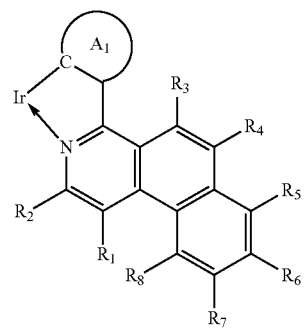

In the general formula [2], a ring $A_1$ represents an aromatic ring or an aromatic heterocycle.

Examples of the aromatic ring represented by the ring $A_1$ include, but, of course, not limited to, a benzene ring, a naphthalene ring, a fluorene ring, a phenanthrene ring, an anthracene ring, a chrysene ring, a triphenylene ring, and a pyrene ring. Of those, a benzene ring, a naphthalene ring, a fluorene ring, or a phenanthrene ring is preferred from the viewpoint of controlling the color of the phosphorescence of the iridium complex represented by the general formula [1] to an orange color to a red color.

Examples of the aromatic heterocycle represented by the ring $A_1$ include, but, of course, not limited to, a thiophene ring, a furan ring, an imidazole ring, a pyridine ring, a benzothiophene ring, a benzofuran ring, a quinoline ring, a carbazole ring, a dibenzofuran ring, and a dibenzothiophene ring. Of those, a carbazole ring, a dibenzofuran ring, or a dibenzothiophene ring is preferred from the viewpoint of controlling the color of the phosphorescence of the iridium complex represented by the general formula [1] to an orange color to a red color.

It is to be noted that in the present invention, the aromatic ring and aromatic heterocycle each represented by the ring $A_1$ may further have a substituent selected from: an alkyl group having 1 or more and 4 or less carbon atoms selected from a methyl group, an ethyl group, an n-propyl group, an isopropyl group, an n-butyl group, a 1-methylpropyl group, a 2-methylpropyl group, and a tert-butyl group; an aralkyl group such as a benzyl group or a phenethyl group; an aryl group such as a phenyl group, a biphenyl group, a terphenyl group, a naphthyl group, a fluorenyl group, a phenanthrenyl group, an anthracenyl group, a chrysenyl group, a triphenylenyl group, a pyrenyl group, a dimethylphenyl group, or a difluorophenyl group; a heterocyclic group such as a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, a dibenzothienyl group, or a dimethylpyridyl group; a substituted amino group such as a dimethylamino group, a diethylamino group, a dibenzylamino group, a diphenylamino group, or a ditolylamino group; an alkoxy group such as a methoxy group, an ethoxy group, an isopropoxy group, or a tert-butoxy group; an aryloxyl group such as a phenoxy group; a halogen atom such as a fluorine, chlorine, bromine, or iodine atom; and a cyano group. Here, the alkyl group that the aromatic ring and aromatic heterocycle each represented by the ring $A_1$ may further have also includes an alkyl group in which a hydrogen atom in the substituent is substituted with a fluorine atom.

In the general formula [2], $R_1$ to $R_8$ each represent a hydrogen atom, an alkyl group having 1 or more and 4 or less carbon atoms, an aralkyl group, an aryl group, a heterocyclic group, a substituted amino group, an alkoxy group, an aryloxy group, a halogen atom, or a cyano group.

Examples of the alkyl group represented by any one of $R_1$ to $R_8$ include a methyl group, an ethyl group, an n-propyl group, an isopropyl group, an n-butyl group, a 1-methylpropyl group, a 2-methylpropyl group, and a tert-butyl group.

Examples of the aralkyl group represented by any one of $R_1$ to $R_8$ include a benzyl group and a phenethyl group.

Examples of the aryl group represented by any one of $R_1$ to $R_8$ include a phenyl group, a biphenyl group, a terphenyl group, a naphthyl group, a fluorenyl group, a phenanthrenyl group, an anthracenyl group, a chrysenyl group, a triphenylenyl group, and a pyrenyl group.

Examples of the heterocyclic group represented by any one of $R_1$ to $R_8$ include a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, and a dibenzothienyl group.

Examples of the substituted amino group represented by any one of $R_1$ to $R_8$ include a dimethylamino group, a diethylamino group, a dibenzylamino group, a diphenylamino group, and a ditolylamino group.

Examples of the alkoxy group represented by any one of $R_1$ to $R_8$ include a methoxy group, an ethoxy group, an isopropoxy group, and a tert-butoxy group.

An example of the aryloxy group represented by any one of $R_1$ to $R_8$ is a phenoxy group.

Examples of the halogen atom represented by any one of $R_1$ to $R_8$ include fluorine, chlorine, bromine, and iodine atoms.

Substituents represented by $R_1$ to $R_8$, in particular, substituents represented by $R_5$ to $R_8$ are each preferably an alkyl group or a phenyl group. This is because an alkyl group and a phenyl group each exhibit an effect of weakening an intermolecular interaction between complex molecules such as π-π stacking. In addition, an intermolecular interaction when alkyl groups or phenyl groups are brought close to each other is weak, and hence an effect of strengthening the intermolecular interaction between the complex molecules is not exhibited. It is to be noted that a phenyl group has a small ring plane and hence acts as an alienating group rather than causing the π-π stacking.

It is to be noted that upon introduction of alkyl groups as the substituents represented by $R_1$ to $R_8$, the alkyl groups to be introduced are each preferably an alkyl group having 1 or more and 4 or less carbon atoms because the sublimability of the complex itself reduces when the number of carbon atoms is excessively large. The same holds true for alkyl groups that can be incorporated into the ligands $L_2$ and $L_3$.

In the general formula [2], $R_1$ to $R_8$ may be identical to or different from one another.

It is to be noted that when any one of the substituents represented by $R_1$ to $R_8$ is an alkyl group having 1 or more and 4 or less carbon atoms, an aralkyl group, an aryl group, a heterocyclic group, a substituted amino group, an alkoxy group, or an aryloxy group, the substituent of interest may further have a substituent selected from: an alkyl group having 1 or more and 4 or less carbon atoms selected from a methyl group, an ethyl group, an n-propyl group, an isopropyl group, an n-butyl group, a 1-methylpropyl group, a 2-methylpropyl group, and a tert-butyl group; an aralkyl group such as a benzyl group or a phenethyl group; an aryl group such as a phenyl group, a biphenyl group, a terphenyl group, a naphthyl group, a fluorenyl group, a phenanthrenyl group, an anthracenyl group, a chrysenyl group, a triphenylenyl group, or a pyrenyl group; a heterocyclic group such as a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, or a dibenzothienyl group; a substituted amino group such as a dimethylamino group, a diethylamino group, a dibenzylamino group, a diphenylamino group, or a ditolylamino group; an alkoxy group such as a methoxy group, an ethoxy group, an isopropoxy group, or a tert-butoxy group; an aryloxy group such as a phenoxy group; a halogen atom such as a fluorine, chlorine, bromine, or iodine atom; and a cyano group. Here, the alkyl group that the substituents represented by $R_1$ to $R_8$ may further have also includes an alkyl group in which a hydrogen atom in the substituent is substituted with a fluorine atom.

The partial structure represented by the general formula [2] is preferably a partial structure represented by the following general formula [4].

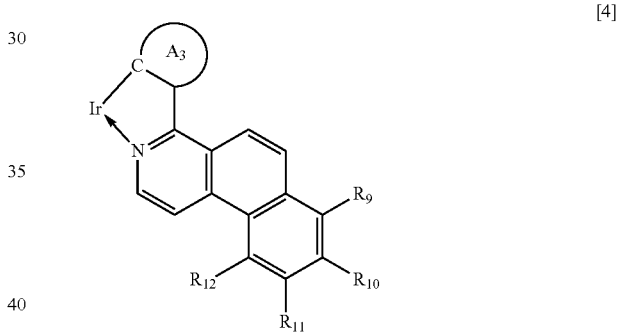

[4]

In the general formula [4], a ring $A_3$ is a ring structure selected from a benzene ring, a naphthalene ring, a fluorene ring, a phenanthrene ring, a carbazole ring, a dibenzofuran ring, and a dibenzothiophene ring.

It is to be noted that the ring $A_3$ may further have a substituent selected from: an alkyl group having 1 or more and 4 or less carbon atoms selected from a methyl group, an ethyl group, an n-propyl group, an isopropyl group, an n-butyl group, a 1-methylpropyl group, a 2-methylpropyl group, and a tert-butyl group; an aralkyl group such as a benzyl group or a phenethyl group; an aryl group such as a phenyl group, a biphenyl group, a terphenyl group, a naphthyl group, a fluorenyl group, a phenanthrenyl group, an anthracenyl group, a chrysenyl group, a triphenylenyl group, or a pyrenyl group; a heterocyclic group such as a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, or a dibenzothienyl group; a substituted amino group such as a dimethylamino group, a diethylamino group, a dibenzylamino group, a diphenylamino group, or a ditolylamino group; an alkoxy group such as a methoxy group, an ethoxy group, an isopropoxy group, or a tert-butoxy group; an aryloxy group such as a phenoxy group; a halogen atom such as a fluorine, chlorine, bromine, or iodine atom; and a cyano group.

In the general formula [4], $R_9$ to $R_{12}$ each represent a hydrogen atom, an alkyl group having 1 or more and 4 or less carbon atoms, or a phenyl group, and may be identical to or different from one another.

Specific examples of the alkyl group having 1 or more and 4 or less carbon atoms and phenyl group each represented by any one of $R_9$ to $R_{12}$ are same as the specific examples of $R_1$ to $R_8$ in the general formula [2].

It is to be noted that when any one of the substituents each represented by $R_9$ to $R_{12}$ is an alkyl group having 1 or more and 4 or less carbon atoms or a phenyl group, the corresponding substituent may further have a substituent selected from: an alkyl group having 1 or more and 4 or less carbon atoms selected from a methyl group, an ethyl group, an n-propyl group, an isopropyl group, an n-butyl group, a 1-methylpropyl group, a 2-methylpropyl group, and a tert-butyl group; an aralkyl group such as a benzyl group or a phenethyl group; an aryl group such as a phenyl group, a biphenyl group, a terphenyl group, a naphthyl group, a fluorenyl group, a phenanthrenyl group, an anthracenyl group, a chrysenyl group, a triphenylenyl group, or a pyrenyl group; a heterocyclic group such as a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, or a dibenzothienyl group; a substituted amino group such as a dimethylamino group, a diethylamino group, a dibenzylamino group, a diphenylamino group, or a ditolylamino group; an alkoxy group such as a methoxy group, an ethoxy group, an isopropoxy group, or a tert-butoxy group; an aryloxy group such as a phenoxy group; a halogen atom such as a fluorine, chlorine, bromine, or iodine atom; and a cyano group.

The partial structure represented by the general formula [2] is more preferably a partial structure represented by the following general formula [22]. This is because an organic light-emitting element including, as a guest, an iridium complex having the partial structure represented by the following general formula [22] provides high light-emitting efficiency and a long element lifetime.

[22]

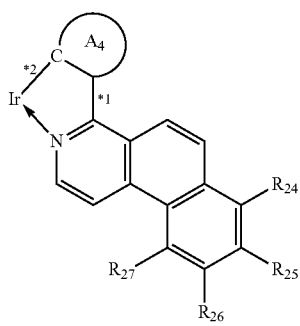

In the general formula [22], a ring $A_4$ represents any one of partial structures represented by the following general formulae [23] to [27]. It is to be noted that details about the partial structures represented by the following general formulae [23] to [27] are described later.

[23]

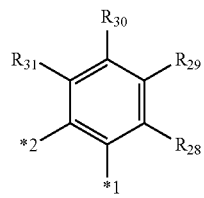

[24]

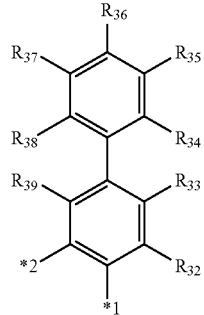

[25]

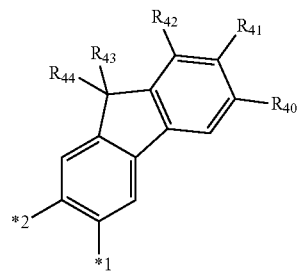

[26]

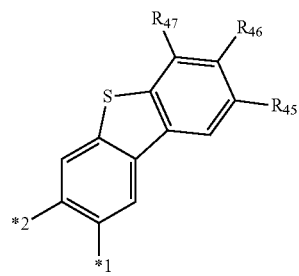

[27]

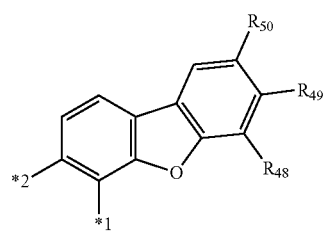

In the general formula [22], *1 represents a bond between the ring $A_4$ and a benzo[f]isoquinoline skeleton and *2 represents a bond between the ring $A_4$ and an Ir metal.

In the general formula [22], $R_{24}$ to $R_{27}$ each represent a hydrogen atom, an alkyl group having 1 or more and 4 or less carbon atoms, or a phenyl group.

Specific examples of the alkyl group having 1 or more and 4 or less carbon atoms and phenyl group represented by any one of $R_{24}$ to $R_{27}$ are same as the specific examples of $R_1$ to $R_8$ in the general formula [2]. In addition, substituents represented by $R_{24}$ to $R_{27}$ may be identical to or different from one another.

It is to be noted that when any one of the substituents represented by $R_{24}$ to $R_{27}$ is an alkyl group having 1 or more and 4 or less carbon atoms or a phenyl group, the corresponding substituent may further have a substituent selected from: an alkyl group having 1 or more and 4 or less carbon atoms selected from a methyl group, an ethyl group, an n-propyl group, an isopropyl group, an n-butyl group, a 1-methylpropyl group, a 2-methylpropyl group, and a tert-butyl group; an aralkyl group such as a benzyl group or a phenethyl group; an aryl group such as a phenyl group, a biphenyl group, a terphenyl group, a naphthyl group, a fluorenyl group, a phenanthrenyl group, an anthracenyl group, a chrysenyl group, a triphenylenyl group, or a pyrenyl group; a heterocyclic group such as a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, or a dibenzothienyl group; a substituted amino group such as a dimethylamino group, a diethylamino group, a dibenzylamino group, a diphenylamino group, or a ditolylamino group; an alkoxy group such as a methoxy group, an ethoxy group, an isopropoxy group, or a tert-butoxy group; an aryloxy group such as a phenoxy group; a halogen atom such as a fluorine, chlorine, bromine, or iodine atom; and a cyano group.

Next, the partial structures represented by the general formulae [23] to [27] are described.

In the general formulae [23] to [27], $R_{28}$ to $R_{50}$ each represent an alkyl group having 1 or more and 4 or less carbon atoms, an aralkyl group, an aryl group, a heterocyclic group, a substituted amino group, an alkoxy group, an aryloxy group, a halogen atom, or a cyano group.

Specific examples of the alkyl group having 1 or more and 4 or less carbon atoms, aralkyl group, aryl group, heterocyclic group, substituted amino group, alkoxy group, aryloxy group, and halogen atom each represented by any one of $R_{28}$ to $R_{50}$ are same as the specific examples of $R_1$ to $R_8$ in the general formula [2]. In addition, substituents represented by $R_{28}$ to $R_{50}$ may be identical to or different from one another.

It is to be noted that when any one of the substituents represented by $R_{28}$ to $R_{50}$ is an alkyl group having 1 or more and 4 or less carbon atoms, an aralkyl group, an aryl group, a heterocyclic group, a substituted amino group, an alkoxy group, or an aryloxy group, the corresponding substituent may further have a substituent selected from: an alkyl group having 1 or more and 4 or less carbon atoms selected from a methyl group, an ethyl group, an n-propyl group, an isopropyl group, an n-butyl group, a 1-methylpropyl group, a 2-methylpropyl group, and a tert-butyl group; an aralkyl group such as a benzyl group or a phenethyl group; an aryl group such as a phenyl group, a biphenyl group, a terphenyl group, a naphthyl group, a fluorenyl group, a phenanthrenyl group, an anthracenyl group, a chrysenyl group, a triphenylenyl group, or a pyrenyl group; a heterocyclic group such as a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, or a dibenzothienyl group; a substituted amino group such as a dimethylamino group, a diethylamino group, a dibenzylamino group, a diphenylamino group, or a ditolylamino group; an alkoxy group such as a methoxy group, an ethoxy group, an isopropoxy group, or a tert-butoxy group; an aryloxy group such as a phenoxy group; a halogen atom such as a fluorine, chlorine, bromine, or iodine atom; and a cyano group.

In the general formula [1], a partial structure $IrL_2$ is a partial structure represented by the following general formula [3].

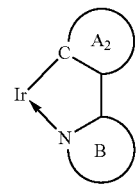

[3]

In the general formula [3], a ring $A_2$ represents an aromatic ring or an aromatic heterocycle. Specific examples of the aromatic ring represented by the ring $A_2$ are the same as the specific examples of the ring $A_1$ in the formula [2]. The aromatic ring is preferably a benzene ring, a naphthalene ring, a fluorene ring, or a phenanthrene ring because any such ring can form a stable complex with trivalent iridium.

In addition, specific examples of the aromatic heterocycle represented by the ring $A_2$ are the same as the specific examples of the ring $A_1$ in the formula [2]. The aromatic heterocycle is preferably a carbazole ring, a dibenzofuran ring, or a dibenzothiophene ring because any such heterocycle can form a stable complex with trivalent iridium.

It is to be noted that the ring $A_2$ may further have a substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group. Here, specific examples of the alkyl group having 1 or more and 4 or less carbon atoms, the aralkyl group, the aryl group, the heterocyclic group, the substituted amino group, the alkoxy group, the aryloxy group, and the halogen atom each serving as a substituent that the ring $A_2$ may further have are the same as the specific examples in the ring $A_1$ in the formula [2].

In the general formula [3], a ring B represents a nitrogen-containing aromatic heterocycle.

Examples of the nitrogen-containing aromatic heterocycle represented by the ring B include, but, of course, not limited to, a pyridine ring, a pyrimidine ring, a pyrazine ring, a triazine ring, a quinoline ring, an isoquinoline ring, a benzo[f]quinoline ring, a benzo[h]quinoline ring, a benzo[f]isoquinoline ring, a benzo[h]isoquinoline ring, an oxazole ring, a benzo[d]oxazole ring, a benzo[d]thiazole ring, an imidazole ring, and a pyrazole ring. Of those, a pyridine ring, a quinoline ring, a benzo[f]quinoline ring, a benzo[h]quinoline ring, a benzo[f]isoquinoline ring, a benzo[h]isoquinoline ring, an oxazole ring, a benzo[d]oxazole ring, a benzo[d]thiazole ring, or an imidazole ring because any such heterocycle can form a stable complex with trivalent iridium.

It is to be noted that in the general formula [3], the ring B may further have a substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group. Here, specific examples of the alkyl group having 1 or more and 4 or less carbon atoms, the aralkyl group, the aryl group, the heterocyclic group, the substituted amino group, the alkoxy group, the aryloxy group, and the halogen atom each serving as a substituent that the ring B may further have are same as the specific examples in the ring $A_1$ in the formula [2]. It is to be noted that upon introduction of the alkyl group as the substituent that the ring B may have, the alkyl group to be introduced is preferably an alkyl group having 1 or more and 4 or less carbon atoms because the sublimability of the complex itself reduces when the number of carbon atoms is excessively large.

The partial structure represented by the general formula [3] is preferably a partial structure represented by the following general formula [5].

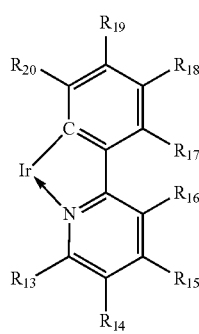

[5]

In the general formula [5], $R_{13}$ to $R_{20}$ each represent a hydrogen atom, an alkyl group having 1 or more and 4 or less carbon atoms, an aralkyl group, an aryl group, a heterocyclic group, a substituted amino group, an alkoxy group, an aryloxy group, a halogen atom, or a cyano group. The substituents represented by $R_{13}$ to $R_{20}$ may be identical to or different from one another.

It is to be noted that specific examples of the alkyl group having 1 or more and 4 or less carbon atoms, aralkyl group, aryl group, heterocyclic group, substituted amino group, alkoxy group, aryloxy group, and halogen atom represented by $R_{13}$ to $R_{20}$ are same as the specific examples of $R_1$ to $R_8$ in the general formula [2]. In addition, when any one of the substituents represented by $R_{13}$ to $R_{20}$ is an alkyl group having 1 or more and 4 or less carbon atoms, an aralkyl group, an aryl group, a heterocyclic group, a substituted amino group, an alkoxy group, or an aryloxy group, the corresponding substituent may further have a substituent selected from: an alkyl group having 1 or more and 4 or less carbon atoms selected from a methyl group, an ethyl group, an n-propyl group, an isopropyl group, an n-butyl group, a 1-methylpropyl group, a 2-methylpropyl group, and a tert-butyl group; an aralkyl group such as a benzyl group or a phenethyl group; an aryl group such as a phenyl group, a biphenyl group, a terphenyl group, a naphthyl group, a fluorenyl group, a phenanthrenyl group, an anthracenyl group, a chrysenyl group, a triphenylenyl group, or a pyrenyl group; a heterocyclic group such as a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, or a dibenzothienyl group; a substituted amino group such as a dimethylamino group, a diethylamino group, a dibenzylamino group, a diphenylamino group, or a ditolylamino group; an alkoxy group such as a methoxy group, an ethoxy group, an isopropoxy group, or a tert-butoxy group; an aryloxy group such as a phenoxy group; a halogen atom such as a fluorine, chlorine, bromine, or iodine atom; and a cyano group.

In the general formula [5], $R_{13}$ to $R_{20}$ each preferably represent a hydrogen atom, an alkyl group having 1 or more and 4 or less carbon atoms, or a phenyl group. This is because an alkyl group having 1 or more and 4 or less carbon atoms, and a phenyl group are each a substituent that reduces an intermolecular interaction between molecules of the complex. It is to be noted that when any one of $R_{13}$ to $R_{20}$ represents an alkyl group having 1 or more and 4 or less carbon atoms or a phenyl group, the corresponding substituent may further have an alkyl group having 1 or more and 4 or less carbon atoms, an aralkyl group, an aryl group, a heterocyclic group, a substituted amino group, an alkoxy group, an aryloxy group, a halogen atom, or a cyano group.

In the present invention, the ligand $L_1$ and the ligand $L_2$ are different from each other and are not identical to each other.

In the general formula [1], $L_3$ represents a monovalent bidentate ligand having a first atom that forms a coordinate bond with iridium and is selected from N, O, S, and P, and a second atom that forms a coordinate bond with iridium and is selected from N, O, S, and P. In the present invention, the first atom and the second atom may be identical to or different from each other.

Examples of the ligand represented by $L_3$ include β-diketonate, picolinate, 2-aminoethanethiolate, 2-aminobenzenethiolate, and 2-(diphenylphosphino)phenolate.

In the present invention, a partial structure $IrL_3$ is preferably a structure represented by the following general formula [6].

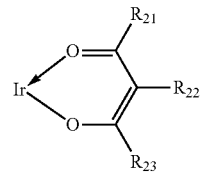

[6]

In the general formula [6], $R_{21}$ to $R_{23}$ each represent a hydrogen atom, an alkyl group having 1 or more and 4 or less carbon atoms, an aralkyl group, an aryl group, a heterocyclic group, a substituted amino group, an alkoxy group, an aryloxy group, a halogen atom, or a cyano group, and may be identical to or different from one another.

It is to be noted that specific examples of the alkyl group having 1 or more and 4 or less carbon atoms, aralkyl group, aryl group, heterocyclic group, substituted amino group, alkoxy group, and aryloxy group represented by $R_{21}$ or $R_{23}$ are same as the specific examples of $R_1$ to $R_8$ in the general formula [2]. In addition, when any one of the substituents represented by $R_{21}$ to $R_{23}$ is an alkyl group having 1 or more and 4 or less carbon atoms, an aralkyl group, an aryl group, a heterocyclic group, a substituted amino group, an alkoxy group, or an aryloxy group, the corresponding substituent may further have a substituent selected from: an alkyl group having 1 or more and 4 or less carbon atoms selected from a methyl group, an ethyl group, an n-propyl group, an isopropyl group, an n-butyl group, a 1-methylpropyl group, a 2-methylpropyl group, and a tert-butyl group; an aralkyl group such as a benzyl group or a phenethyl group; an aryl group such as a phenyl group, a biphenyl group, a terphenyl group, a naphthyl group, a fluorenyl group, a phenanthrenyl group, an anthracenyl group, a chrysenyl group, a triphenylenyl group, or a pyrenyl group; a heterocyclic group such as a thienyl group, a furanyl group, an imidazolyl group, a 1-pyrrolidinyl group, a pyridyl group, a benzothienyl group, a benzofuranyl group, a quinolyl group, a carbazolyl group, a dibenzofuranyl group, or a dibenzothienyl group; a substituted amino group such as a dimethylamino group, a diethylamino group, a dibenzylamino group, a diphenylamino group, or a ditolylamino group; an alkoxy group such as a methoxy group, an ethoxy group, an isopropoxy group, or a tert-butoxy group; an aryloxy group such as a phenoxy group; a halogen atom such as a fluorine, chlorine, bromine, or iodine atom; and a cyano group.

In the general formula [6], $R_{21}$ to $R_{23}$ each preferably represent a hydrogen atom or an alkyl group having 1 or more and 4 or less carbon atoms. It is to be noted that when any one of the substituents represented by $R_{21}$ to $R_{23}$ is an alkyl group having 1 or more and 4 or less carbon atoms, the corresponding substituent may further have an alkyl group having 1 or more and 4 or less carbon atoms, an aralkyl group, an aryl group, a heterocyclic group, a substituted amino group, an alkoxy group, an aryloxy group, a halogen atom, or a cyano group. $R_{21}$ to $R_{23}$ each more preferably represent a hydrogen atom or an alkyl group having 1 or more and 4 or less carbon atoms. When $R_{21}$ to $R_{23}$ each represent a hydrogen atom, its molecular weight reduces and hence the sublimability of the complex itself can be improved. In addition, when $R_{21}$ to $R_{23}$ each represent an alkyl group having 1 or more and 4 or less carbon atoms, an interaction between molecules of the complex reduces and hence the sublimability of the complex itself can be improved.

Method of Synthesizing Iridium Complex)

Next, a method of synthesizing the iridium complex of the present invention is described. The iridium complex of the present invention is synthesized by, for example, a synthesis scheme 1 shown below.

Synthesis scheme 1

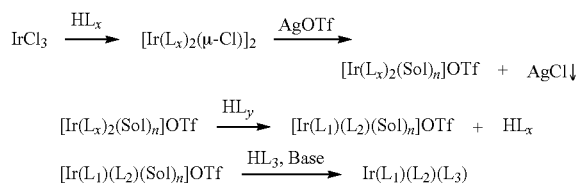

($L_x$ represents $L_1$ or $L_2$, Sol represents a solvent molecule, n represents an integer, when the solvent molecule is a monodentate ligand, n represents 2, when the solvent molecule is a ligand that is bidentate or more, n represents 1, when $L_x$ represents $L_1$, $L_y$ represents $L_2$, and when $L_x$ represents $L_2$, $L_y$ represents $L_1$.)

A synthesis process in the synthesis scheme 1 is described below.

First, a triflate form of an iridium complex having two $L_1$'s or $L_2$'s is synthesized according to a method described in PTL 2.

Next, the triflate form of the iridium complex and a compound $HL_2$ or $HL_1$ including a ligand are heated in a solution. Thus, ligand exchange is performed. It is to be noted that upon performance of a ligand exchange reaction, the concentration of the solution is properly adjusted before the reaction is performed because a form to which three luminous ligands coordinate is produced when the concentration is high. It is to be noted that upon performance of the ligand exchange reaction, a reaction check is desirably performed as appropriate by taking out part of the solution and causing the solution to react with $HL_3$. In addition, while the reaction check is performed as appropriate, the heating is continued until the concentration of a product shows no change.

Next, the iridium complex of the present invention can be synthesized by adding $HL_3$ and a base to the reaction solution. It is to be noted that the resultant may contain $Ir(L_1)_2(L_3)$ or $Ir(L_2)_2(L_3)$ as a by-product and hence the by-product needs to be appropriately removed by column purification.

Meanwhile, the iridium complex of the present invention can be synthesized according to a method described in NPL 1. The method is specifically a method of synthesizing the complex by a synthesis scheme 2 shown below.

Synthesis scheme 2

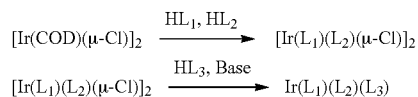

A synthesis process in the synthesis scheme 2 is described below.

First, [Ir(COD) (μ-Cl)]$_2$ (COD: 1,5-cyclooctadiene), which is an iridium complex, is used as a starting raw material, and $HL_1$ and $HL_2$ are caused to react with the iridium complex simultaneously. Thus, the reaction product is obtained in the form of a mixture containing a chlorocrosslinked dimer ([Ir($L_1$)($L_2$)(μ-Cl)]$_2$) having the ligands $L_1$ and $L_2$.

Next, the mixture and $HL_3$ are caused to react with each other under a basic condition. A crude product produced by the reaction is subjected to column purification to provide the iridium complex of the present invention.

Here, the employment of the method according to the synthesis schemes 1 and 2 typically provides, as a main component, a complex in which nitrogen atoms in $L_1$ and $L_2$, and iridium are coaxially placed like N—Ir—N. At this time, a structural isomer is sometimes produced as a by-product but even a mixture containing the isomer as a by-product is used in some cases in terms of cost.

In addition, when the complex is obtained as a mixture of enantiomers, the mixture may be used without being treated or may be subjected to optical resolution depending on intended purposes.

(3) Heterocycle-Containing Compound

Next, the heterocycle-containing compound to be used as the host for the emission layer in the organic light-emitting element of the present invention is described. The heterocycle-containing compound to be incorporated into the organic light-emitting element of the present invention is a heterocyclic aromatic compound containing a heteroatom such as nitrogen, oxygen, or sulfur. The heterocycle-containing compound is preferably a compound represented by the following general formula [7] or [8].

[7]

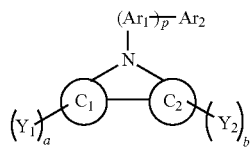

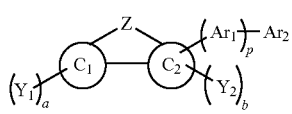

[8]

In the general formula [8], Z represents an oxygen atom or a sulfur atom.

In the general formulae [7] and [8], a ring $C_1$ and a ring $C_2$ each represent a cyclic structure selected from a benzene ring, a naphthalene ring, a phenanthrene ring, a triphenylene ring, and a chrysene ring. In other words, the compound represented by the general formula [7] has formed therein a heterocycle formed of an N atom, the ring $C_1$, and the ring $C_2$. In addition, the compound represented by the general formula [8] has formed therein a heterocycle formed of Z (an oxygen atom or a sulfur atom), the ring $C_1$, and the ring $C_2$. Here, in the general formulae [7] and [8], the ring $C_1$ and the ring $C_2$ may be identical to or different from each other.

It is to be noted that the ring $C_1$ and ring $C_2$ may each further have a group of substituents to be described later, i.e., substituents except $Y_1$, $Y_2$, and —$(Ar_1)_p$—$Ar_2$. Specific examples thereof include: an alkyl group having 1 to 4 carbon atoms selected from a methyl group, an ethyl group, an n-propyl group, an i-propyl group, an n-butyl group, an i-butyl group, a sec-butyl group, and a tert-butyl group; a halogen atom selected from fluorine, chlorine, bromine, and iodine atoms; an alkoxy group such as a methoxy group, an ethoxy group, an i-propoxy group, an n-butoxy group, or a tert-butoxy group; a substituted amino group such as an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisoylamino group, an N-mesityl-N-phenylamino group, an N,N-dimesitylamino group, an N-phenyl-N-(4-tert-butylphenyl)amino group, or an N-phenyl-N-(4-trifluoromethylphenyl)amino group; an aromatic hydrocarbon group such as a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, or a terphenyl group; a heteroaromatic group such as a thienyl group, a pyrrolyl group, a pyrazinyl group, a pyridyl group, an indolyl group, a quinolyl group, an isoquinolyl group, a naphthyridinyl group, an acridinyl group, a phenanthrolinyl group, a carbazolyl group, a benzo[a]carbazolyl group, a benzo[b]carbazolyl group, a benzo[c]carbazolyl group, a phenazinyl group, a phenoxazinyl group, a phenothiazinyl group, a benzothiophenyl group, a dibenzothiophenyl group, a benzofuranyl group, a dibenzofuranyl group, an oxazolyl group, or an oxadiazolyl group; a cyano group; and a trifluoromethyl group. In this case, the alkyl group that the substituent represented by the ring $C_1$ or the ring $C_2$ may further have also includes an alkyl group in which a hydrogen atom in the substituent is substituted with a fluorine atom.

Of those substituents listed above, a methyl group, a tert-butyl group, a methoxy group, an ethoxy group, a carbazolyl group, a dibenzothienyl group, a dibenzofuranyl group, a phenyl group, a naphthyl group, a fluorenyl group, or a biphenyl group is preferred. When the substituent that the substituent represented by the ring $C_1$ or the ring $C_2$ may each further have is an aromatic hydrocarbon group, a phenyl group is particularly preferred.

In the general formulae [7] and [8], $Y_1$ and $Y_2$ each represent an alkyl group having 1 to 4 carbon atoms or an aromatic hydrocarbon group.

Specific examples of the alkyl group having 1 to 4 carbon atoms represented by $Y_1$ or $Y_2$ include a methyl group, an ethyl group, an n-propyl group, an i-propyl group, an n-butyl group, an i-butyl group, a sec-butyl group, and a tert-butyl group. Of those alkyl groups, a methyl group or a tert-butyl group is preferred.

Specific examples of the aromatic hydrocarbon group represented by $Y_1$ or $Y_2$ include, but, of course, not limited to, a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, and a terphenyl group. Of those aromatic hydrocarbon groups, a phenyl group, a naphthyl group, a fluorenyl group, or a biphenyl group is preferred, and a phenyl group is more preferred.

When any one of the substituents represented by $Y_1$ and $Y_2$ is an alkyl group having 1 to 4 carbon atoms or an aromatic hydrocarbon group, the corresponding substituent may further have any other substituent. Specific examples of the substituent that the substituent represented by $Y_1$ or $Y_2$ may further have include: an alkyl group having 1 to 4 carbon atoms selected from a methyl group, an ethyl group, an n-propyl group, an i-propyl group, an n-butyl group, an i-butyl group, a sec-butyl group, and a tert-butyl group; a halogen atom selected from fluorine, chlorine, bromine, and iodine atoms; an alkoxy group such as a methoxy group, an ethoxy group, an i-propoxy group, an n-butoxy group, or a tert-butoxy group; a substituted amino group such as an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisoylamino group, an N-mesityl-N-phenylamino group, an N,N-dimesitylamino group, an N-phenyl-N-(4-tert-butylphenyl)amino group, or an N-phenyl-N-(4-trifluoromethylphenyl)amino group; an aromatic hydrocarbon group such as a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, or a terphenyl group; a heteroaromatic group such as a thienyl group, a pyrrolyl group, a pyrazinyl group, a pyridyl group, an indolyl group, a quinolyl group, an isoquinolyl group, a naphthyridinyl group, an acridinyl group, a phenanthrolinyl group, a carbazolyl group, a benzo[a]carbazolyl group, a benzo[b]carbazolyl group, a benzo[c]carbazolyl group, a phenazinyl group, a phenoxazinyl group, a phenothiazinyl group, a benzothiophenyl group, a dibenzothiophenyl group, a benzofuranyl group, a dibenzofuranyl group, an oxazolyl group, or an oxadiazolyl group; a cyano group; and a trifluoromethyl group. Of those substituents, a methyl group, a tert-butyl group, a phenyl group, a naphthyl group, a fluorenyl group, or a biphenyl group is preferred, and a phenyl group is more preferred.

In the general formulae [7] and [8], a represents an integer of 0 to 4. When a represents 2 or more, multiple $Y_1$'s may be identical to or different from each other.

In the general formulae [7] and [8], b represents an integer of 0 to 4. When the ring $C_2$ is a benzene ring, b represents an integer of 0 to 3. When b represents 2 or more, multiple $Y_2$'s may be identical to or different from each other.

In the general formulae [7] and [8], $Ar_1$ represents a divalent aromatic hydrocarbon group. Specific examples of the divalent aromatic hydrocarbon group represented by $Ar_1$ include a phenylene group, a biphenylene group, a terphenylene group, a naphthalenediyl group, a phenanthrenediyl group, an anthracenediyl group, a benzo[a]anthracenediyl group, a fluorenediyl group, a benzo[a]fluorenediyl group, a benzo[b]fluorenediyl group, a benzo[c]fluorenediyl group, a dibenzo[a,c]fluorenediyl group, a dibenzo[b,h]fluorenediyl group, a dibenzo[c,g]fluorenediyl group, a biphenylenediyl group, an acenaphthylenediyl group, a chrysenediyl group, a benzo[b]chrysenediyl group, a pyrenediyl group, a benzo[e]pyrenediyl group, a triphenylenediyl group, a benzo[a]triphenylenediyl group, a benzo[b]triphenylenediyl group, a picenediyl group, a fluoranthenediyl group, a benzo[a]fluoranthenediyl group, a benzo[b]fluoranthenediyl group, a benzo[j]fluoranthenediyl group, a benzo[k]fluoranthenediyl group, a perylenediyl group, and a naphthacenediyl group. Of those, a substituent selected from a phenylene group, a biphenylene group, a terphenylene group, a naphthalenediyl group, a fluorenediyl group, a phenanthrenediyl group, a chrysenediyl group, and a triphenylenediyl group is preferred from the viewpoint of ease of sublimation purification.

It is to be noted that $Ar_1$ may further have a substituent. Specific example thereof include: an alkyl group having 1 to 4 carbon atoms selected from a methyl group, an ethyl group, an n-propyl group, an i-propyl group, an n-butyl group, an i-butyl group, a sec-butyl group, and a tert-butyl group; a halogen atom selected from fluorine, chlorine, bromine, and iodine atoms; an alkoxy group such as a methoxy group, an ethoxy group, an i-propoxy group, an n-butoxy group, or a tert-butoxy group; a substituted amino group such as an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisoylamino group, an N-mesityl-N-phenylamino group, an N,N-dimesitylamino group, an N-phenyl-N-(4-tert-butylphenyl)amino group, or an N-phenyl-N-(4-trifluoromethylphenyl)amino group; an aromatic hydrocarbon group such as a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, or a terphenyl group; a heteroaromatic group such as a thienyl group, a pyrrolyl group, a pyrazinyl group, a pyridyl group, an indolyl group, a quinolyl group, an isoquinolyl group, a naphthyridinyl group, an acridinyl group, a phenanthrolinyl group, a carbazolyl group, a benzo[a]carbazolyl group, a benzo[b]carbazolyl group, a benzo[c]carbazolyl group, a phenazinyl group, a phenoxazinyl group, a phenothiazinyl group, a benzothiophenyl group, a dibenzothiophenyl group, a benzofuranyl group, a dibenzofuranyl group, an oxazolyl group, or an oxadiazolyl group; a cyano group; and a trifluoromethyl group. In this case, the alkyl group that $Ar_1$ may further have also includes an alkyl group in which a hydrogen atom in the substituent is substituted with a fluorine atom.

Of those substituents listed above, a methyl group, a tert-butyl group, a methoxy group, an ethoxy, a carbazolyl group, a dibenzothienyl group, a dibenzofuranyl group, a phenyl group, a naphthyl group, a fluorenyl group, or a biphenyl group is preferred. When the substituent that the substituent represented by $Ar_1$ may further have is an aromatic hydrocarbon group, a phenyl group is particularly preferred.

In the formulae [7] and [8], p represents an integer of 0 to 4. When p represents 2 or more, multiple $Ar_1$'s may be identical to or different from each other.

In the formulae [7] and [8], $Ar_2$ represents a substituted or unsubstituted monovalent aromatic hydrocarbon group. Specific examples thereof include a phenyl group, a naphthyl group, a phenanthryl group, an anthryl group, a benzo[a]anthryl group, a fluorenyl group, a benzo[a]fluorenyl group, a benzo[b]fluorenyl group, a benzo[c]fluorenyl group, a dibenzo[a,c]fluorenyl group, a dibenzo[b,h]fluorenyl group, a dibenzo[c,g]fluorenyl group, a biphenylenyl group, an acenaphthylenyl group, a chrysenyl group, a benzo[b]chrysenyl group, a pyrenyl group, a benzo[e]pyrenyl group, a triphenylenyl group, a benzo[a]triphenylenyl group, a benzo[b]triphenylenyl group, a picenyl group, a fluoranthenyl group, a benzo[a]fluoranthenyl group, a benzo[b]fluoranthenyl group, a benzo[j]fluoranthenyl group, a benzo[k]fluoranthenyl group, a perylenyl group, and a naphthacenyl group. Of those, a phenyl group, a biphenyl group, a terphenyl group, a naphthyl group, a fluorenyl group, a phenanthryl group, a chrysenyl group, or a triphenylenyl group is preferred from the viewpoint of ease of sublimation purification.

Specific examples of the substituent that the monovalent aromatic hydrocarbon group represented by $Ar_2$ may further have include: an alkyl group such as a methyl group, an ethyl group, an n-propyl group, an i-propyl group, an n-butyl group, an i-butyl group, a sec-butyl group, a tert-butyl group, an n-pentyl group, an i-pentyl group, a tert-pentyl group, a neopentyl group, an n-hexyl group, or a cyclohexyl group; a halogen atom selected from fluorine, chlorine, bromine, and iodine atoms; an alkoxy group such as a methoxy group, an ethoxy group, an i-propoxy group, an n-butoxy group, or a tert-butoxy group; a substituted amino group such as an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisoylamino group, an N-mesityl-N-phenylamino group, an N,N-dimesitylamino group, an N-phenyl-N-(4-tert-butylphenyl)amino group, or an N-phenyl-N-(4-trifluoromethylphenyl)amino group; an aromatic hydrocarbon group such as a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, or a terphenyl group; a heteroaromatic group such as a thienyl group, a pyrrolyl group, a pyrazinyl group, a pyridyl group, an indolyl group, a quinolyl group, an isoquinolyl group, a naphthyridinyl group, an acridinyl group, a phenanthrolinyl group, a carbazolyl group, a benzo[a]carbazolyl group, a benzo[b]carbazolyl group, a benzo[c]carbazolyl group, a phenazinyl group, a phenoxazinyl group, a phenothiazinyl group, a benzothiophenyl group, a dibenzothiophenyl group, a benzofuranyl group, a dibenzofuranyl group, an oxazolyl group, or an oxadiazolyl group; a cyano group; and a trifluoromethyl group.

Next, an additionally preferred aspect of the host in the present invention is described.

The carbazole-based compound represented by the general formula [7] has been frequently used as a host to be incorporated into an organic light-emitting element using a guest that emits phosphorescence. However, each of its HOMO level and LUMO level tends to be higher than that of the compound represented by the general formula [8] owing to the electron-donating property of a nitrogen atom. Therefore, the use of the compound represented by the general formula [7] as the host makes it difficult to inject an electron into the emission layer while the use facilitates the injection of a hole into the layer. Accordingly, the kinds of applicable charge transport layers and guests are limited. In view of the foregoing, the compound represented by the general formula [8] is preferred as the host as compared to the compound represented by the general formula [7].

Further, out of the compounds each represented by the general formula [8], a compound having preferred physical properties as a host for the iridium complex represented by the general formula [1] is preferably used. The emission peak wavelength of the iridium complex represented by the general formula [1] is 580 nm or more (2.14 eV or less), and hence a compound having a $T_1$ energy at least equal to or higher than the value (2.14 eV) is desirable. In addition, the $S_1$ energy of the host is desirably as low as possible in order that the driving voltage of the element may be reduced by good carrier injection, and the $S_1$ energy is preferably 3.0 eV or less. In other words, a compound having as small a ΔS–T value as possible is preferred.

In consideration of the energy characteristics described above, in the heterocycle-containing compound represented by the general formula [8], a heterocycle formed of the ring $C_1$ and the ring $C_2$ is preferably selected from heterocycles represented by the following general formulae [9] to [16].

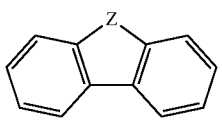

[9]

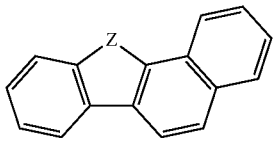

[10]

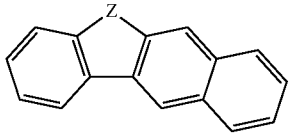

[11]

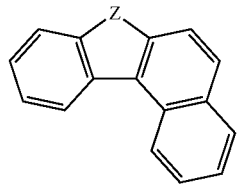

[12]

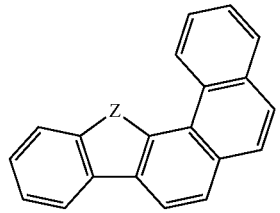

[13]

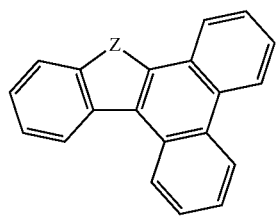

[14]

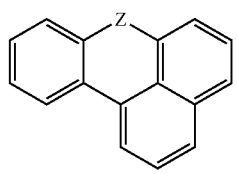

[15]

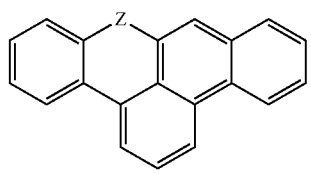

[16]

In the general formulae [9] to [16], Z represents an oxygen atom or a sulfur atom.

Further, as a result of their extensive studies, the inventors of the present invention have found that any one of the compounds represented by the following general formulae [17] to [21] is particularly preferred as the host for the iridium complex represented by the general formula [1]. The selection of a heterocyclic compound represented by any one of the following general formulae [17] to [21] provides an organic light-emitting element having high light-emitting efficiency and a long lifetime.

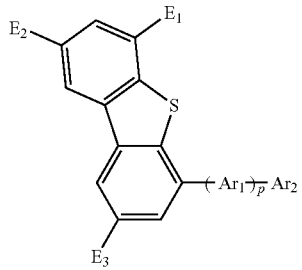

[17]

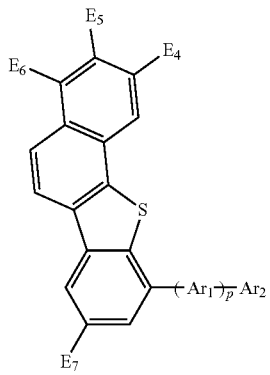

[18]

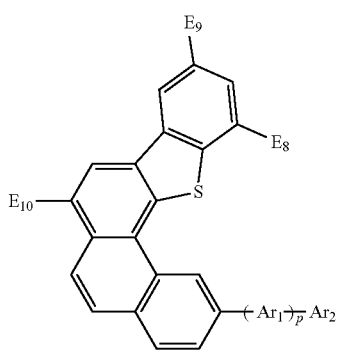

[19]

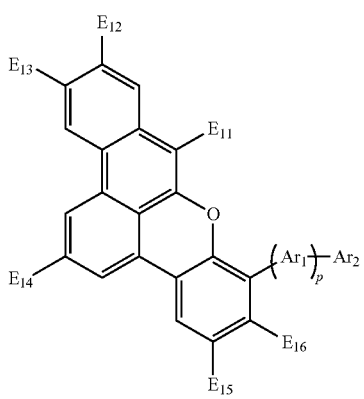

[20]

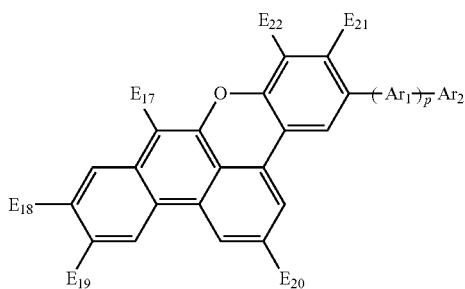

[21]

In the formula [17], $E_1$ to $E_3$ each represent a hydrogen atom, an alkyl group, or a substituted or unsubstituted aromatic hydrocarbon group. Specific examples of the alkyl group and aromatic hydrocarbon group represented by $E_1$ and $E_2$, and the substituent that the aromatic hydrocarbon group may further have are the same as the specific examples of $Y_1$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred. In addition, specific examples of the alkyl group and aromatic hydrocarbon group each represented by $E_3$, and the substituent that the aromatic hydrocarbon group may further have are the same as the specific examples of $Y_2$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred.

In the formula [18], $E_4$ to $E_7$ each represent a hydrogen atom, an alkyl group, or a substituted or unsubstituted aromatic hydrocarbon group. Specific examples of the alkyl group and aromatic hydrocarbon group represented by $E_4$ to $E_6$, and the substituent that the aromatic hydrocarbon group may further have are the same as the specific examples of $Y_1$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred. In addition, specific examples of the alkyl group and aromatic hydrocarbon group each represented by $E_7$, and the substituent that the aromatic hydrocarbon group may further have are the same as the specific examples of $Y_2$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred.

In the formula [19], $E_8$ to $E_{10}$ each represent a hydrogen atom, an alkyl group, or a substituted or unsubstituted aromatic hydrocarbon group. Specific examples of the alkyl group and aromatic hydrocarbon group represented by $E_8$ and $E_9$, and the substituent that the aromatic hydrocarbon group may further have are the same as the specific examples of $Y_1$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred. In addition, specific examples of the alkyl group and aromatic hydrocarbon group each represented by $E_{10}$, and the substituent that the aromatic hydrocarbon group may further have are the same as the specific examples of $Y_2$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred.

In the formula [20], $E_{11}$ to $E_{16}$ each represent a hydrogen atom, an alkyl group, or a substituted or unsubstituted aromatic hydrocarbon group. Specific examples of the alkyl group and aromatic hydrocarbon group represented by $E_{11}$ to $E_{14}$, and the substituent that the aromatic hydrocarbon group may further have are the same as the specific examples of $Y_1$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred. In addition, specific examples of the alkyl group and aromatic hydrocarbon group represented by $E_{15}$ and $E_{16}$, and the substituent that the aromatic hydrocarbon group may further have are the same as the specific examples of $Y_2$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred.

In the formula [21], $E_{17}$ to $E_{22}$ each represent a hydrogen atom, an alkyl group, or a substituted or unsubstituted aromatic hydrocarbon group. Specific examples of the alkyl group and aromatic hydrocarbon group represented by $E_{17}$ to $E_{20}$, and the substituent that the aromatic hydrocarbon group may further have are the same as the specific examples of $Y_1$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred. In addition, specific examples of the alkyl group and aromatic hydrocarbon group represented by $E_{21}$ and $E_{22}$, and the substituent that the aromatic hydrocarbon group may further have are the same as the specific examples of $Y_2$ in the general formula [8]. Of those, an alkyl group having 1 or more and 6 or less carbon atoms, a phenyl group, a naphthyl group, a fluorenyl group, a biphenyl group, or a terphenyl group is preferred, and a methyl group, a tert-butyl group, or a phenyl group is more preferred.

In the formulae [17] to [21], $E_1$ to $E_{22}$ each preferably represent a hydrogen atom. When all of $E_1$ to $E_{22}$ each represent a hydrogen atom, a molecular weight reduction is achieved, though the reduction is in a trade-off relationship with chemical stability.

In the formulae [17] to [21], $Ar_1$ represents a substituted or unsubstituted divalent aromatic hydrocarbon group. It is to be noted that specific examples of $Ar_1$ are the same as the specific examples of $Ar_1$ in the formula [8].

In the formulae [17] to [21], $Ar_2$ represents a substituted or unsubstituted monovalent aromatic hydrocarbon group. It is to be noted that specific examples of $Ar_2$ are the same as the specific examples of $Ar_2$ in the formula [8].

In the formulae [17] to [21], p represents an integer of 0 to 4. p preferably represents 1. When p represents 2 or more, multiple $Ar_1$'s may be identical to or different from each other.

A first possible reason why the compounds represented by the formulae [17] to [21] are preferred as described above is as follows: in the case of a five-membered ring compound, a thiophene derivative is more stable than a furan derivative is, and in the case of a six-membered ring compound, a xanthene derivative is more stable than a thioxanthene derivative is. A second possible reason is that the presence of a substituent at a site having high chemical reactivity in an (aromatic) heterocyclic skeleton (each of ortho and para positions with respect to an oxygen atom or a sulfur atom) improves the chemical stability.

In addition, a compound to be used as a constituent material for the organic light-emitting element of the present invention is desirably purified in advance. Sublimation purification is preferred as a method of purifying the compound. This is because the sublimation purification exhibits a large purifying effect in an increase in purity of an organic compound. In general, the sublimation purification requires heating at higher temperature as the molecular weight of an organic compound to be purified increases. At this time, for example, the thermal decomposition of the compound is liable to occur owing to the high temperature. Therefore, an organic compound to be used as a constituent material for the organic light-emitting element preferably has a molecular weight of 1,500 or less so that the compound can be subjected to the sublimation purification without any excessive heating. Meanwhile, when the molecular weight is constant, a compound having a smaller π-conjugated plane in its molecular skeleton is more advantageous for the sublimation purification because an intermolecular interaction becomes relatively small. In contrast, a compound having a large π-conjugated plane in its molecular skeleton is disadvantageous for the sublimation purification because the intermolecular interaction is (relatively) large.

On the other hand, when the molecular weight of the heterocycle-containing compound as the host is excessively small, its deposition rate becomes unstable upon vacuum deposition. Therefore, in consideration of a balance between the molecular weight and the size of the π-conjugated plane described above, p preferably represents 1 in each of the heterocycle-containing compounds represented by the general formulae [17] to [21]. Further, all of $E_1$ to $E_{22}$ each additionally preferably represent a hydrogen atom because a molecular weight reduction is achieved, though the reduction is in a trade-off relationship with the chemical stability.

(4) Third Component

In the organic light-emitting element of the present invention, a compound serving as a third component may be further incorporated into the emission layer in addition to the host (heterocycle-containing compound) and guest (iridium complex). When the third component is incorporated into the emission layer, the concentration (weight ratio) of a constituent material for the emission layer is as follows: the host accounts for 50 wt % or more of the entirety, and the total of the guest and the third component accounts for less than 50 wt % thereof. That is, even when the third component is incorporated into the emission layer, the host is a material corresponding to the main component out of the constituent materials for the emission layer.

The compound serving as the third component is a material having the following feature (4a), (4b), or (4c):

(4a) a material having a larger (shallower) HOMO level than the HOMO level of the host;

(4b) a material having an LUMO level smaller in energy (deeper) than the LUMO level of the host; or (4c) a material having an HOMO level larger in energy than the HOMO level of the host and having an LUMO level smaller in energy than the LUMO level of the host.

The material having the feature (4a) facilitates the injection and transport of a hole into the emission layer by virtue of its shallow HOMO level. As a result, a reduction in driving voltage of the element is achieved and the light-emitting material can be suppressed from being excessively brought into an anion state, and hence the lifetime of the element is lengthened.

The material having the feature (4b) lengthens the lifetime of the element by the following reason. That is, the LUMO level of the host is shallower (larger in energy) than that of the light-emitting material, and hence the addition of the third component having a deeper LUMO level than the LUMO level of the host can suppress the light-emitting material from being excessively brought into an anion state. Therefore, the lifetime is lengthened.

The material having the feature (4c) can improve hole injection property and alleviate electron trapping by the light-emitting material. Accordingly, the lifetime is lengthened as a result of the foregoing.

It is to be noted that specific examples of the third component are described later.

(5) Actions and Effects Exhibited by Host and Guest

Next, actions and effects exhibited by the host and guest to be incorporated into the emission layer in the organic light-emitting element of the present invention are described.

(5-1) Action and Effect Exhibited by Guest

The iridium complex represented by the general formula [1] as the guest is a complex compound formed of trivalent iridium and three kinds of ligands ($L_1$, $L_2$, and $L_3$) that are not identical to one another in structure. In the iridium complex represented by the general formula [1], the three kinds of ligands in the complex are different from one another particularly from a structural viewpoint. Accordingly, the iridium complex represented by the general formula [1] becomes a complex having no symmetry. Therefore, the iridium complex represented by the general formula [1] has low crystallinity in a solid state and an energy for bonding molecules of the complex is small. As a result, the iridium complex represented by the general formula [1] has high sublimability. It is to be noted that details about the sublimability of the complex are described later.

First, the three kinds of ligands of the iridium complex are described.

Of the three kinds of ligands, $L_1$ and $L_2$ each have a carbon atom that forms a covalent bond with iridium and a nitrogen atom that forms a coordinate bond with iridium. In addition, $L_1$ and $L_2$ each serve as a ligand that coordinates to iridium to form a five-membered ring formed of iridium and a partial skeleton N—C—C—C, thereby affecting the phosphorescence characteristics of the complex. That is, the ligands $L_1$ and $L_2$ are each a ligand called a luminous ligand. On the other hand, $L_3$ is called an auxiliary ligand because of its small contribution to the phosphorescence characteristics, though $L_3$ is a monovalent bidentate ligand as in $L_1$ and $L_2$.

First, $L_1$ as a luminous ligand is described. $L_1$ is a ligand having a benzo[f]quinoline skeleton as a basic skeleton and the ring $A_1$ that is an aromatic ring or an aromatic heterocycle. The selection of a predetermined aromatic ring or aromatic heterocycle as the ring $A_1$ causes the partial structure $IrL_1$ including $L_1$ to form a triplet energy level that generates phosphorescence having a wavelength equal to or longer than that of an orange color. In the present invention, the phosphorescence having a wavelength equal to or longer than that of an orange color refers to such light that the maximum peak wavelength of a phosphorescence spectrum is 580 nm or more.

Here, proper selection of the ring $A_1$ causes the partial structure $IrL_1$ to form a triplet energy level that generates phosphorescence whose color ranges from an orange color to a red color. In the present invention, the phosphorescence whose color ranges from an orange color to a red color refers to such light that the maximum peak wavelength of a phosphorescence spectrum is 580 nm or more and 650 nm or less. Phosphorescence having a wavelength in the region can be suitably applied to a display apparatus, a lighting apparatus, or an exposure light source for an image-forming apparatus of an electrophotographic system.

By the way, the benzo[f]quinoline skeleton in the ligand $L_1$ is liable to interact with a benzo[f]quinoline skeleton in an adjacent complex. That is, ring planes in the benzo[f]quinoline skeletons may overlap each other to cause π-π stacking. As a result, an energy for bonding molecules of the complex to each other increases to reduce the sublimability.

In order that the π-π stacking may be suppressed, the benzo[f]quinoline skeleton is preferably provided with a substituent as appropriate to inhibit the approach of the ring planes. In particular, a substituent (preferably an alkyl group having 1 to 4 carbon atoms or a phenyl group) is introduced into a substituent bonded to a carbon atom distant from iridium out of the carbon atoms in the benzo[f]quinoline skeleton, specifically, any one of $R_5$ to $R_8$ in the general formula [2]. Thus, an effect of inhibiting the approach of the ring planes is additionally increased.

Next, the ligand $L_2$ is described. $L_2$ is a luminous ligand as in $L_1$, and is a ligand formed of two kinds of ring structures, i.e., the ring $A_2$ and the ring B. The ring $A_2$ is appropriately selected from an aromatic ring and an aromatic heterocyclic group, and the ring B is appropriately selected from nitrogen-containing aromatic rings depending on desired purposes. Of those, a skeleton capable of forming a stable complex with trivalent iridium is preferred.

The iridium complex of the present invention generates only phosphorescence derived from a partial structure having the lower triplet energy level out of the partial structures $IrL_1$ and $IrL_2$. This is because energy transfer from the partial structure having the higher triplet energy level to the partial structure having the lower triplet energy level occurs. Which partial structure is caused to emit phosphorescence can be appropriately selected depending on desired purposes.

Here, when the luminescent color is changed from an orange color to a red color, molecular design is preferably performed so that phosphorescence may be generated from the partial structure ($IrL_1$) including the benzo[f]quinoline skeleton. This is because the phosphorescence quantum yield of the complex having the partial structure $IrL_1$ is high as described in PTL 3. On the other hand, when phosphorescence is extracted from the partial structure $IrL_2$, the number of heteroatoms in the basic skeleton of each of the ring $A_2$ and the ring B is preferably as small as possible in consideration of the chemical stability of the ligand $L_2$. This is because of the following reason: a carbon atom and a heteroatom are different from each other in electronegativity, and hence charge bias occurs in a bond between both the atoms and the decomposition of the bond by a chemical reaction is liable to occur. In addition, the molecular weight of the basic skeleton of each of the ring $A_2$ and the ring B is preferably as small as possible in consideration of the sublimability of the iridium complex represented by the general formula [1]. Therefore, in consideration of the number of heteroatoms in the basic skeleton of each of the ring $A_2$ and the ring B, and the molecular weight of the basic skeleton, a preferred aspect of the partial structure $IrL_2$ is such a structure that the ring $A_2$ is a benzene ring and the ring B is a pyridine ring, specifically, the partial structure represented by the general formula [5].

Next, the ligand $L_3$ is described. The ligand $L_3$ is not particularly limited as long as the ligand forms a stable complex with trivalent iridium and does not largely reduce the emission quantum yield. The ligand is preferably a ligand that is formed of a skeleton having a smaller molecular weight than those of the luminous ligands ($L_1$ and $L_2$), and that improves the sublimability of the complex. The ligand $L_3$ that satisfies the requirements is preferably β-diketonate, more preferably a ligand constituting the partial structure represented by the general formula [6].

Next, the sublimability of the iridium complex is described.

In the related art, when a complex having the partial structure $IrL_1$ is obtained, a complex including one kind of luminous ligand represented by the following general formula [a], or a complex including at least one luminous ligand represented by the following general formula [b] and at least one auxiliary ligand is general.

Ir(L₁)₃ [a]

Ir(L₁)₂(L₃) [b]

(L₁ represented in each of the formula [a] and the formula [b], and L₃ represented in the formula [b] are the same as L₁ and L₃ in the general formula [1], respectively.)

Here, the iridium complex represented by the general formula [b] is improved in sublimability as compared to the iridium complex represented by the general formula [a] because the auxiliary ligand (L₃) is used. In view of the foregoing, both the iridium complex of the present invention and the iridium complex represented by the general formula [b] were compared from the viewpoints of sublimability and heat stability.

Here, the molecular weight, sublimation temperature ($T_{sub}$), decomposition temperature ($T_d$), and difference between the decomposition temperature and the sublimation temperature ($\Delta T = T_d - T_{sub}$) of each of the iridium complex of the present invention and the iridium complex represented by the general formula [b] are shown.

TABLE 1

| Structure | Molecular weight | Sublimation temperature $T_{sub}/°C$ | Decomposition temperature $T_d/°C$ | $\Delta T/°C$ |
|---|---|---|---|---|
| Exemplified Compound IR-113 | 775.9 | 300 | 355 | 55 |
| Complex 2 | 952.1 | 370 | 400 | 30 |
| Exemplified Compound Ir-106 | 846.1 | 290 | 375 | 85 |

TABLE 1-continued

| | Structure | Molecular weight | Sublimation temperature $T_{sub}/°C.$ | Decomposition temperature $T_d/°C.$ | $\Delta T/°C.$ |
|---|---|---|---|---|---|
| Complex 3 | 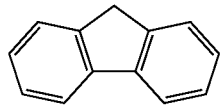 [SMILES: c1ccc2c(c1)Cc1ccccc1-2] | 828.0 | 345 | 375 | 30 |

Here, the $T_d$ is an indicator of the heat stability of the complex itself and the $\Delta T$ ($=T_d-T_{sub}$) is an indicator of heat stability in a step involving sublimation. Therefore, the $\Delta T$ becomes more important than the $T_d$ is upon sublimation purification or vacuum deposition. This is because when the $\Delta T$ is small, thermal decomposition gradually progresses even at a temperature equal to or lower than the $T_d$ upon sublimation to produce impurities. In addition, a small $\Delta T$ is industrially disadvantageous because the range of regulation of a sublimation rate is small, i.e., step tolerance is small.

Table 1 shows that the $T_{sub}$ of Exemplified Compound Ir-113 is lower than that of Complex 2 by 70° C. and is hence largely improved in sublimability.

A first possible factor for the foregoing is a reduction in crystallinity. While Complex 2 has a $C_2$ symmetrical structure, Exemplified Compound Ir-113 is asymmetrical. Therefore, in Exemplified Compound Ir-113, π-π stacking caused by the approach of $L_1$'s in complex molecules adjacent to each other hardly occurs as compared to Complex 2.

A second possible factor therefor is the fact that the molecular weight of Exemplified Compound Ir-113 is smaller than the molecular weight of Complex 2 by 176.2. The molecular weight of Exemplified Compound Ir-113 was smaller than that of Complex 2, and hence its $T_d$ was lower than that of Complex 2 by 45° C., while its $\Delta T$ ($T_d-T_{sub}$) was larger than that of Complex 2 by 25° C. In other words, it can be said that Exemplified Compound Ir-113 is improved not only in sublimability but also in heat stability at the time of a sublimation operation.

On the other hand, the $T_{sub}$ of Exemplified Compound Ir-106 is lower than that of Complex 3 by 55° C. despite the fact that its molecular weight is larger than that of Complex 3 by 18.1. The foregoing means that an intermolecular interaction between complex molecules significantly reduced. A possible factor for the foregoing is the fact that an effect peculiar to the ligand $L_2$, i.e., a phenyl group and tert-butyl group introduced into 2-phenylpyridine as well as the asymmetry of the complex itself inhibit the intermolecular interaction between the complex molecules.

In addition, the $\Delta T$ ($T_d-T_{sub}$) of Exemplified Compound Ir-106 was larger than that of Complex 3 by 55° C. because values for the $T_d$'s of both the materials were the same. Accordingly, Exemplified Compound Ir-106 is a ligand largely improved in heat stability.

As described above, the iridium complex of the present invention is reduced in crystallinity and improved in sublimability because the complex has three kinds of ligands structurally different from one another to become an asymmetrical complex. Further, the degree of freedom in molecular design of the complex can be increased because the action and effect of the present invention are exhibited as long as the complex has a predetermined partial structure. Specifically, the complex can be additionally improved in sublimability and heat stability as compared to a conventional iridium complex by reducing its molecular weight or introducing a substituent.

(5-2) Action and Effect Exhibited by Host

The heterocycle-containing compound to be used as the host in the organic light-emitting element of the present invention is such a compound that an energy difference ($\Delta$S–T) between the lowest singlet energy level ($S_1$) and the lowest triplet energy level ($T_1$) can be reduced as compared to an aromatic hydrocarbon compound.

Table 2 shows the results of molecular orbital calculation for, for example, fluorene and compounds each obtained by substituting part of the carbon atoms constituting a fluorene skeleton with a heteroatom (ab initio molecular orbital calculation program: Gaussian, basis function: 3-21G*).

TABLE 2

| | Structural formula | $S_1$/eV | $T_1$/eV |
|---|---|---|---|
| Fluorene | 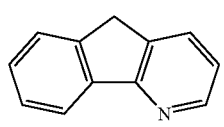 [SMILES: c1ccc2c(c1)Cc1cccnc1-2] | 4.86 | 3.21 |
| 4-Azafluorene | 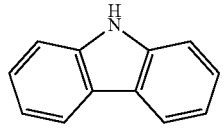 | 4.44 | 3.26 |
| Carbazole | 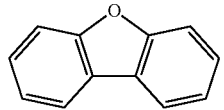 [SMILES: c1ccc2c(c1)oc1ccccc12] | 4.63 | 3.34 |
| Dibenzofuran |  | 4.29 | 3.28 |

TABLE 2-continued

| | Structural formula | $S_1$/eV | $T_1$/eV |
|---|---|---|---|
| Dibenzothiophene | 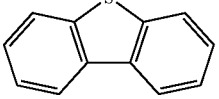 | 4.26 | 3.32 |

Although the five kinds of compounds shown in Table 2 are comparable to one another in $T_1$, fluorene has the highest $S_1$. Accordingly, out of the five kinds of compounds, fluorene has the largest $\Delta$S–T value.

It is understood from Table 2 that a heterocycle-containing compound containing a heteroatom in its ring structure can be reduced in $\Delta$S–T as compared to an aromatic hydrocarbon compound as long as the compounds are similar to each other from the viewpoint of a skeleton construction. That is, when the heterocycle-containing compound is used as the host, the band gap can be made smaller in the case where the $T_1$ is constant, and hence the driving voltage of the organic light-emitting element can be reduced. Therefore, when the iridium complex represented by the general formula [1] is used as the guest, it is suitable to use the heterocycle-containing compound as the host.

Next, a more preferred aspect of the host is described.

Compounds obtained by substituting sp$^2$ carbon atoms of benzene, naphthalene, and a fused polycyclic compound with nitrogen atoms (such as pyridine, quinoline, and azafluorene) are available as heterocycle-containing compounds. Each of the highest occupied molecular orbital (HOMO) levels and lowest unoccupied molecular orbital (LUMO) levels of those compounds is known to reduce. Therefore, the use of a compound having the skeleton of a compound obtained by substituting an sp$^2$ carbon atom of any one of benzene, naphthalene, and a fused polycyclic compound with a nitrogen atom as the host makes it difficult to inject a hole into the emission layer while the use facilitates the injection of an electron into the layer. Accordingly, the kinds of applicable charge transport layers and guests are limited.

(6) Specific Examples of Iridium Complex

Specific examples of the iridium complex serving as the guest are shown below.

Ir-101

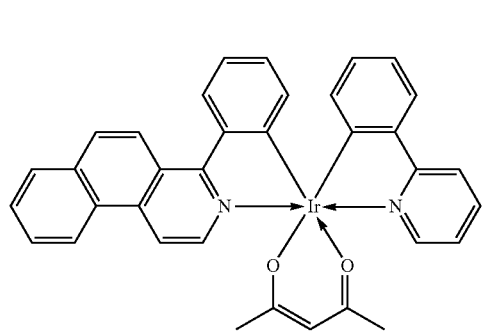

Ir-102

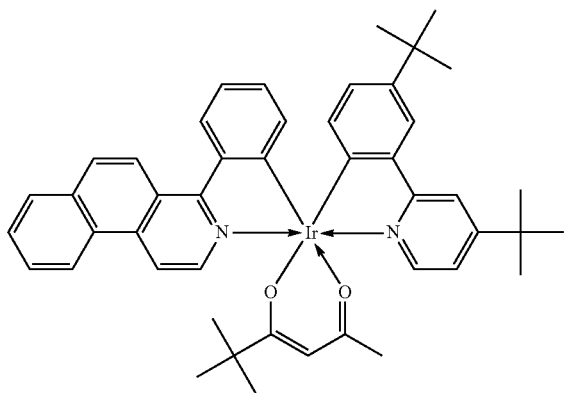

Ir-103

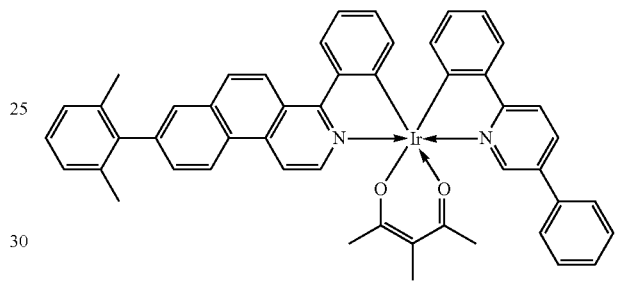

Ir-104

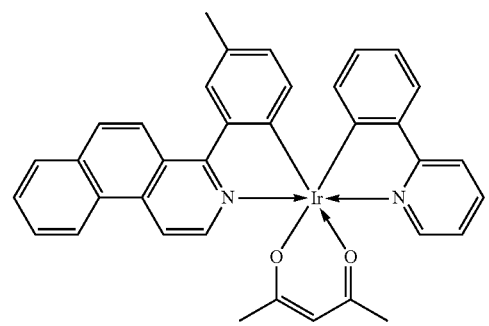

Ir-105

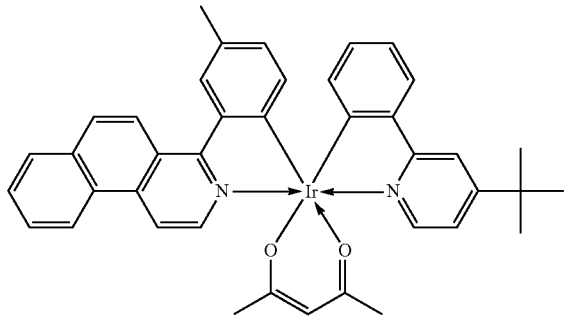

Ir-106
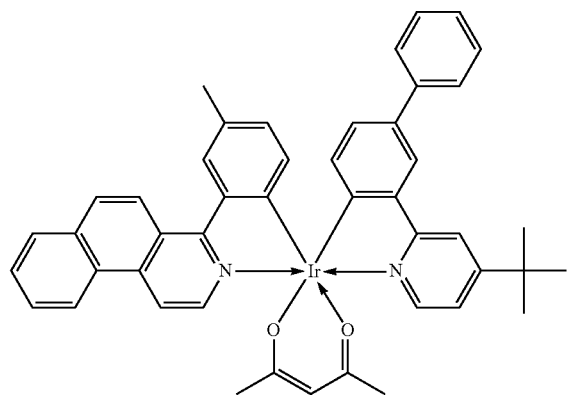
Ir-107
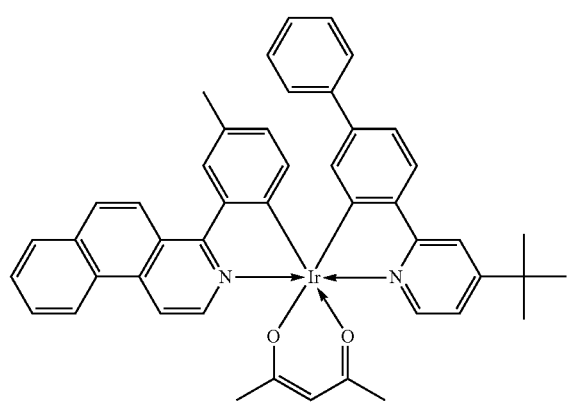
Ir-108
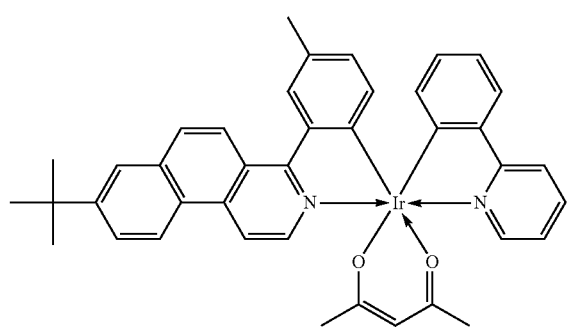
Ir-109
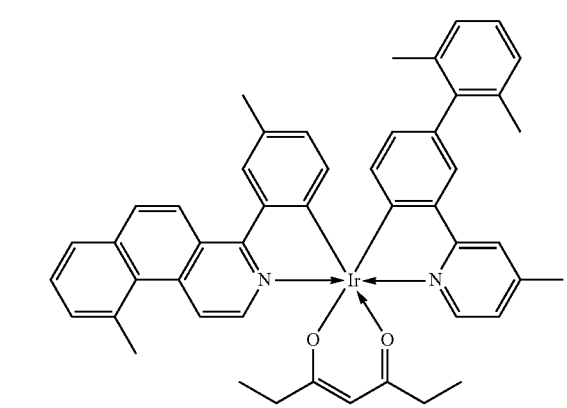
Ir-110
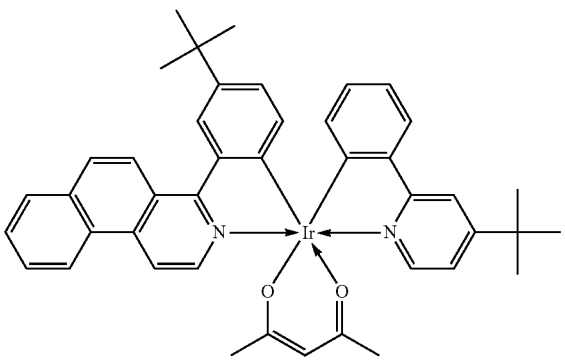
Ir-111
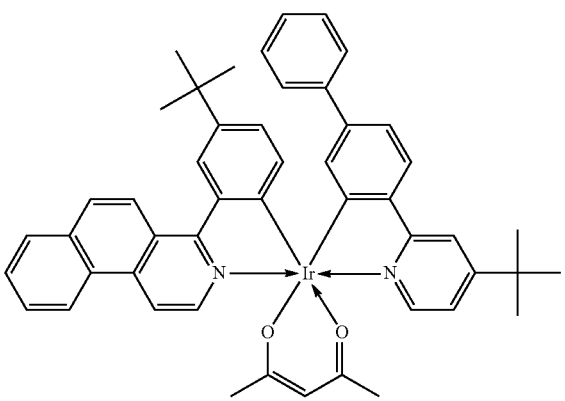
Ir-112
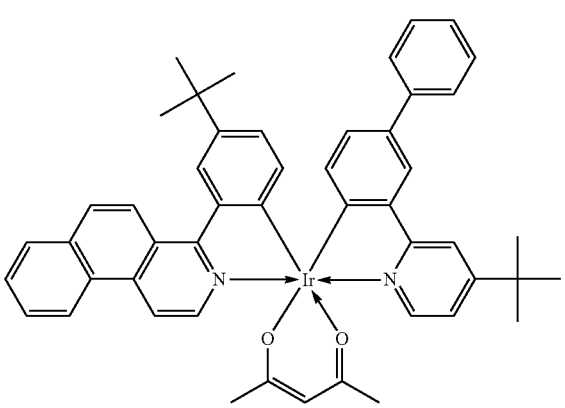
Ir-113

Ir-114
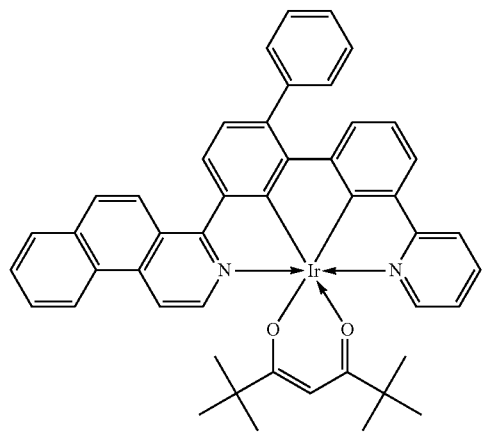
Ir-117
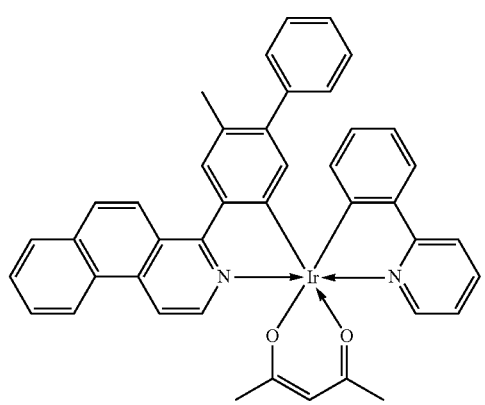
Ir-115
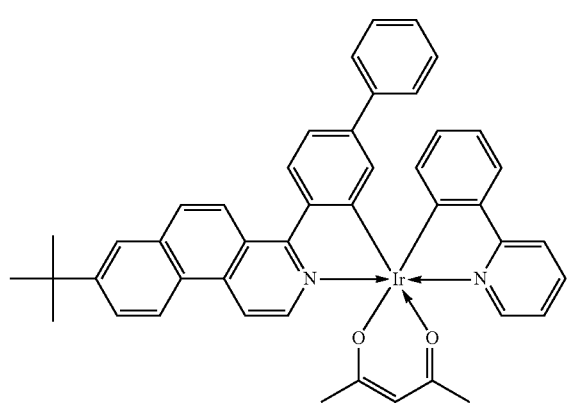
Ir-118
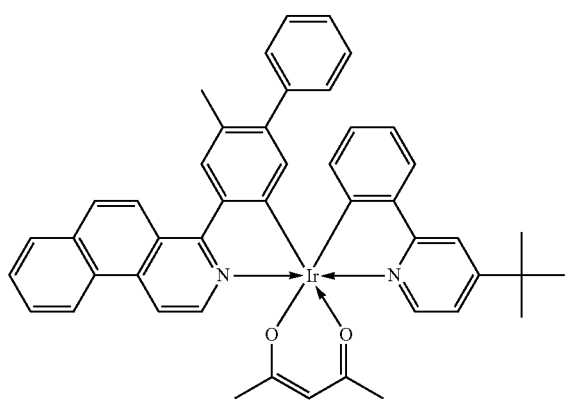
Ir-116
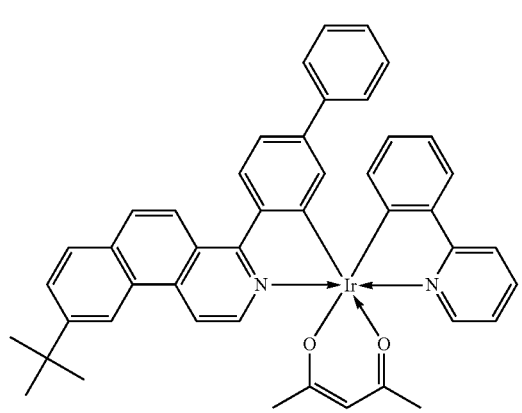
Ir-119
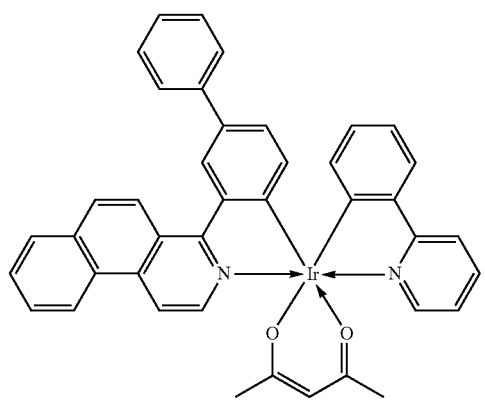

Ir-120
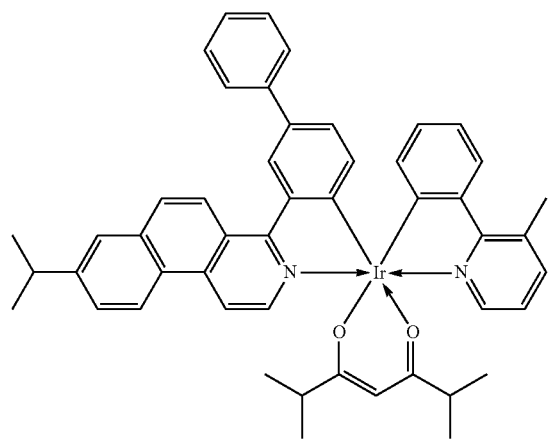
Ir-121
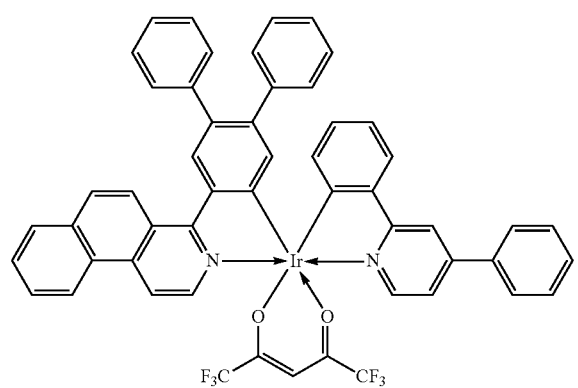
Ir-122
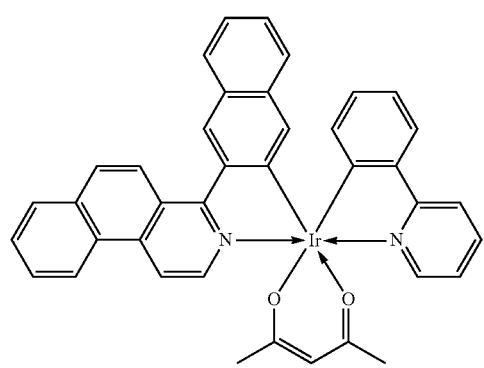
Ir-123
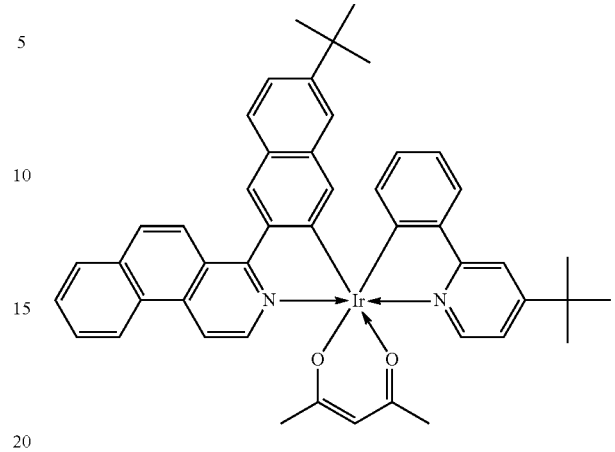
Ir-124
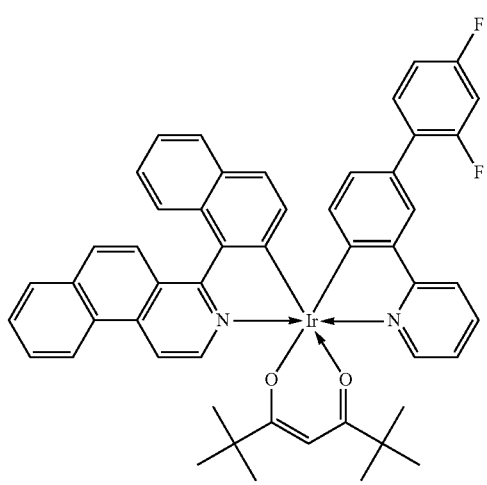
Ir-125
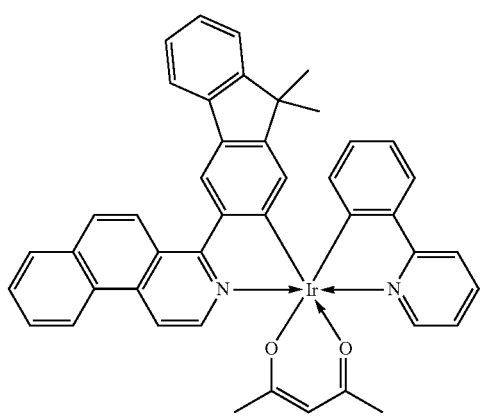

Ir-126
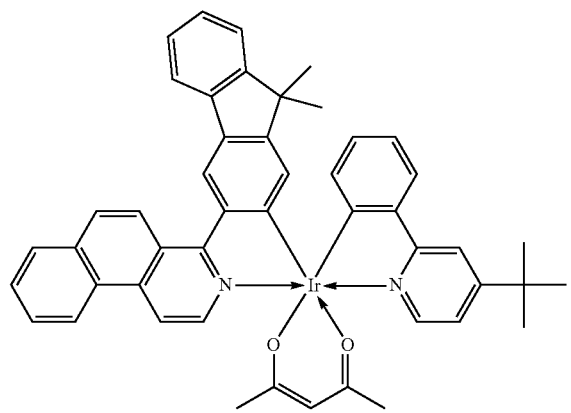
Ir-127
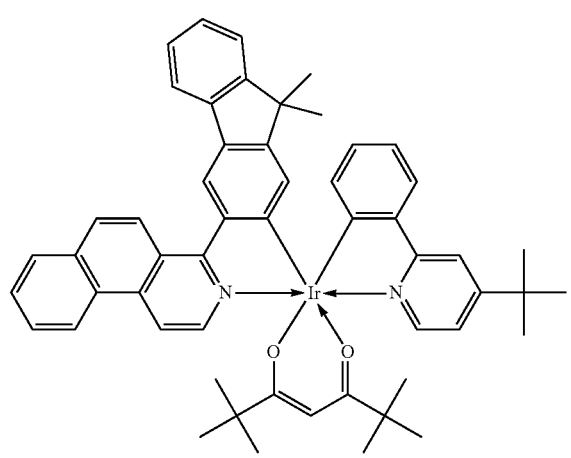
Ir-128
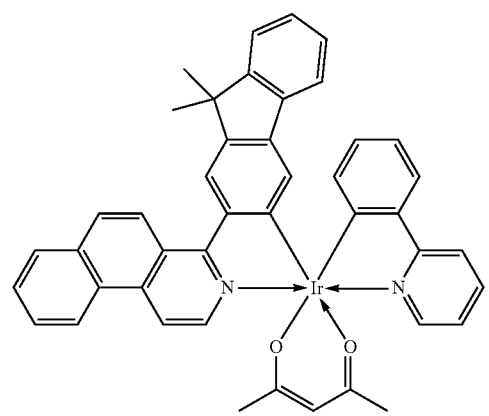
Ir-129
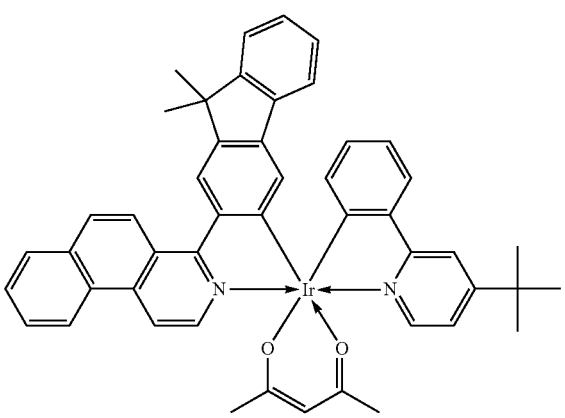
Ir-130
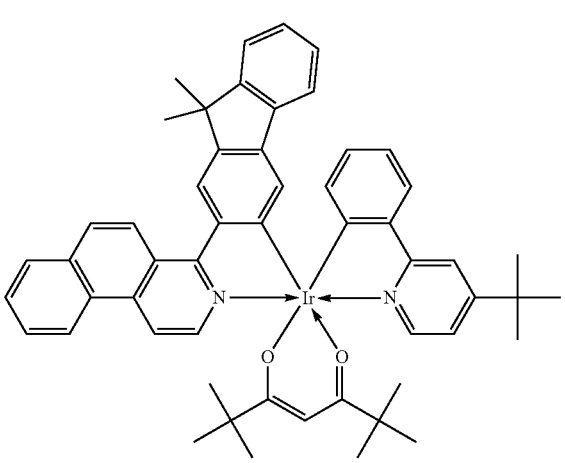
Ir-131
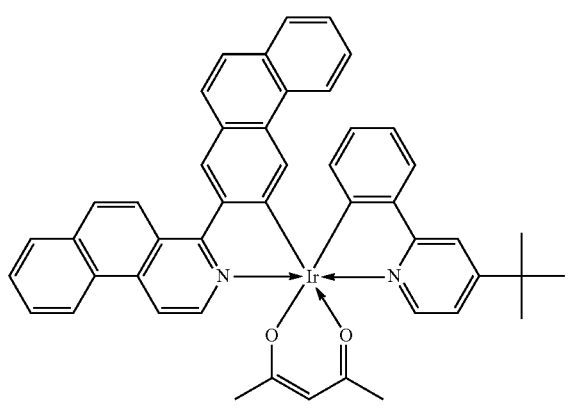

Ir-132
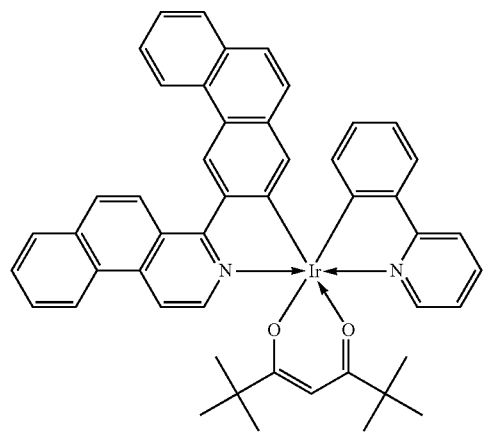
Ir-135
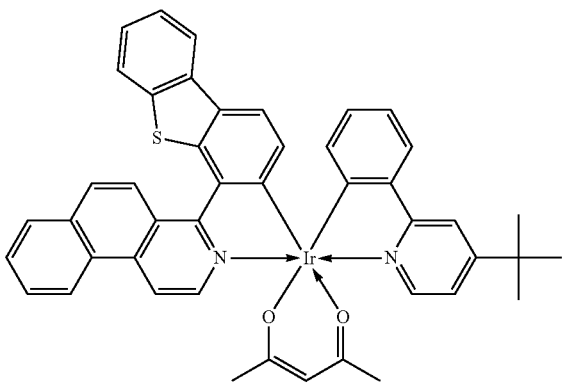
Ir-133
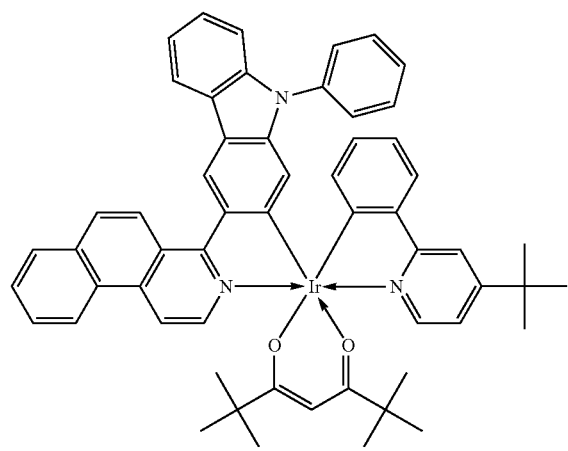
Ir-136
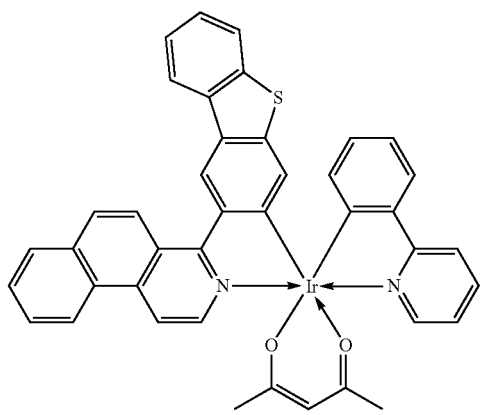
Ir-134
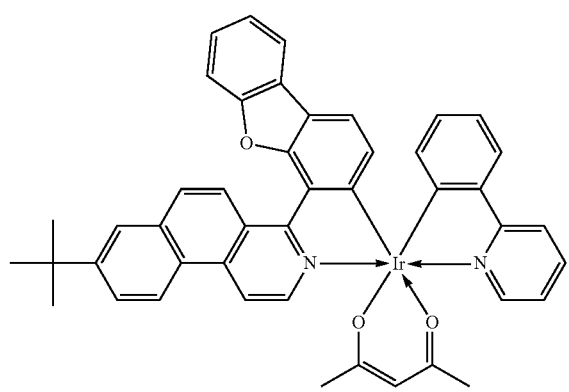
Ir-201
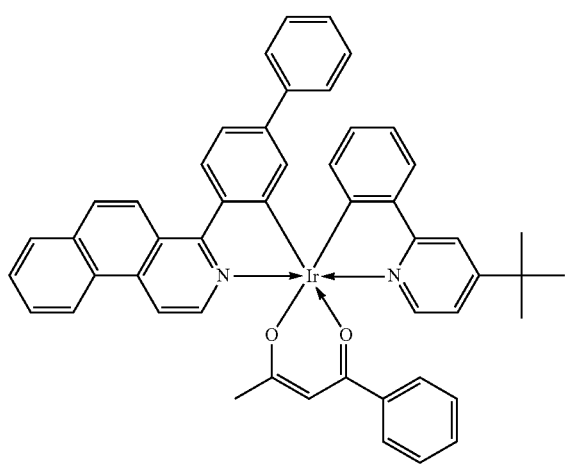

Ir-202
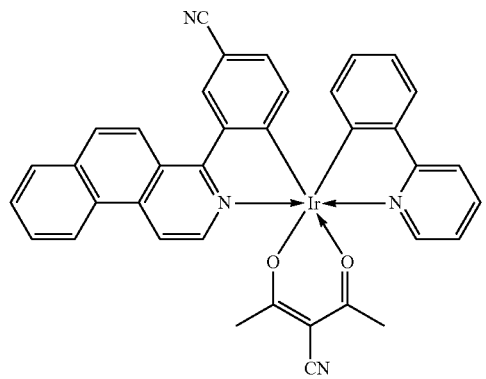
Ir-203
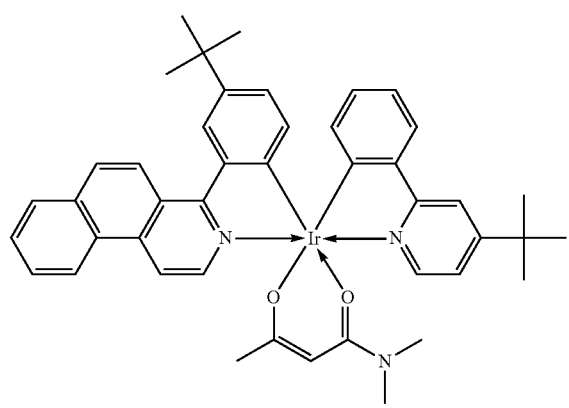
Ir-204
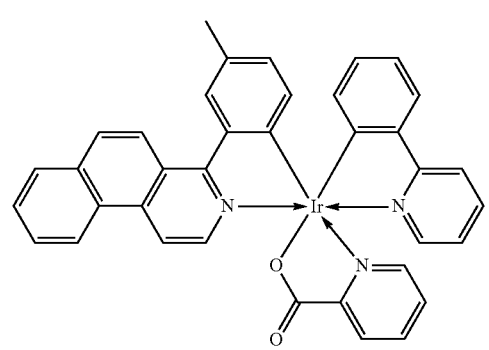
Ir-205
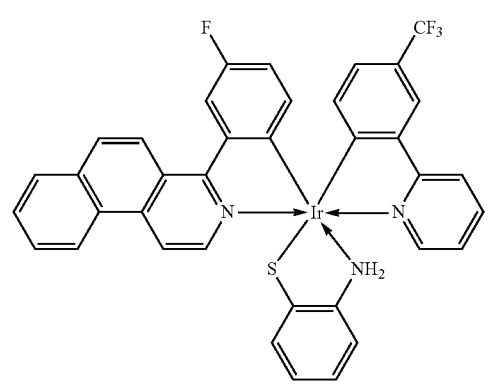
Ir-206
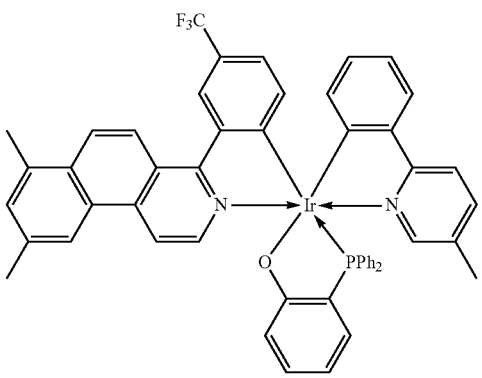
Ir-301
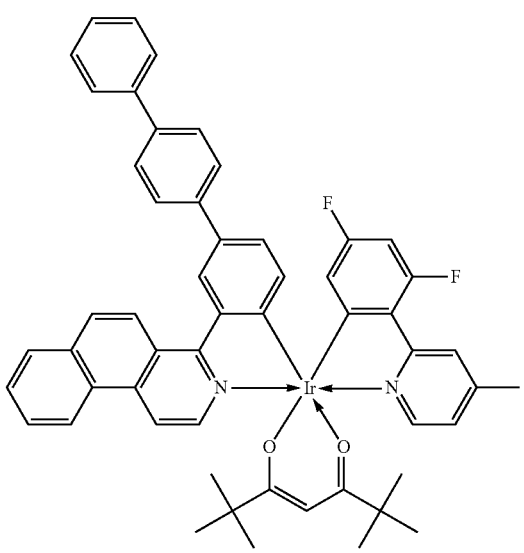
Ir-302
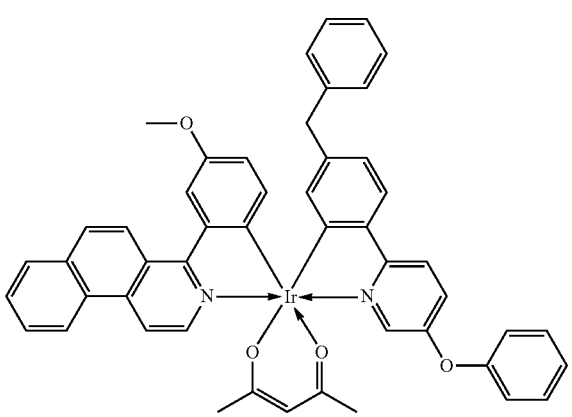

Ir-303
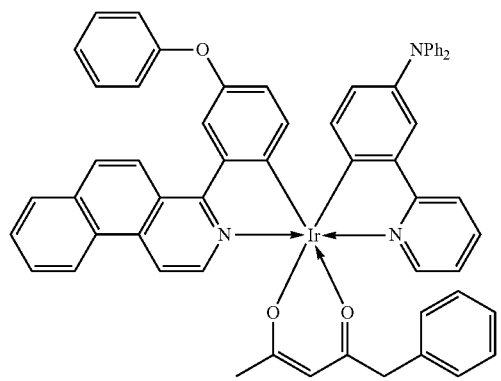
Ir-304
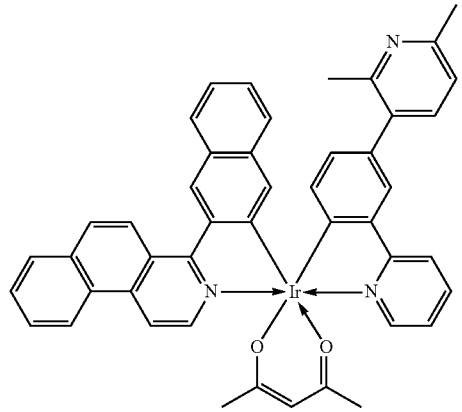
Ir-305
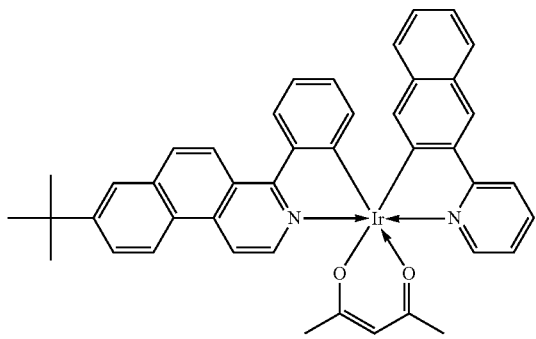
Ir-306
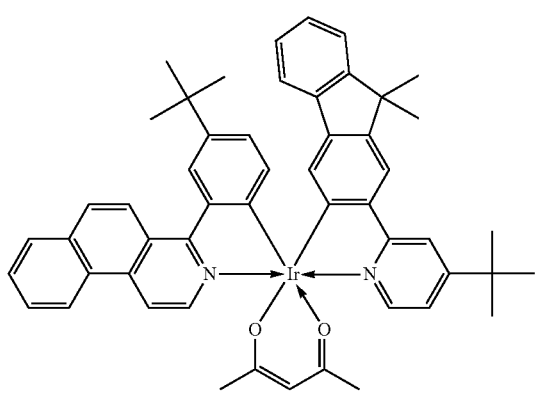
Ir-307
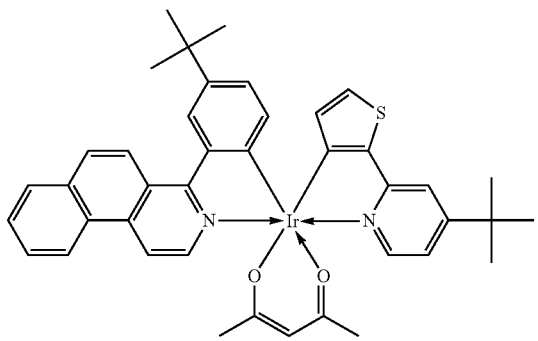
Ir-308
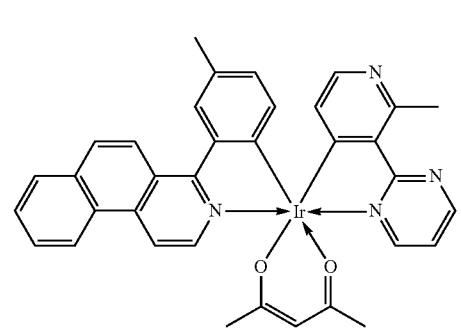
Ir-309
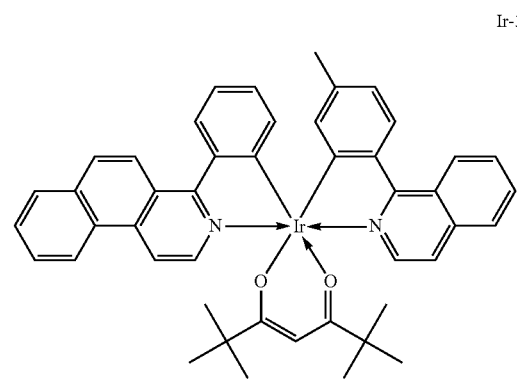
Ir-310
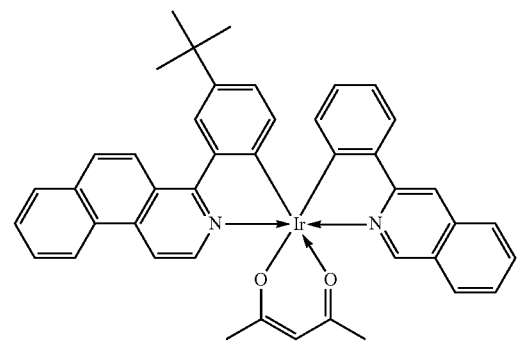

Ir-311

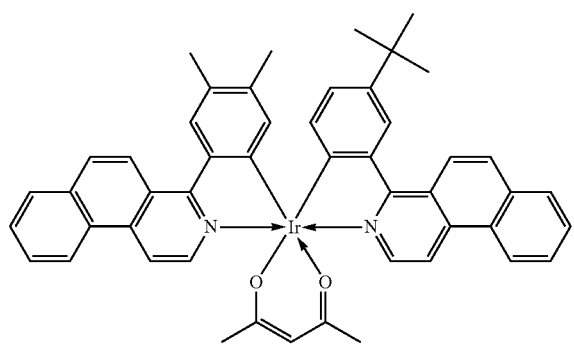

Ir-403

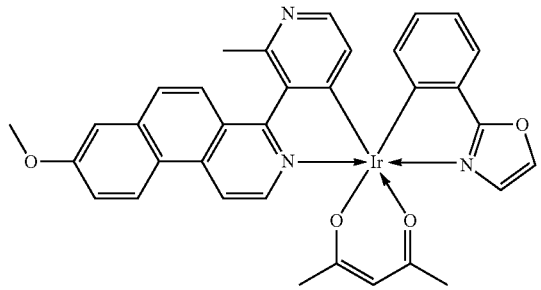

Ir-312

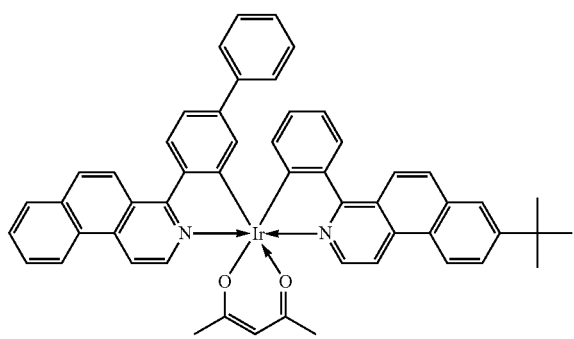

Ir-404

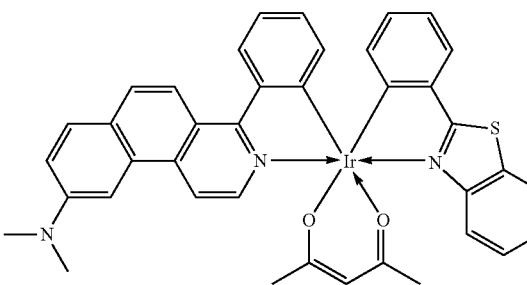

Ir-401

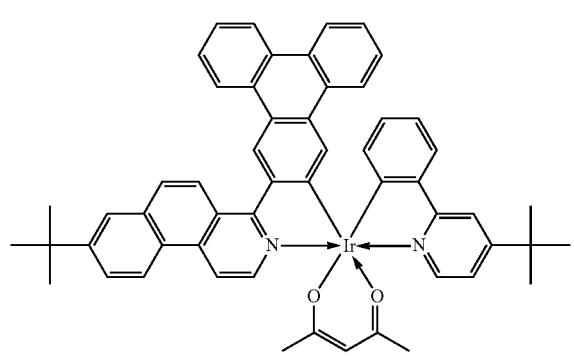

Ir-405

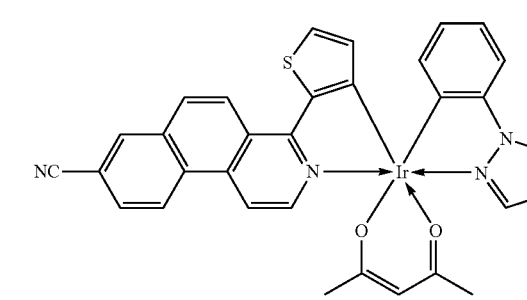

Ir-402

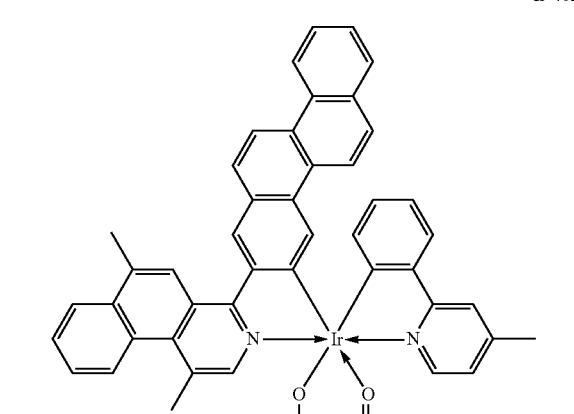

Ir-406

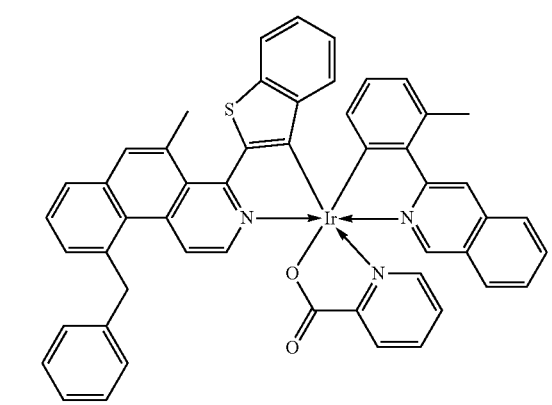

Of the exemplified iridium complexes, Ir-101 to Ir-136 each have a structure given below.

The partial structure including the ligand $L_1$ is the structure represented by the general formula [4].

The partial structure including the ligand $L_2$ is the structure represented by the general formula [5], and $R_{13}$ to $R_{20}$ in the formula [5] each represent a hydrogen atom, an alkyl group having 1 or more and 4 or less carbon atoms, or a phenyl group.

The partial structure including the ligand $L_3$ is the structure represented by the general formula [6], and $R_{21}$ to $R_{23}$ in the formula [6] each represent a hydrogen atom or an alkyl group having 1 or more and 4 or less carbon atoms.

Therefore, Ir-101 to Ir-136 are each particularly excellent in sublimability because preferred aspects of the three kinds of ligands to be incorporated into the iridium complex of the present invention are combined. In addition, the complexes each generate phosphorescence whose color ranges from an orange color to a red color resulting from the partial structure $IrL_1$.

Of the exemplified iridium complexes, Ir-201 to Ir-206 each use β-diketonate or any other bidentate ligand having a specific substituent as the ligand $L_3$. The phosphorescence characteristics of any such iridium complex such as an emission peak wavelength and the waveform of an emission spectrum can be appropriately regulated by changing $L_3$ as the auxiliary ligand.

Of the exemplified iridium complexes, Ir-301 to Ir-312 are each such that the ligand $L_2$ is the ligand represented by the general formula [3] or [5]. In the present invention, the ligand $L_2$ can be selected from a wider range of alternatives as long as its basic structure is represented by the general formula [3]. Here, the (energy level of the) HOMO or LUMO of any such iridium complex can be changed, or phosphorescence based mainly on the partial structure $IrL_2$ can be generated by appropriately selecting the ligand $L_2$.

Of the exemplified iridium complexes, Ir-401 to Ir-406 each have a structure given below.

The partial structure including the ligand $L_1$ is the structure represented by the general formula [2]. The partial structure including the ligand $L_2$ is the structure represented by the general formula [3].

In addition, not only phosphorescence whose color ranges from an orange color to a red color but also phosphorescence having a longer wavelength can be generated by $L_1$ represented in each of Ir-401 to Ir-406. In addition, a complex having various physical properties can be designed by appropriately combining $L_1$ and $L_2$ represented in each of Ir-401 to Ir-406.

(7) Specific Examples of Heterocycle-Containing Compound

Specific structural formulae of the heterocycle-containing compound to be used as the host are exemplified below.

Group 1 Compound

H-101

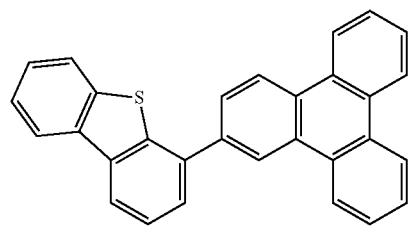

H-102

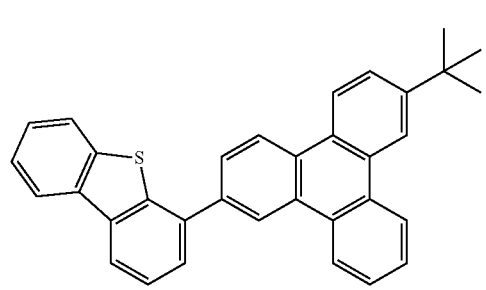

H-103

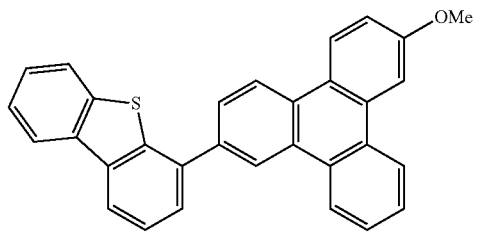

H-104

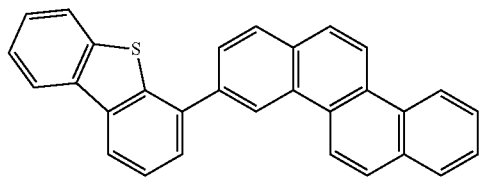

H-105

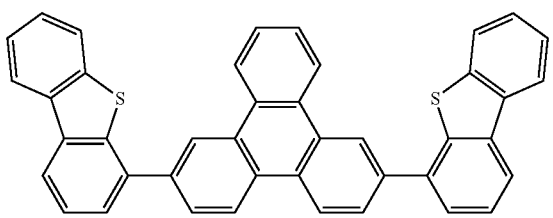

H-106

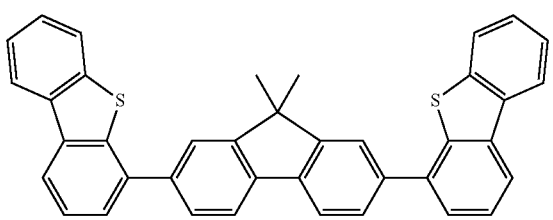

H-107

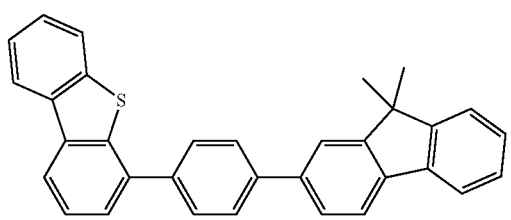

H-108

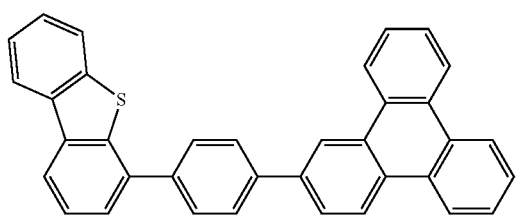

H-109
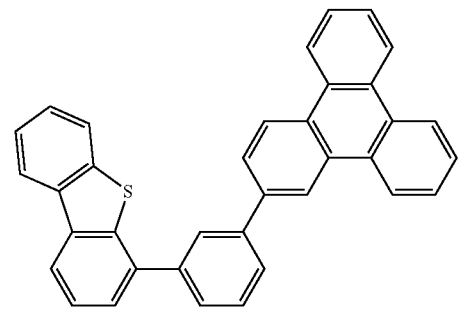
H-110
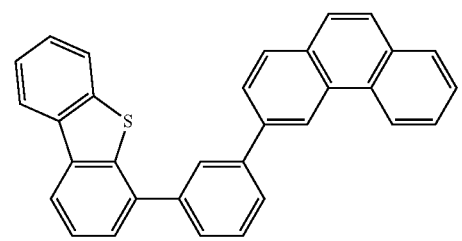
H-111
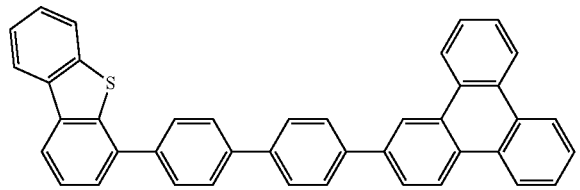
H-112
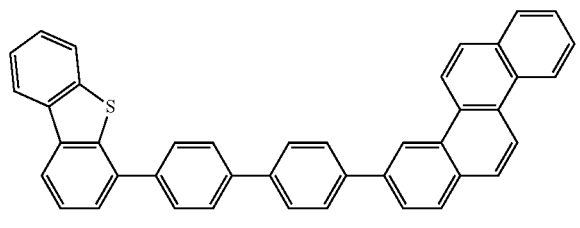
H-113
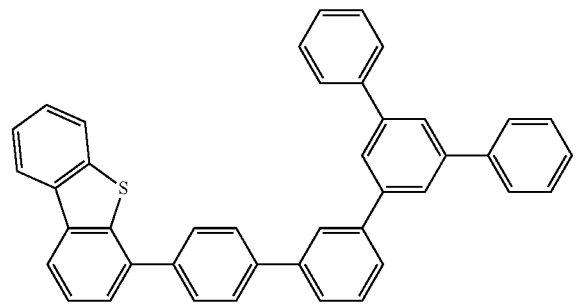
H-114
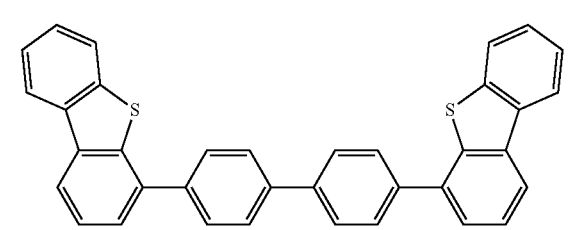
H-115
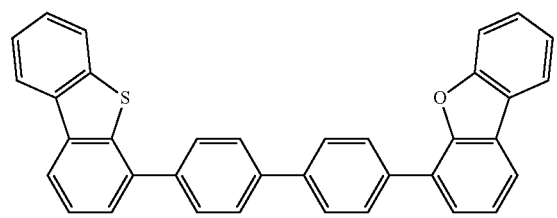
H-116
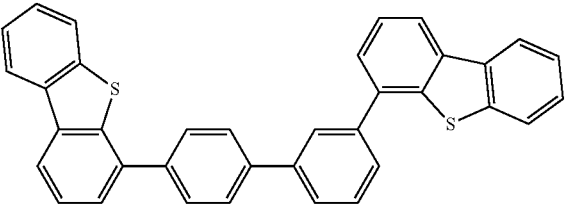
H-117
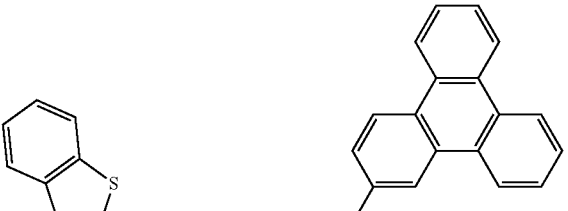
H-118
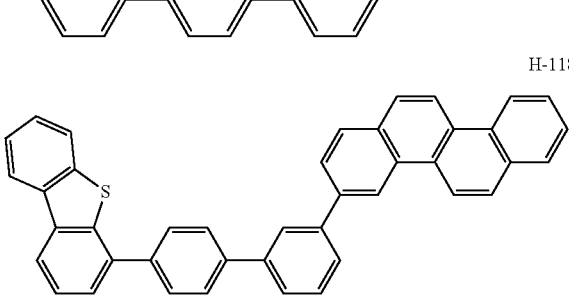
H-119
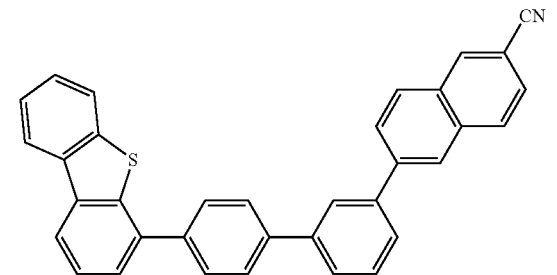
H-120
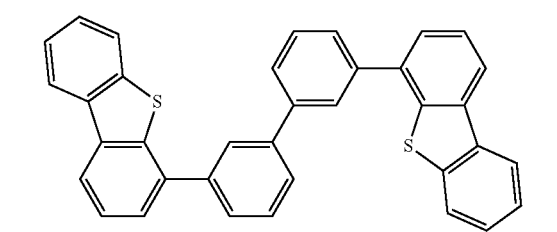

H-121
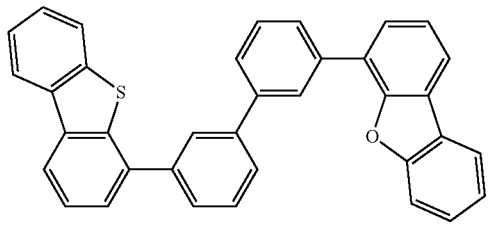
H-127
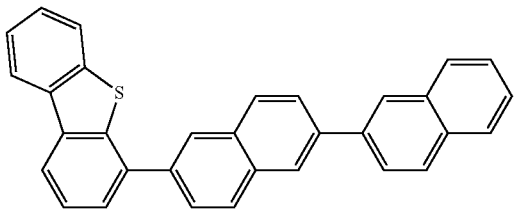
H-122
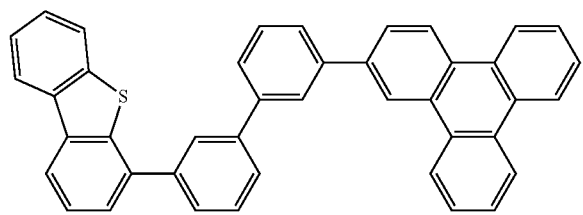
H-128
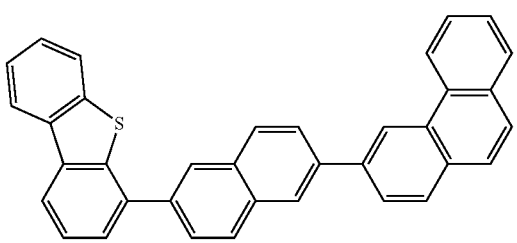
H-123
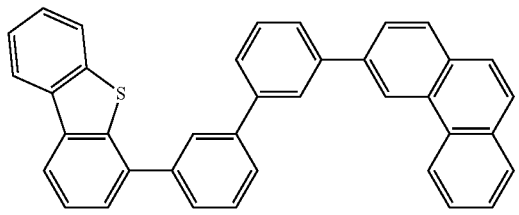
H-129
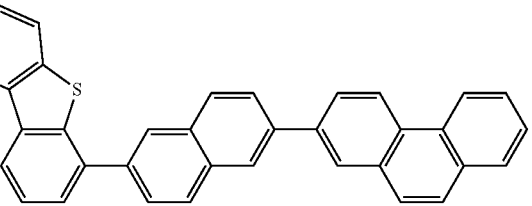
H-124
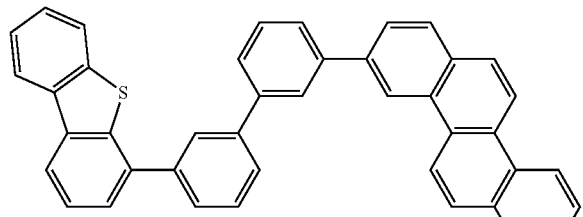
H-130
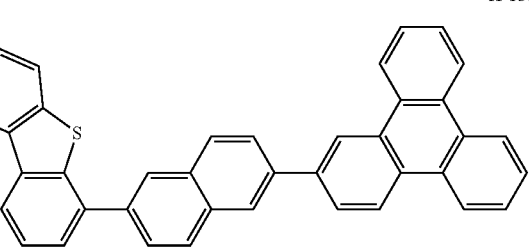
H-125
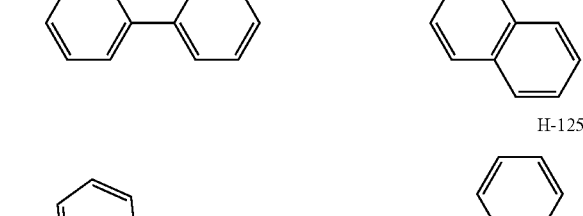
H-131
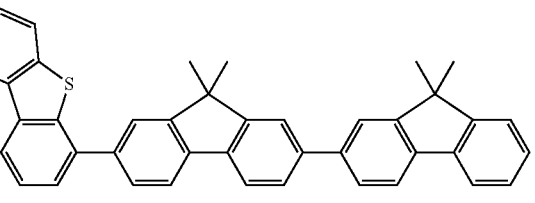
H-126
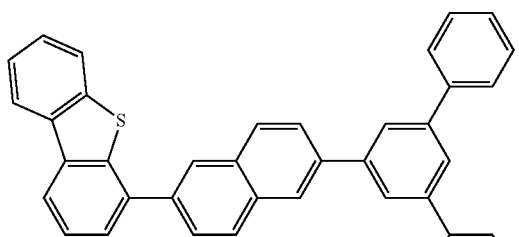
H-132
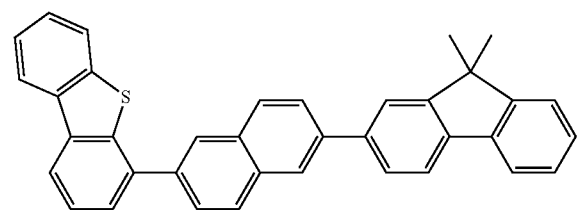

H-133
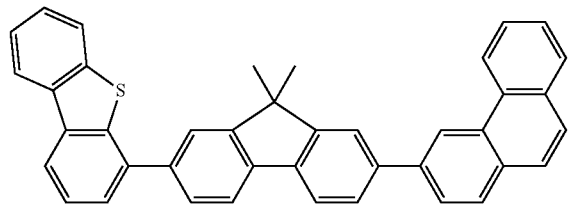
H-134
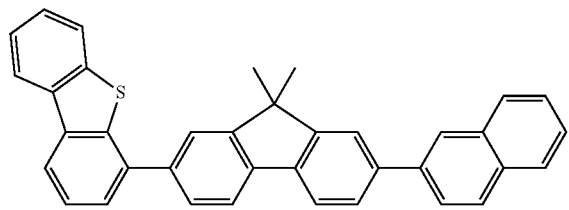
H-135
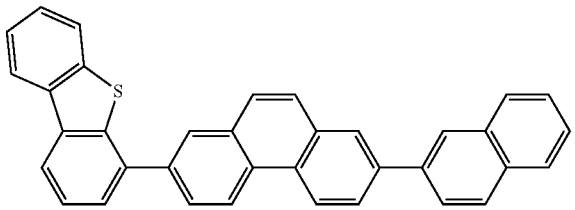
H-136
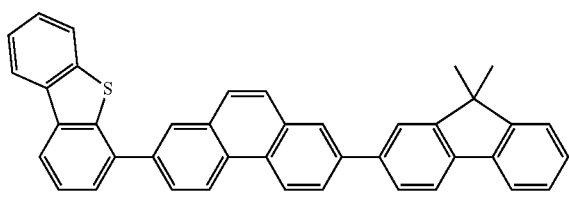
H-137
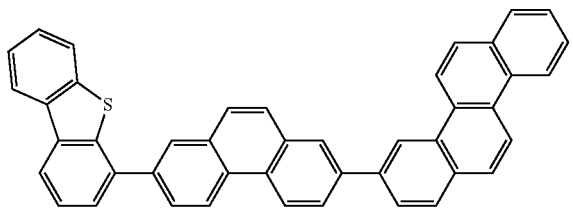
H-138
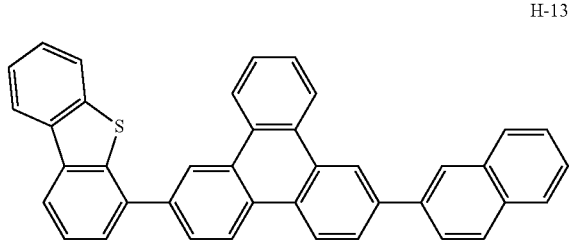
H-139
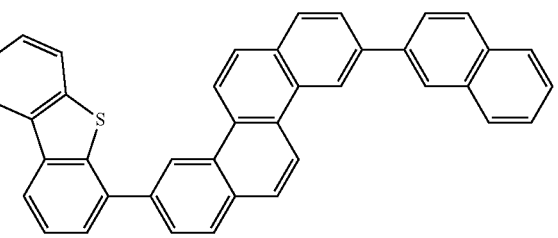
H-140
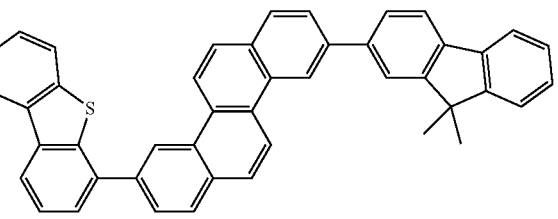
H-141
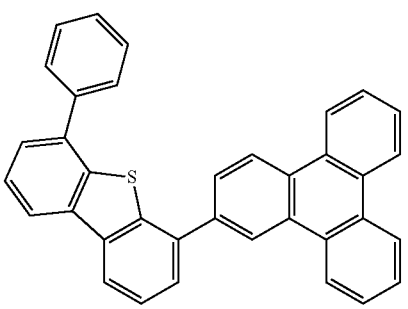
H-142
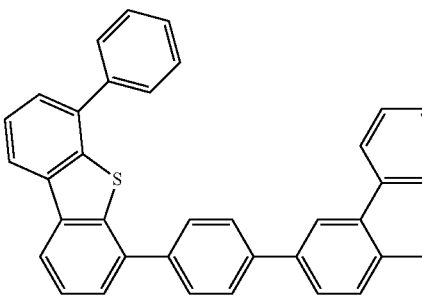
H-143
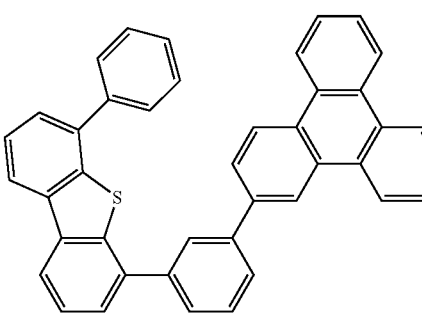

H-144
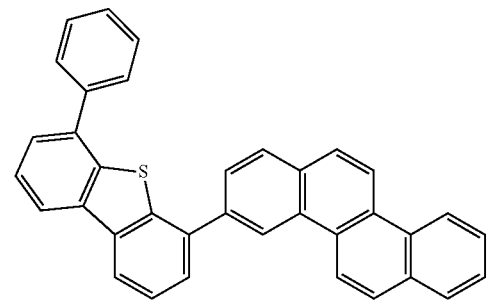
H-145
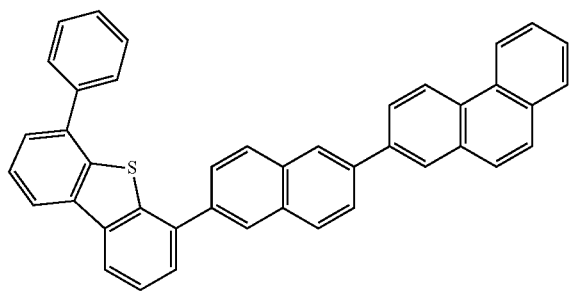
H-146
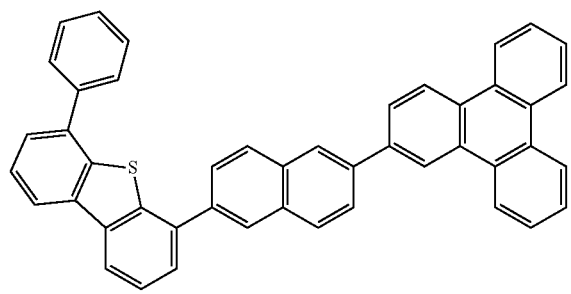
H-147
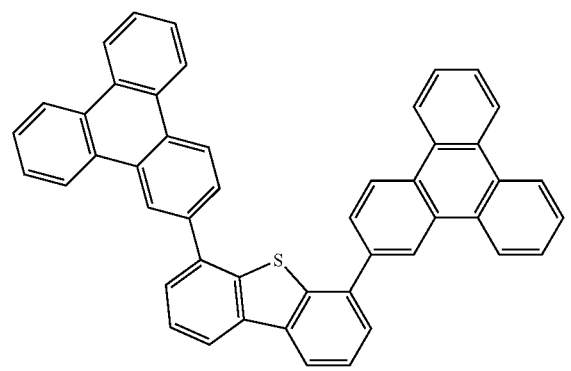
H-148
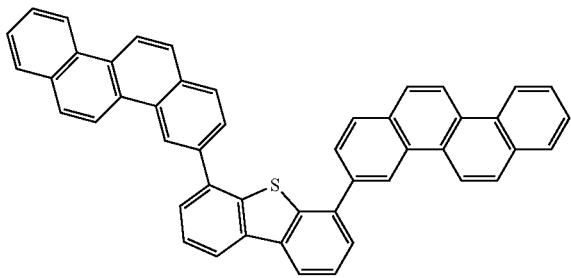
H-149
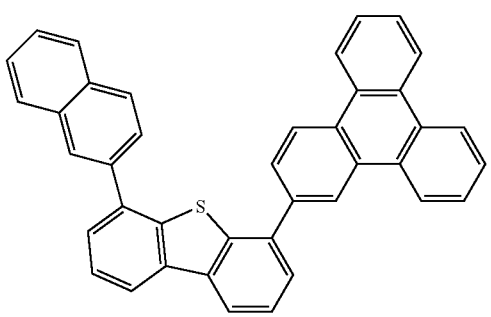
H-150
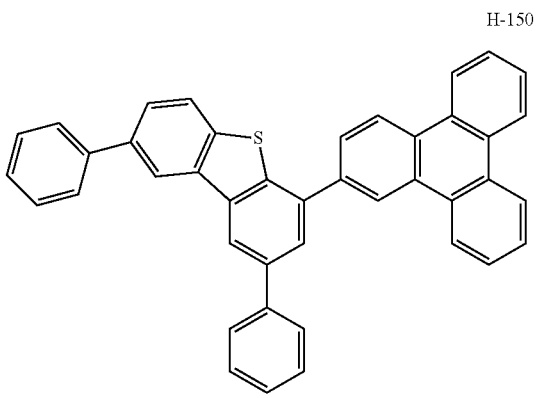
H-151
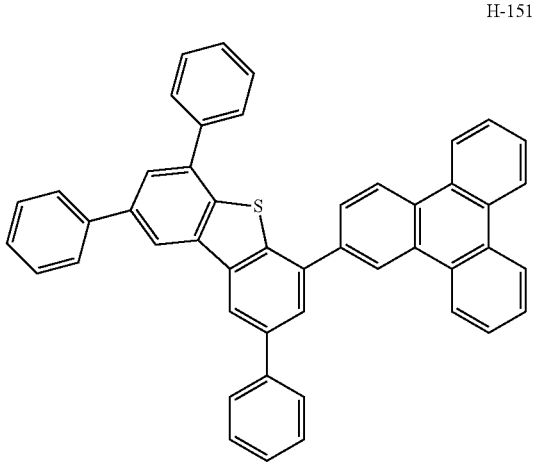
H-152
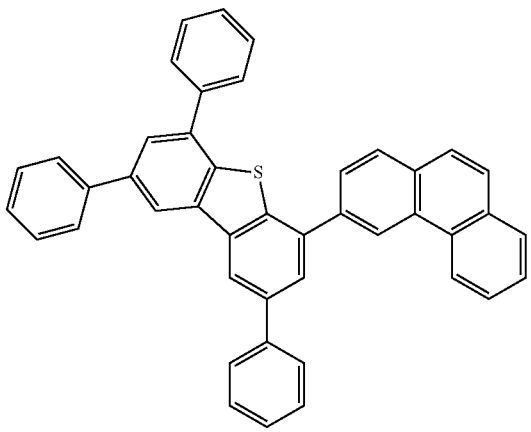

H-153
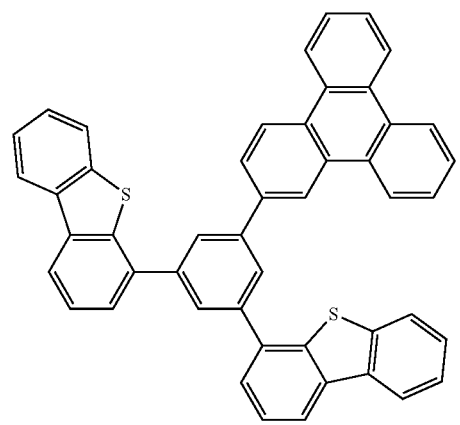
H-154
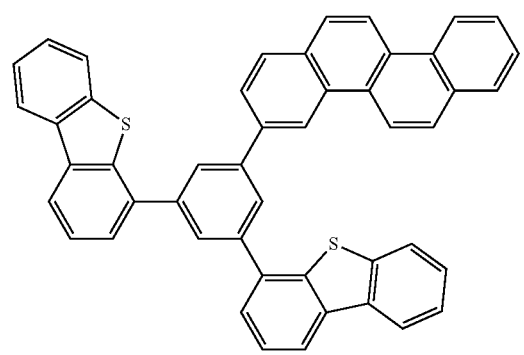
H-155
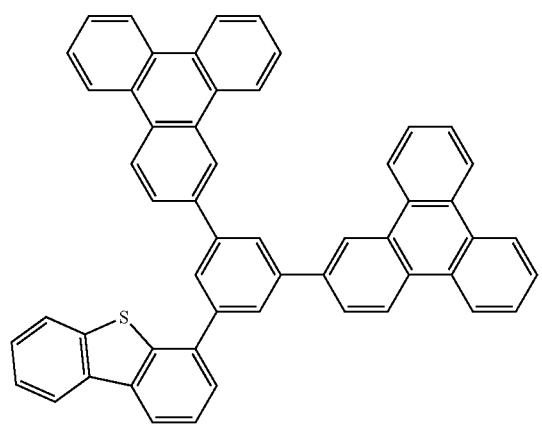
H-156
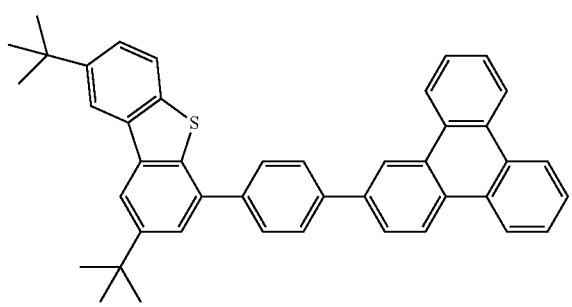
H-157
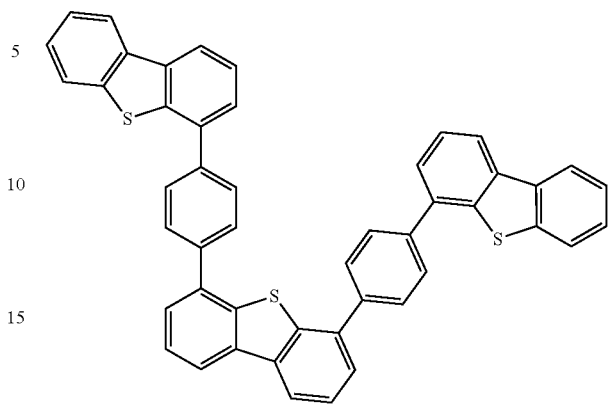
H-158
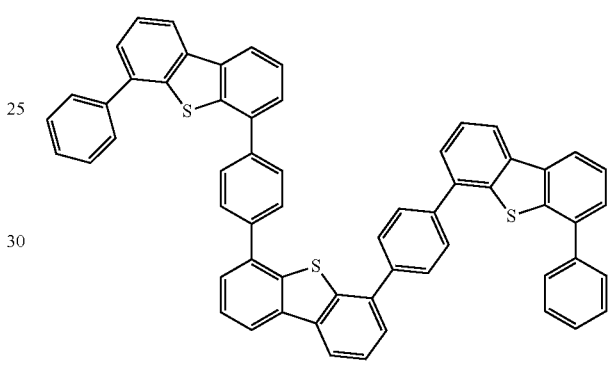
Group 2 Compound
H-201
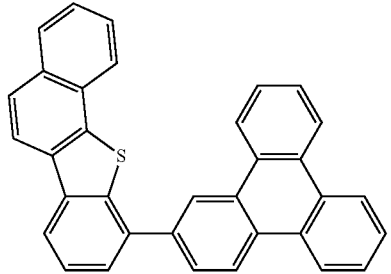
H-202
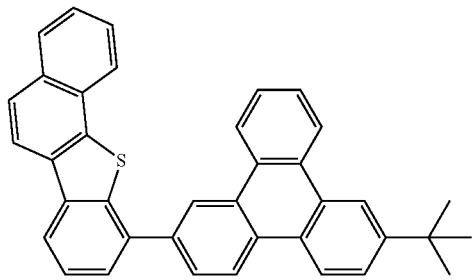

-continued
H-203
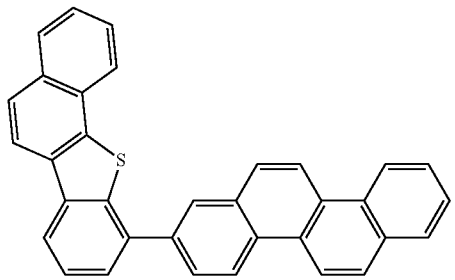
H-204
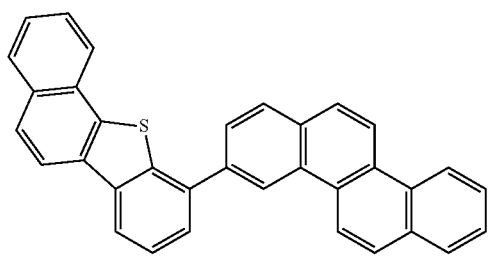
H-205
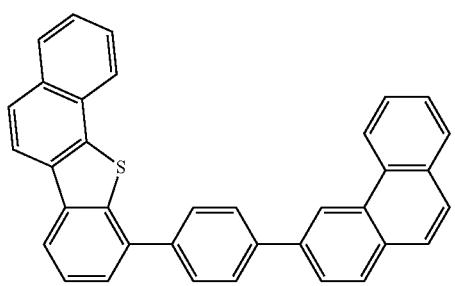
H-206
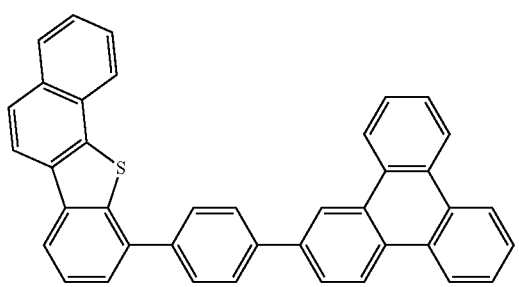
H-207
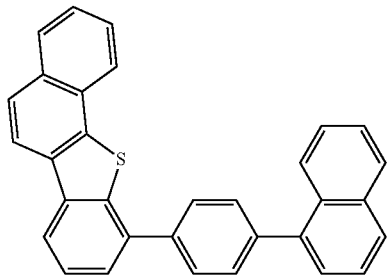
-continued
H-208
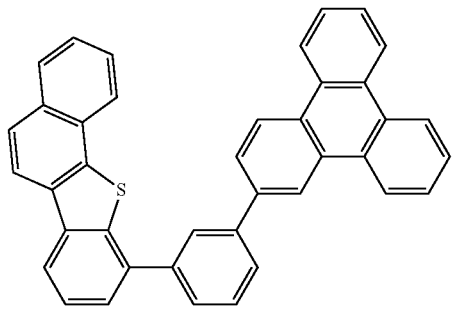
H-209
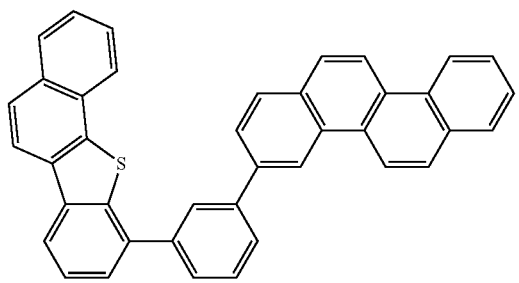
H-210
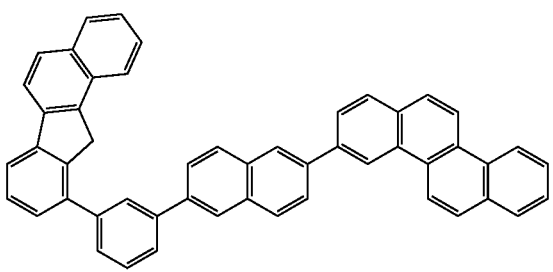
H-211
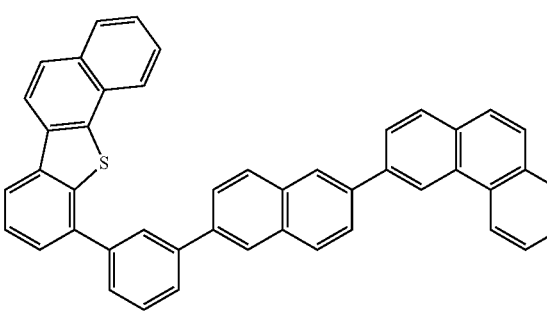
H-212
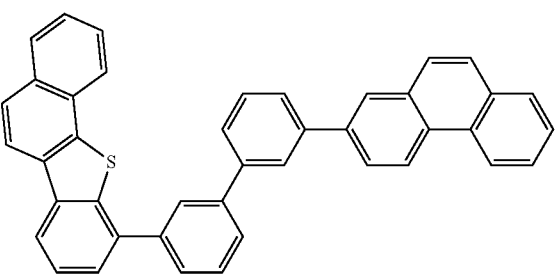

H-213
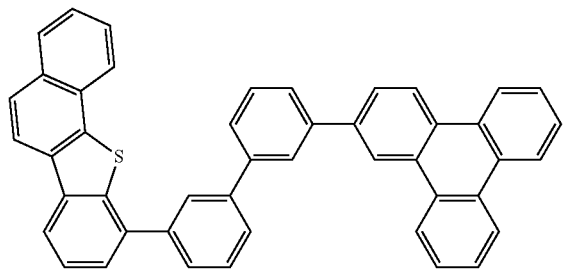
H-214
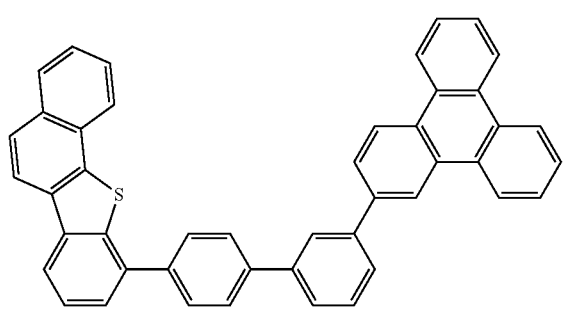
H-215
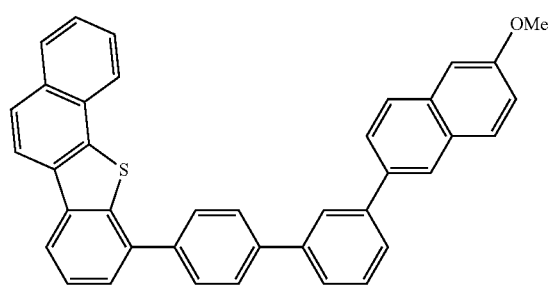
H-216
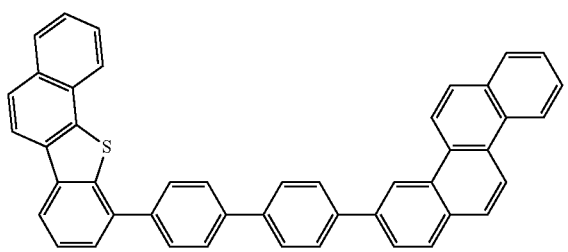
H-217
H-218
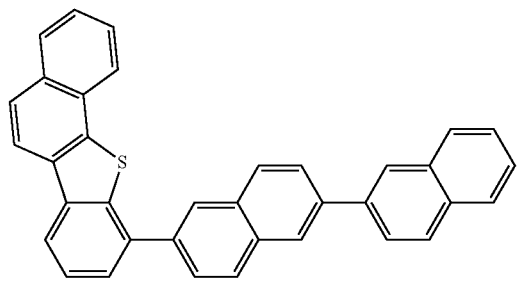
H-219
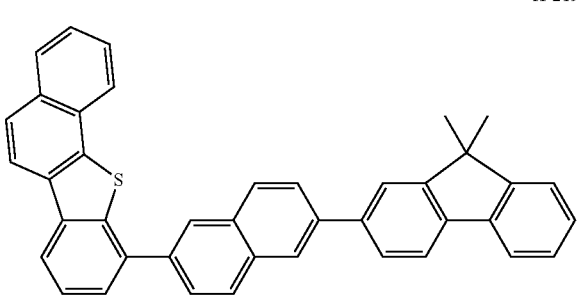
H-220
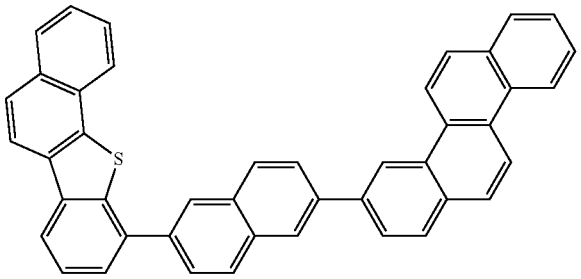
H-221
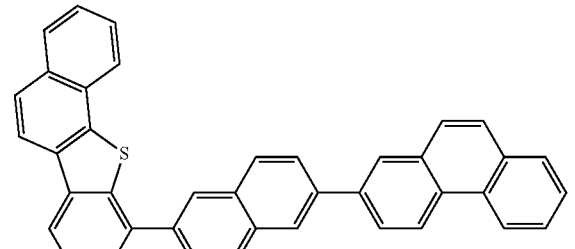
H-222
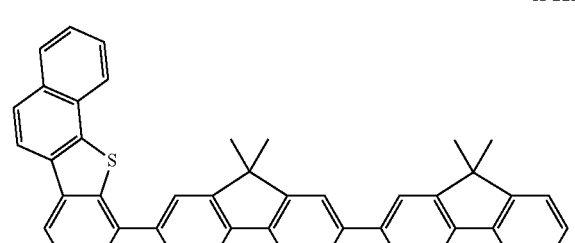

H-223
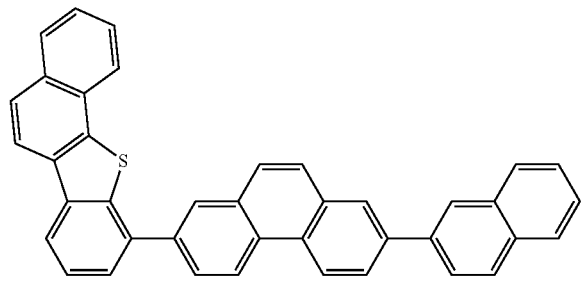
H-228
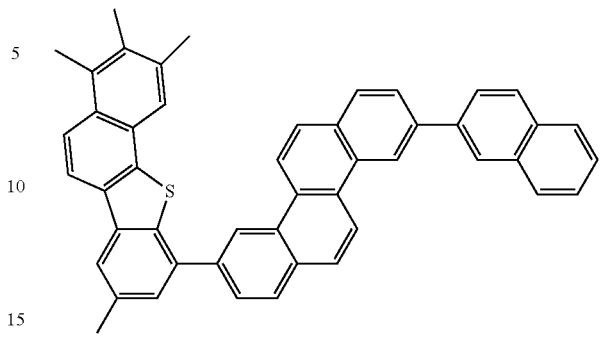
H-224
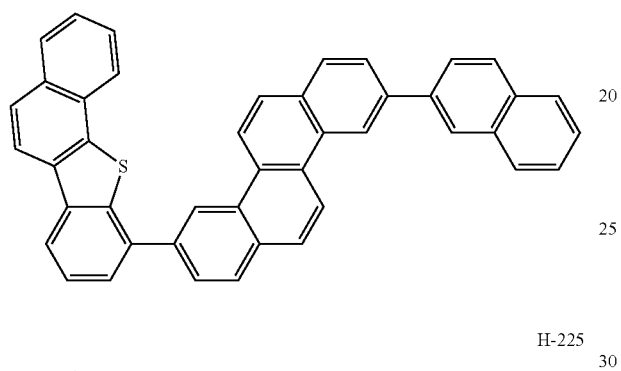
H-229
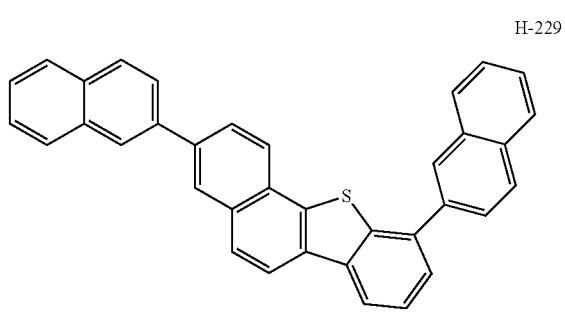
H-225
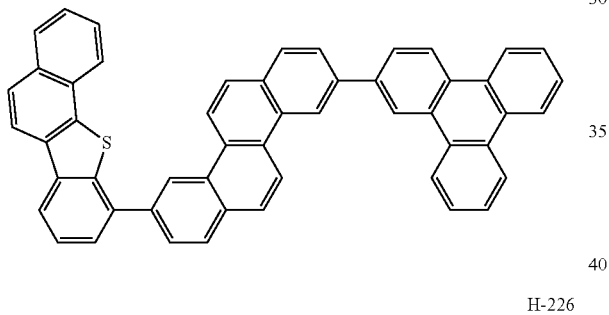
Group 3 Compound
H-226
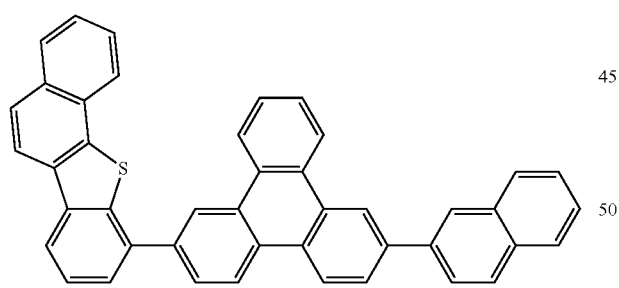
H-301
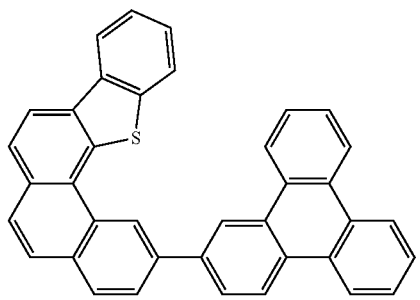
H-227
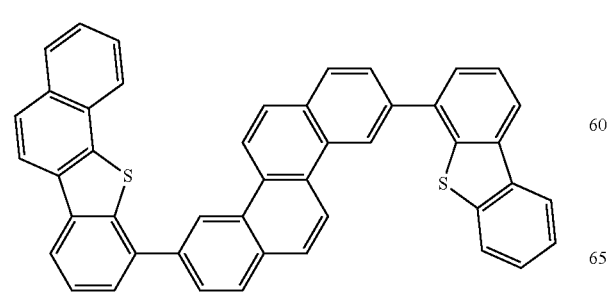
H-302
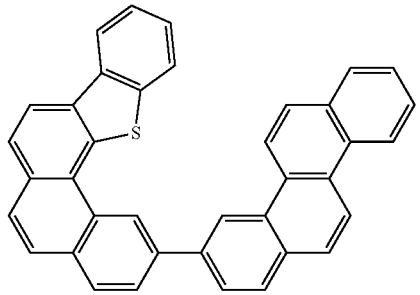

H-303
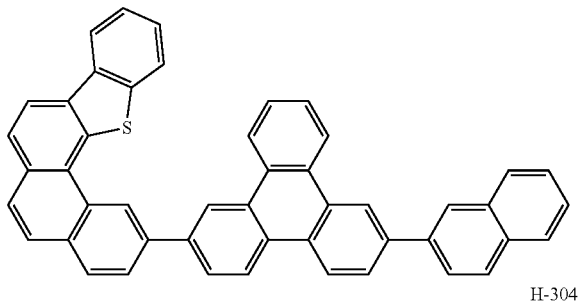
H-304
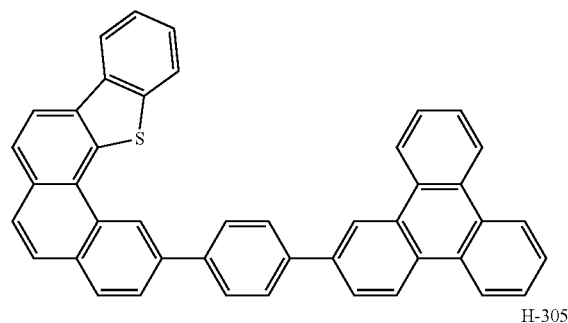
H-305
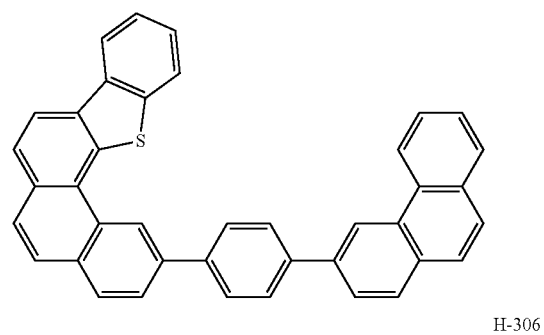
H-306
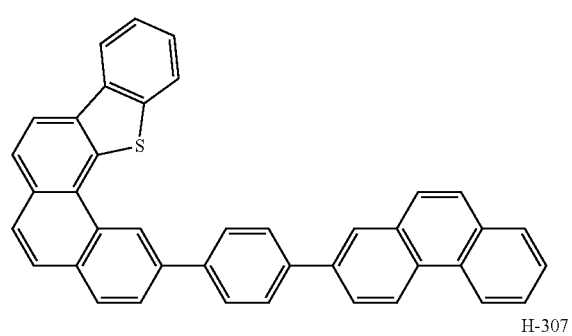
H-307
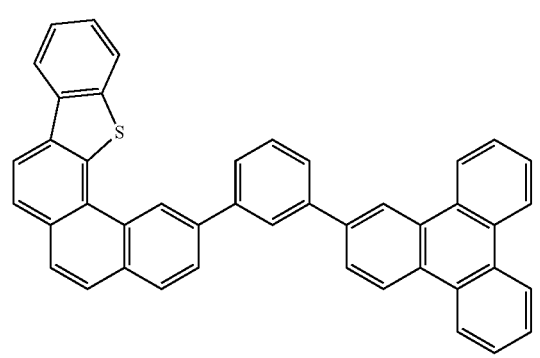
H-308
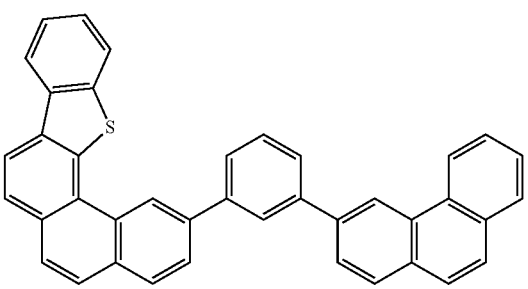
H-309
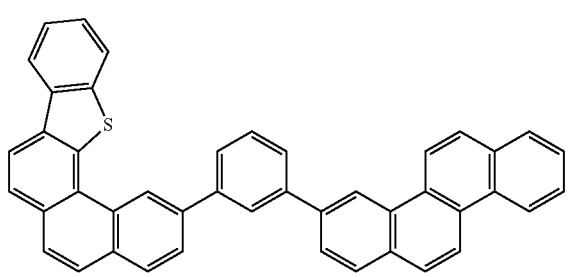
H-310
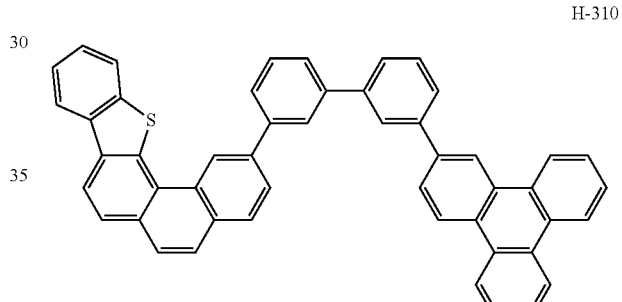
H-311
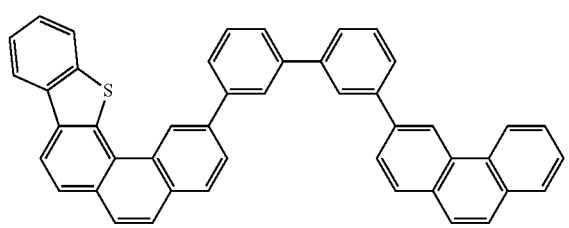
H-312
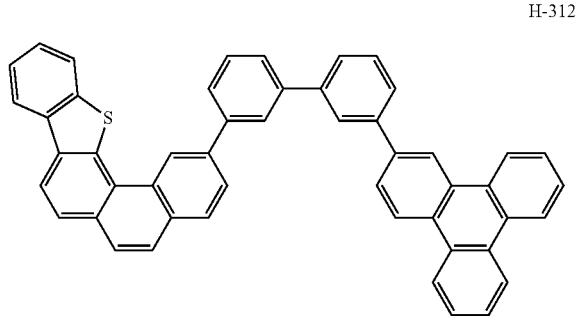

-continued
H-313
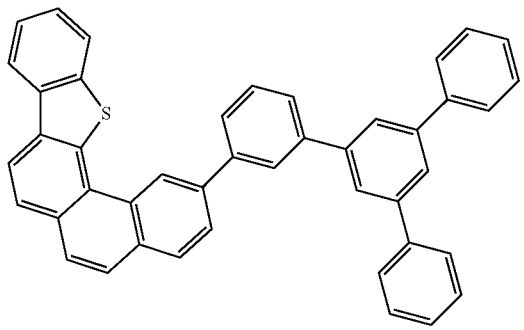
H-314
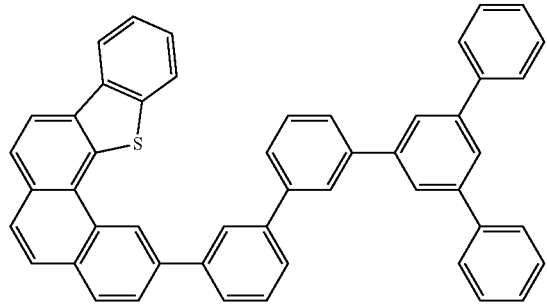
H-315
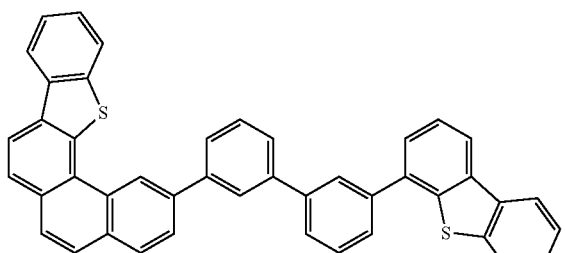
H-316
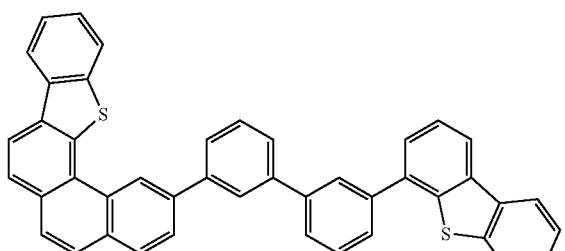
H-317
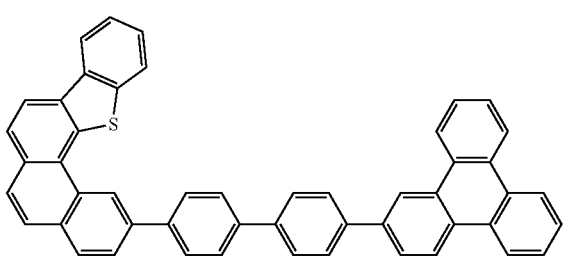
-continued
H-318
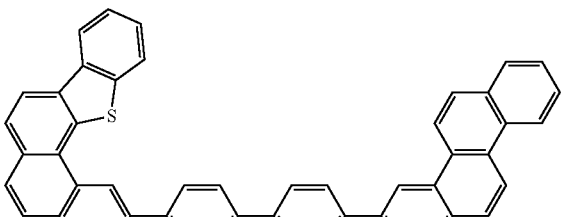
H-319
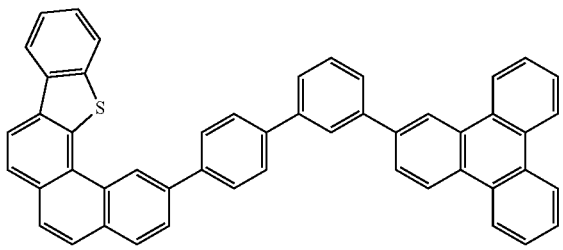
H-320
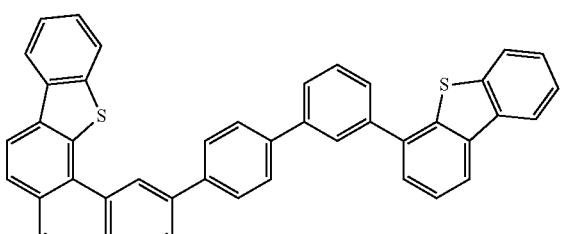
H-321
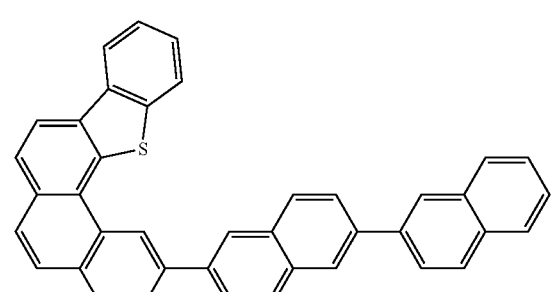
H-322
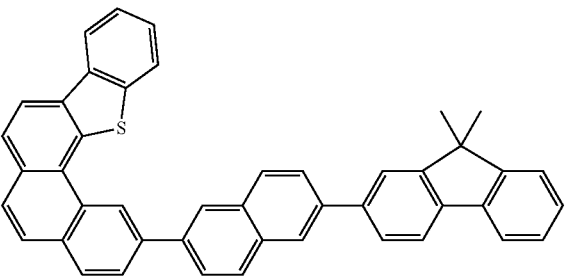

H-323
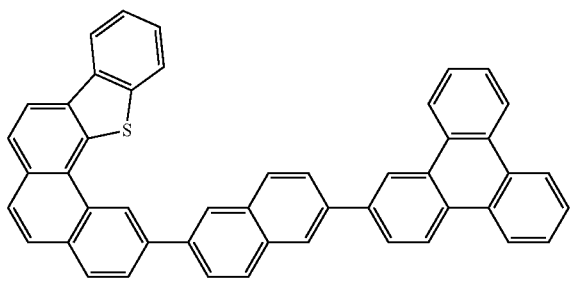
H-324
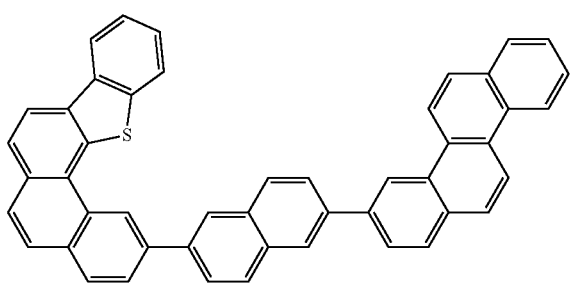
H-325
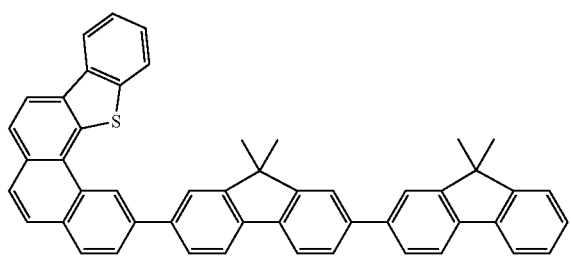
H-326
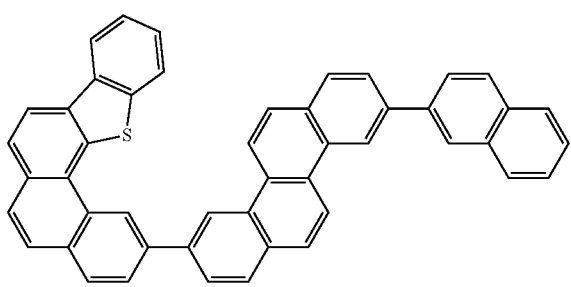
H-327
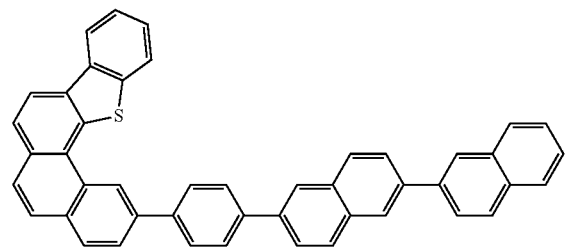
H-328
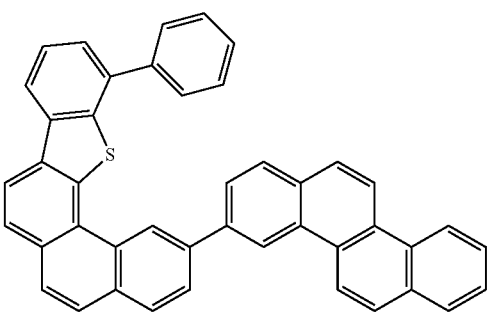
H-329
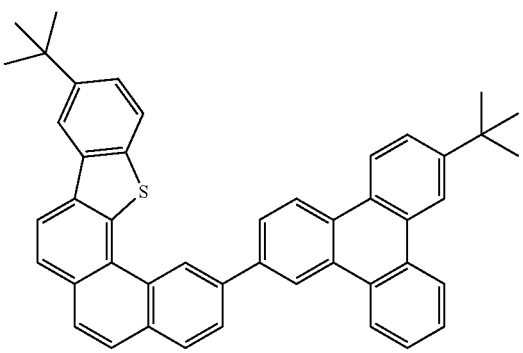
Group 4 Compound
H-401
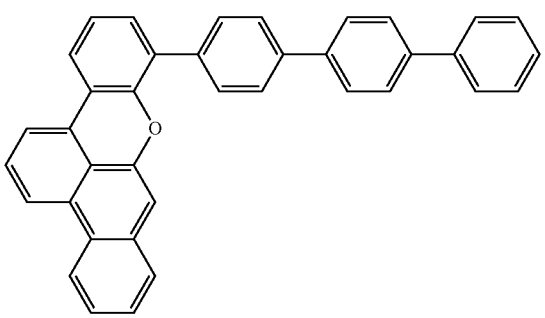
H-402
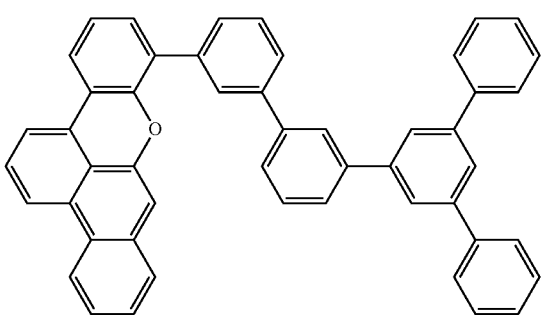

H-403
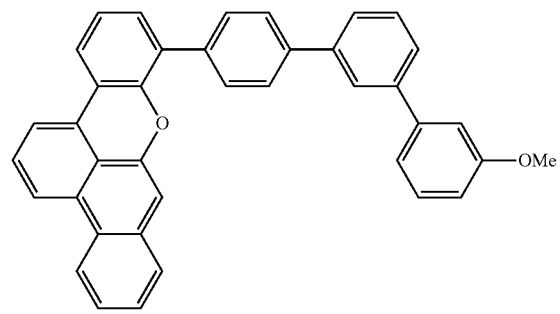
H-404
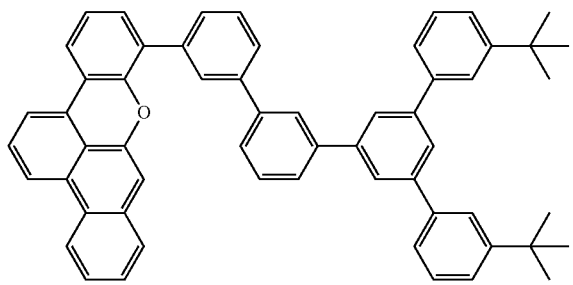
H-405
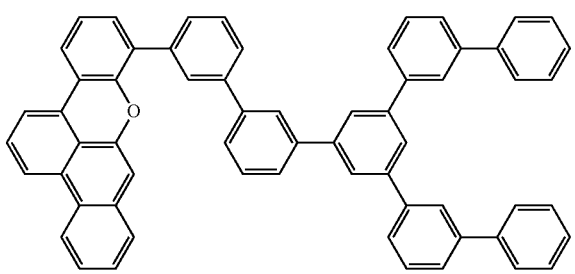
H-406
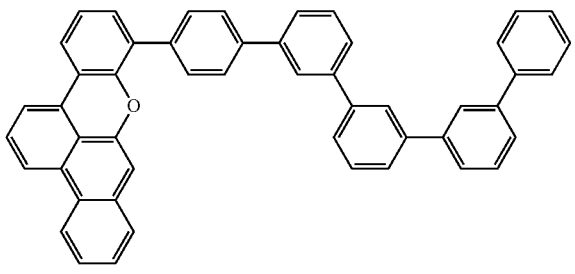
H-407
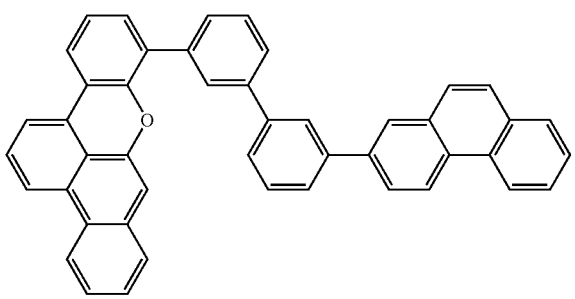
H-408
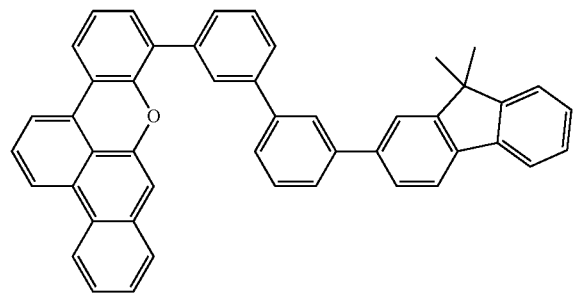
H-409
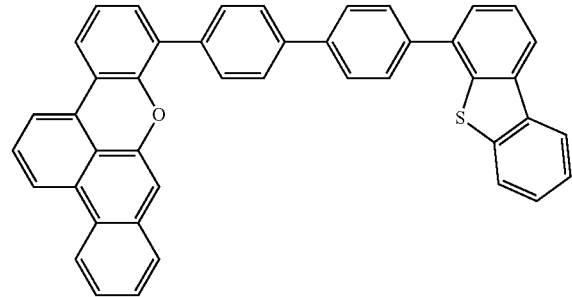
H-410
H-411
H-412
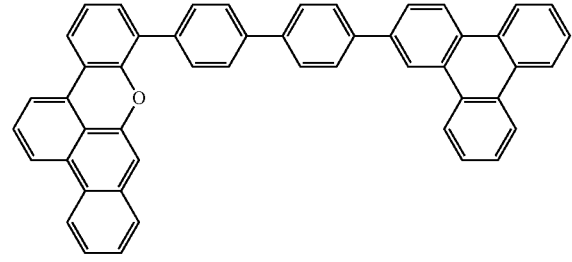

H-413
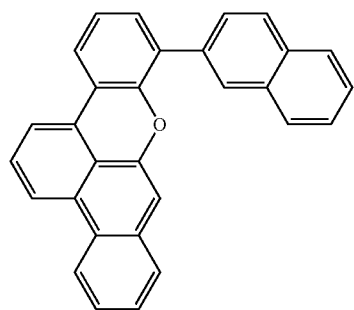
H-414
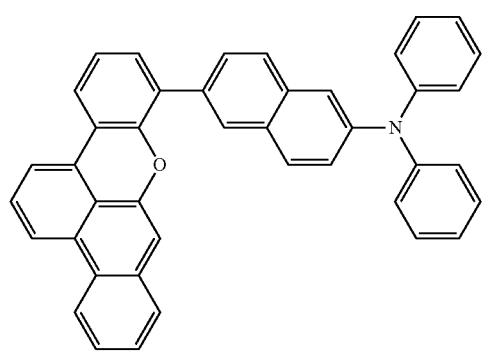
H-415
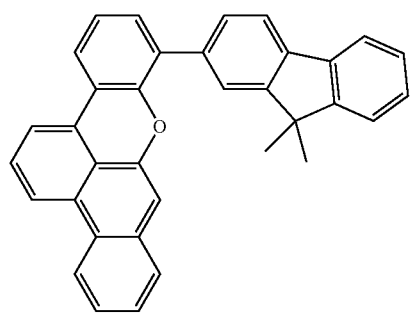
H-416
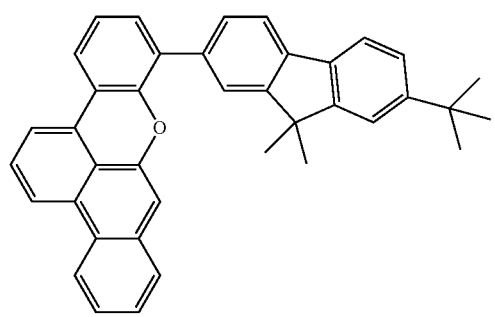
H-417
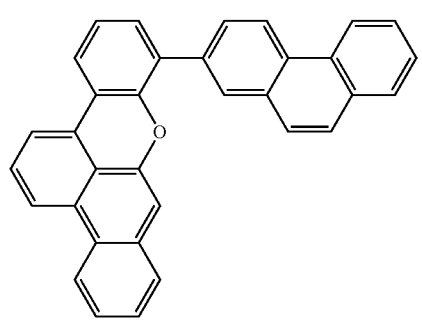
H-418
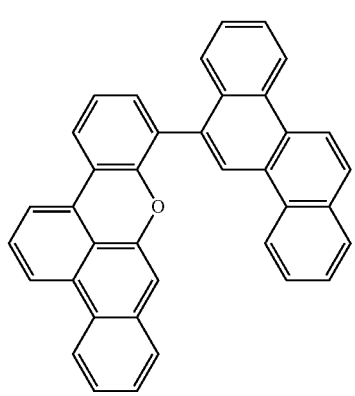
H-419
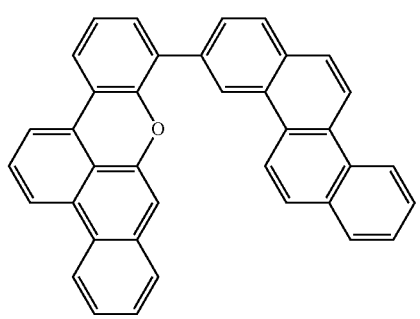
H-420
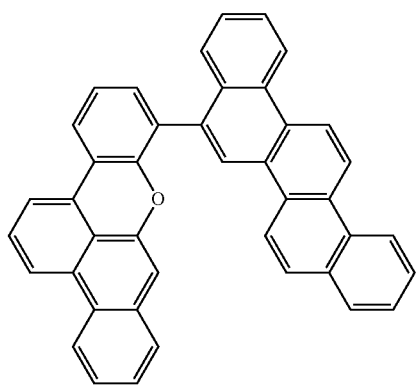
H-421
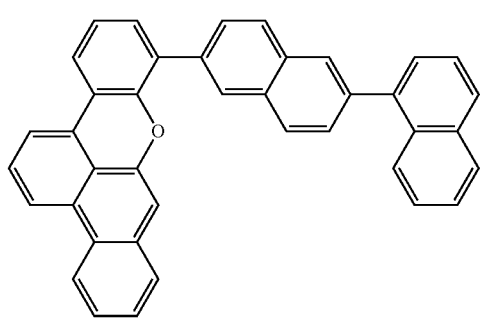

H-422
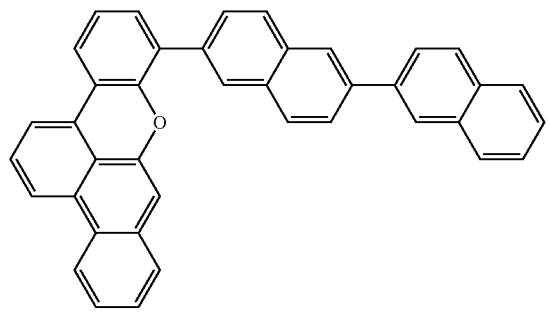
H-423
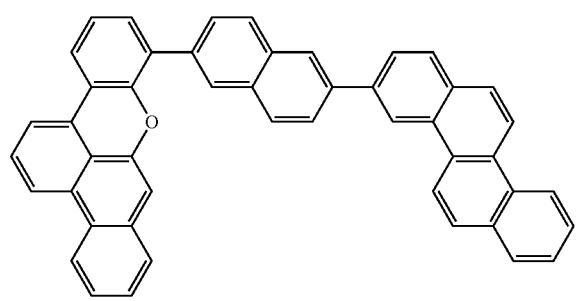
H-424
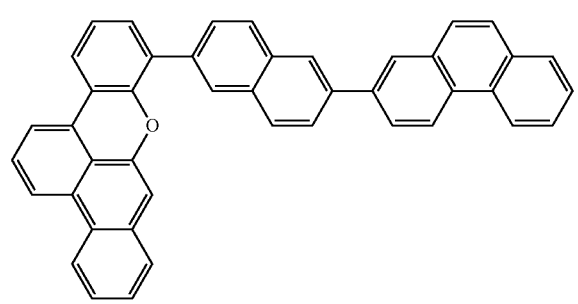
H-425
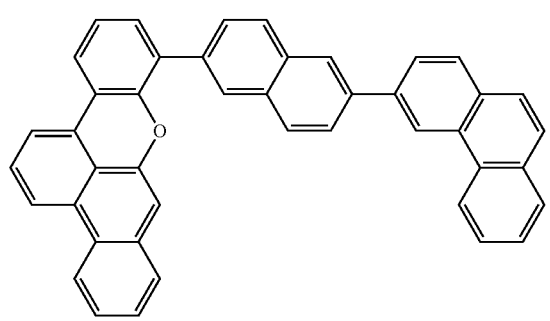
H-426
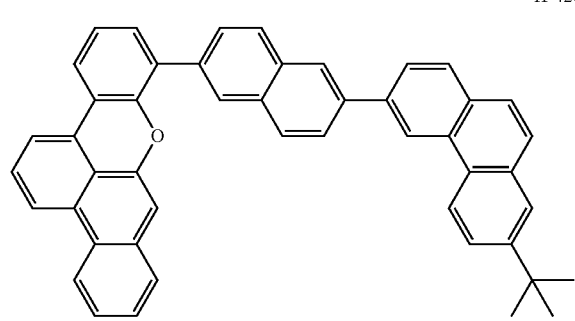
H-427
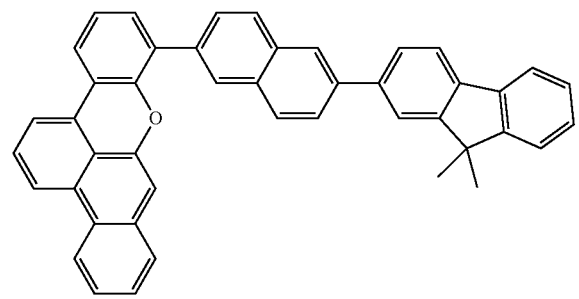
H-428
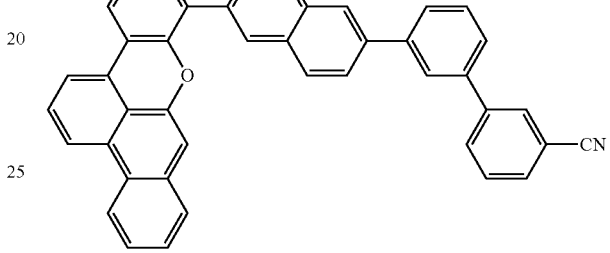
H-429
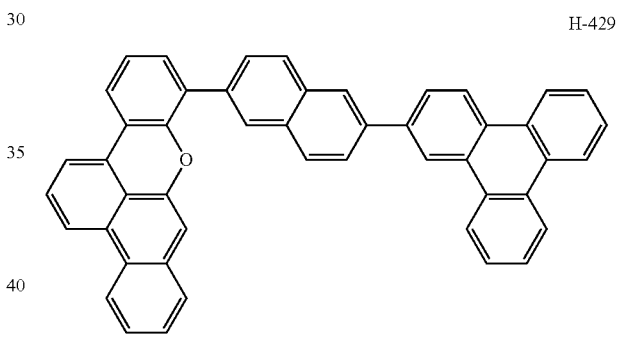
H-430
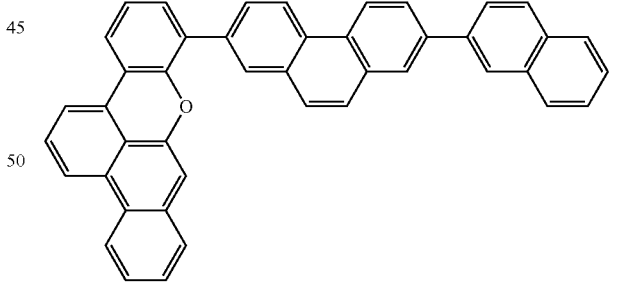
H-431
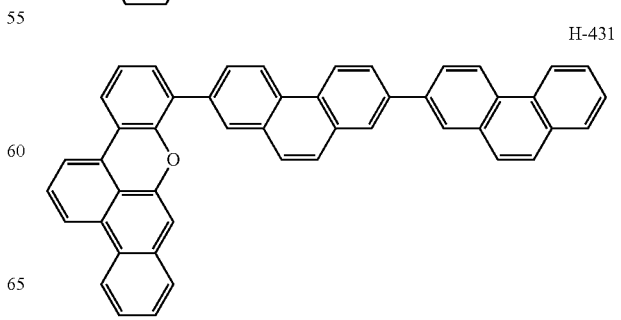

-continued
H-432
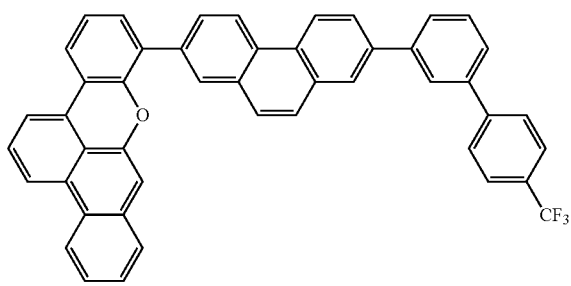
H-433
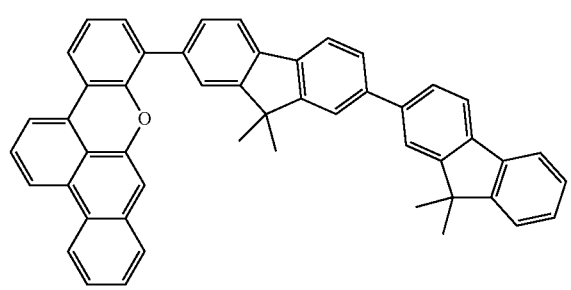
H-434
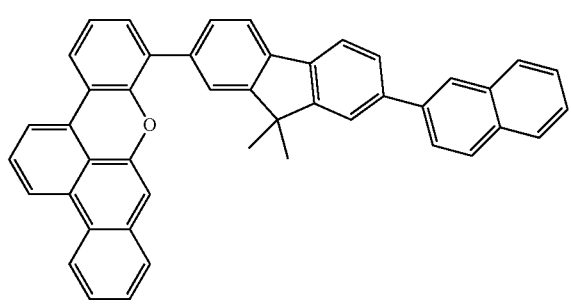
H-435
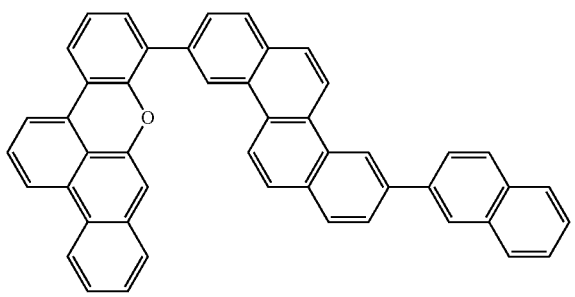
H-436
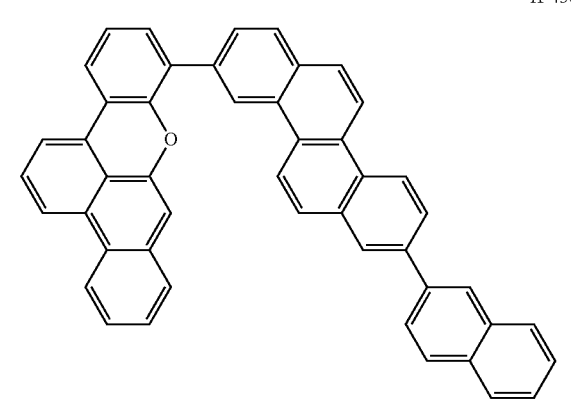
-continued
H-437
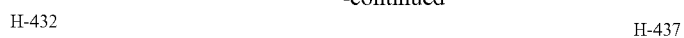
H-438
H-439
H-440
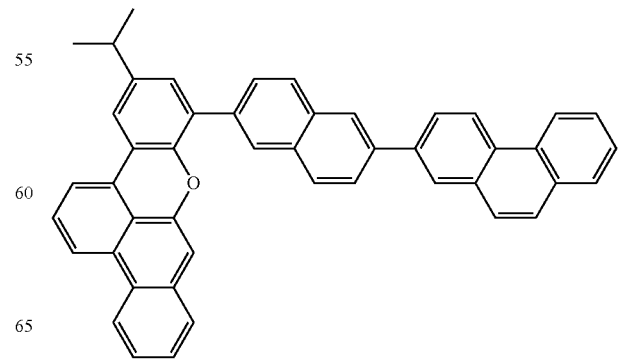

H-441
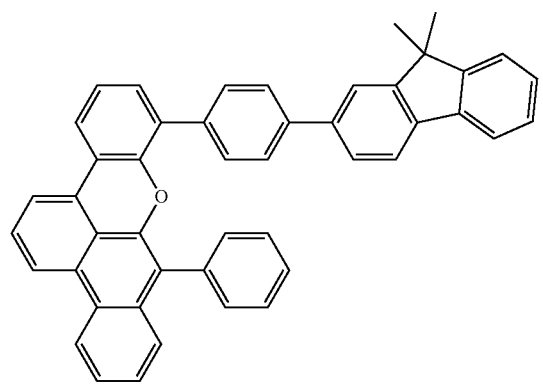
H-443
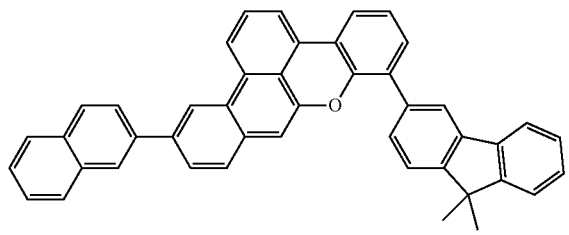
H-442
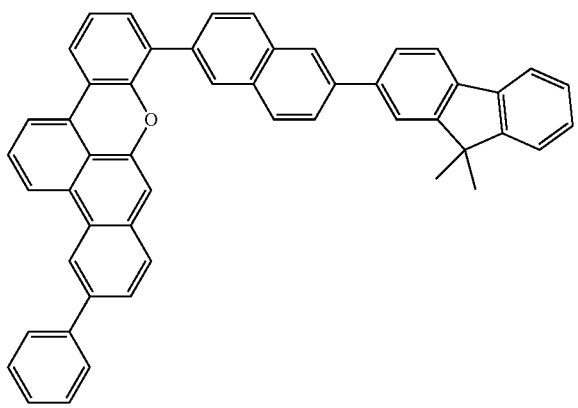
H-444
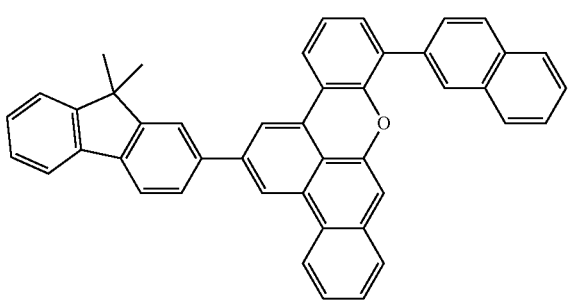
Group 5 Compound
H-501
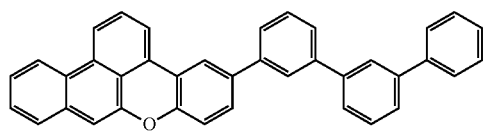
H-502
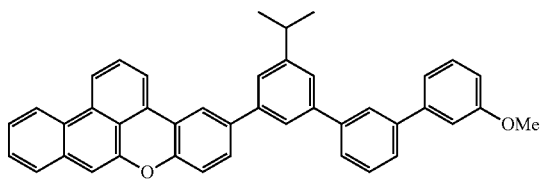
H-503
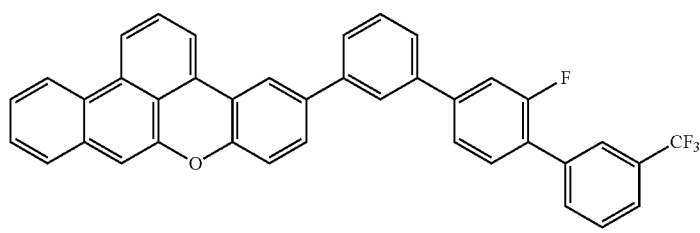
H-504
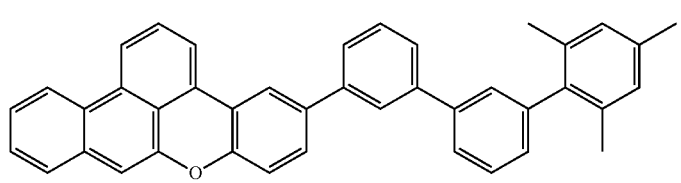

-continued
H-505
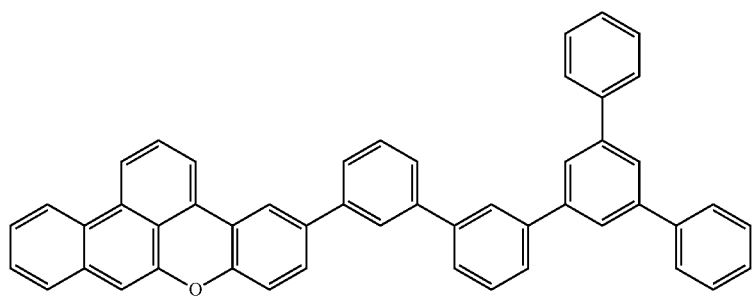
H-506
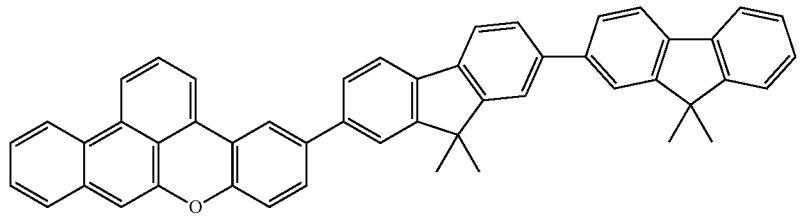
H-507
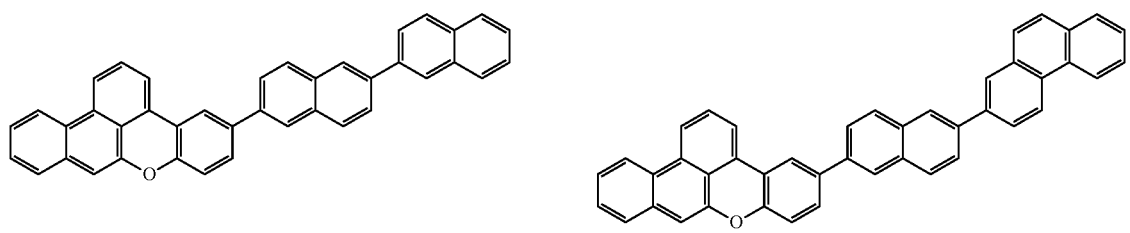
H-508
H-509
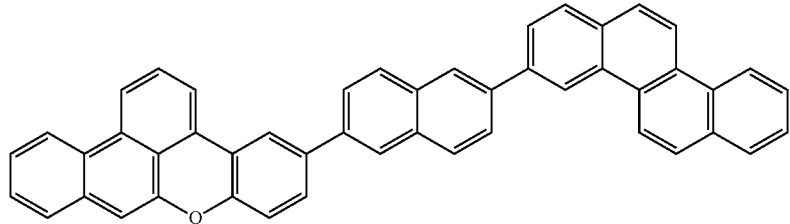
H-510
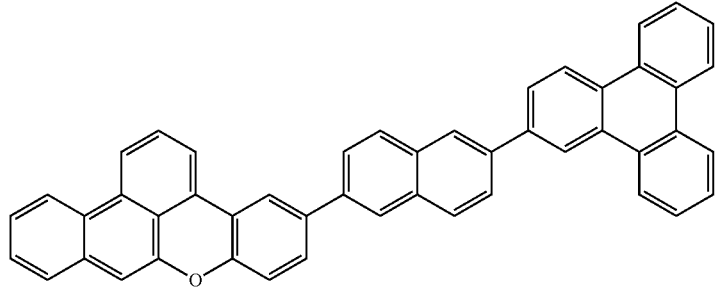
H-511
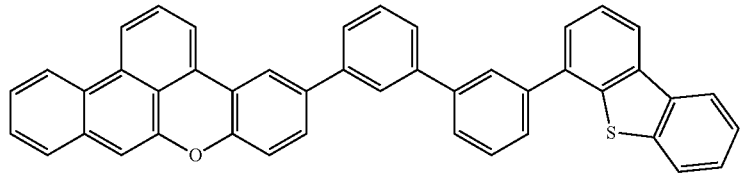

-continued
H-512
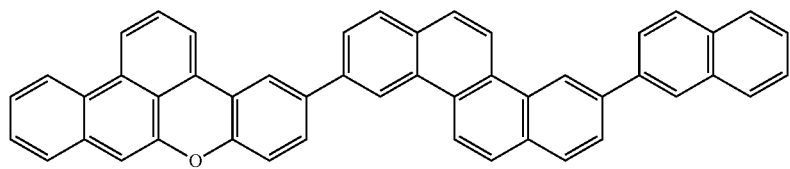
H-513
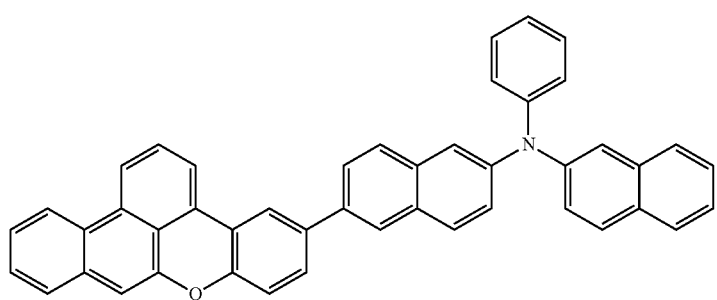
H-514
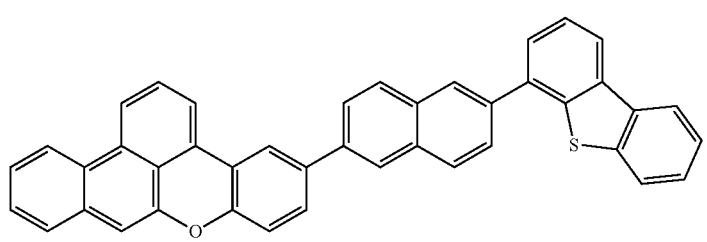
H-515
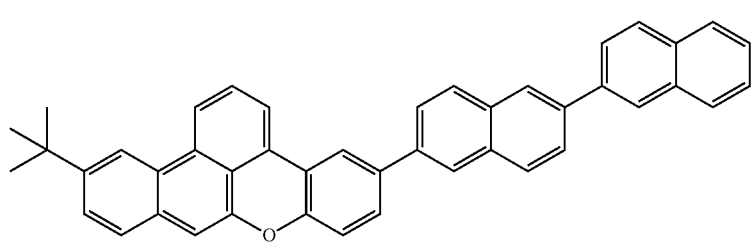
H-516
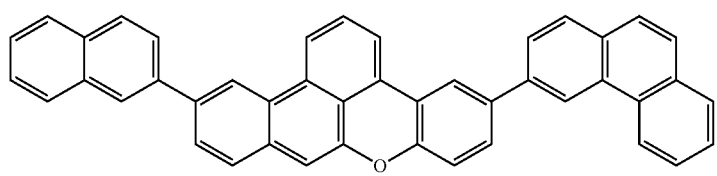
H-517
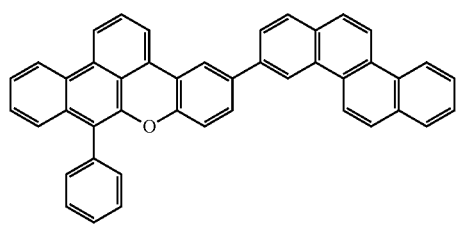
H-518
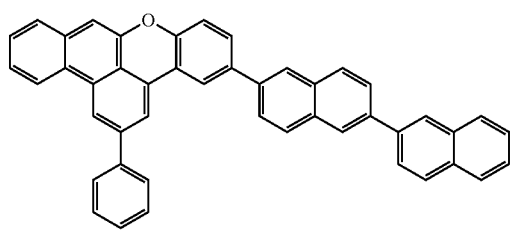

Group 6 Compound
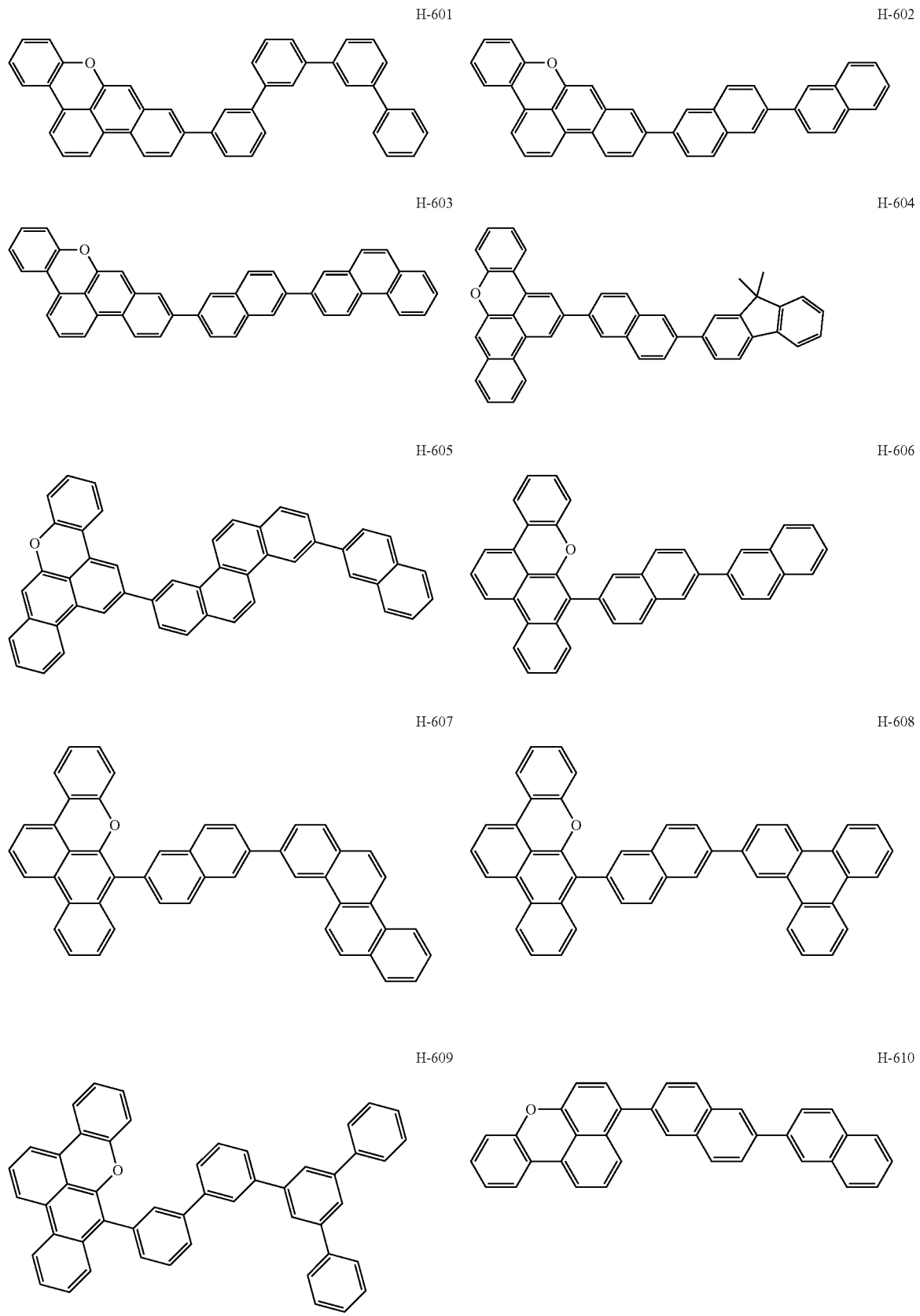

-continued
H-611
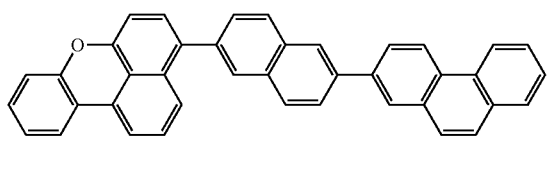
H-612
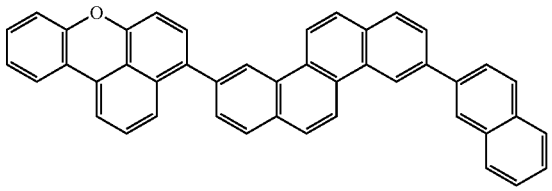
H-613
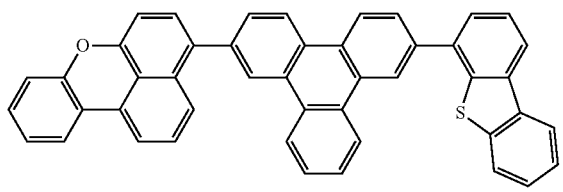
H-614
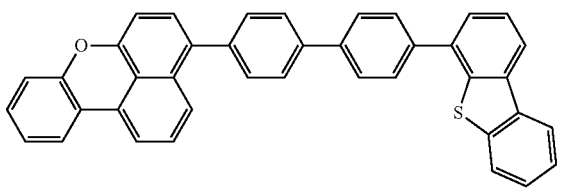
H-615
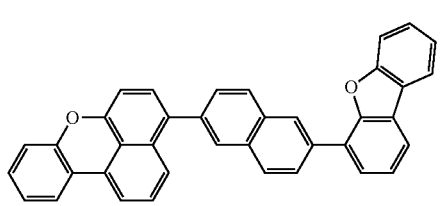
H-616
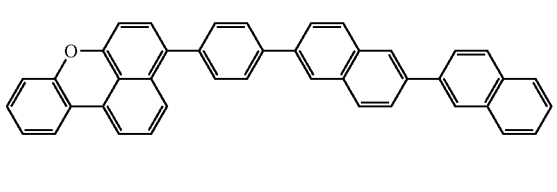
H-617
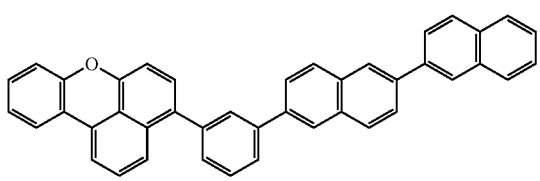
H-618
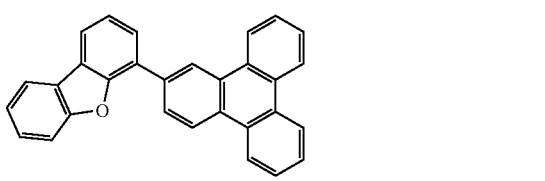
H-619
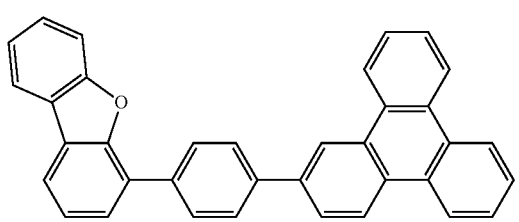
H-620
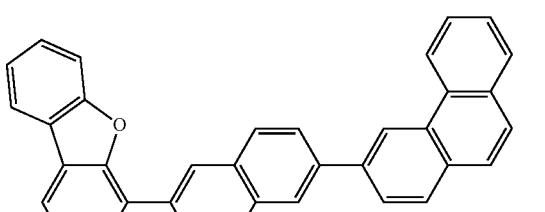
H-621
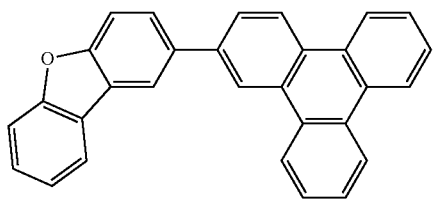
H-622
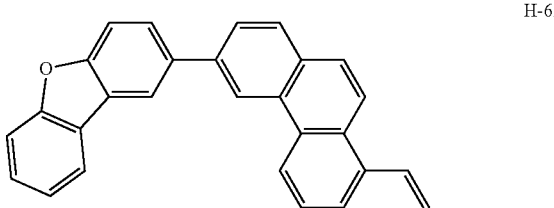
H-623
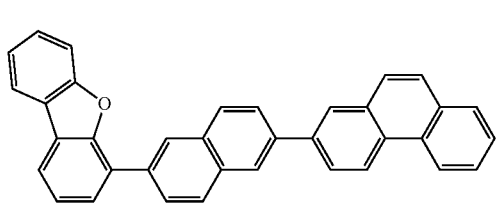
H-624
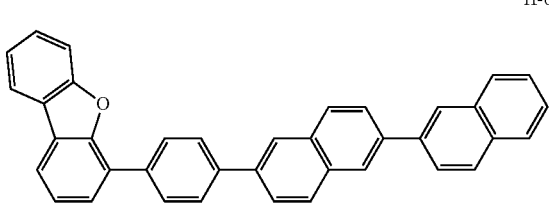

-continued
H-625
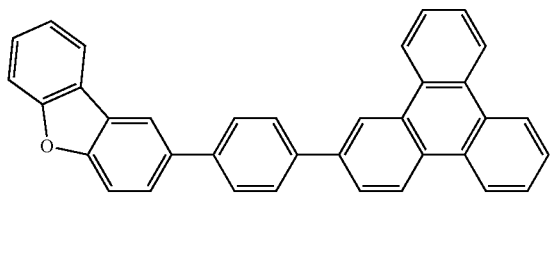
H-626
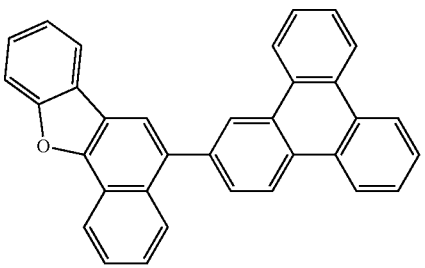
H-627
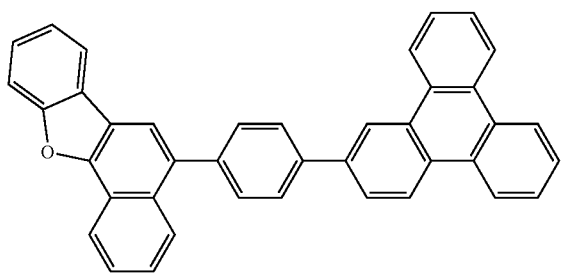
H-628
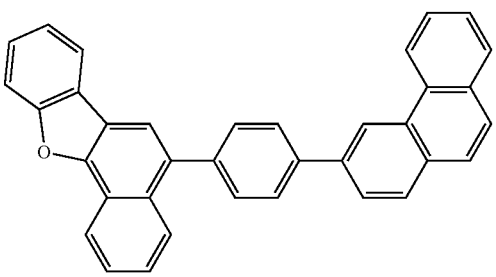
H-629
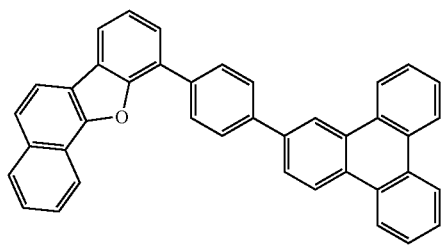
H-630
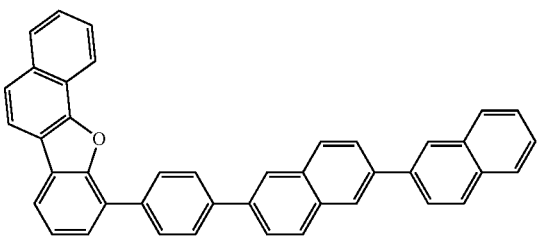
H-631
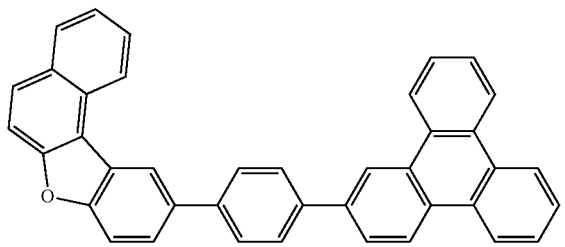
H-632
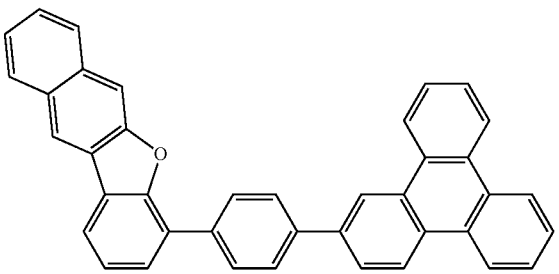
H-634
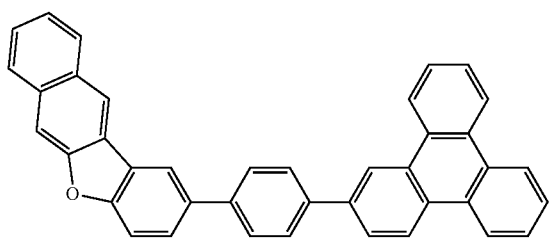
H-635
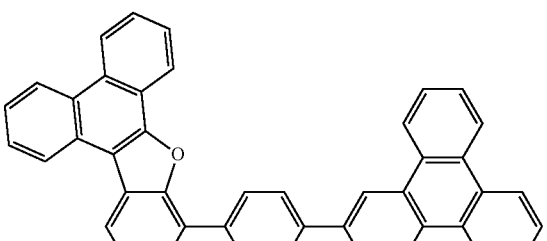

-continued
H-636
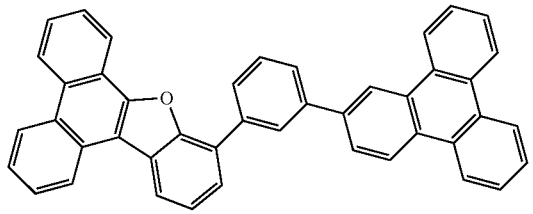
H-637
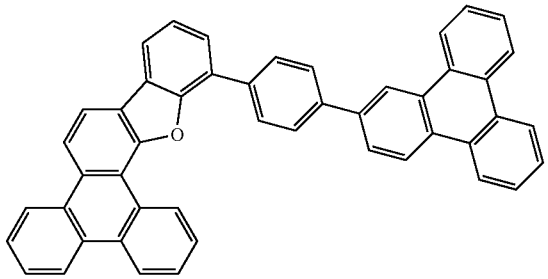
H-638
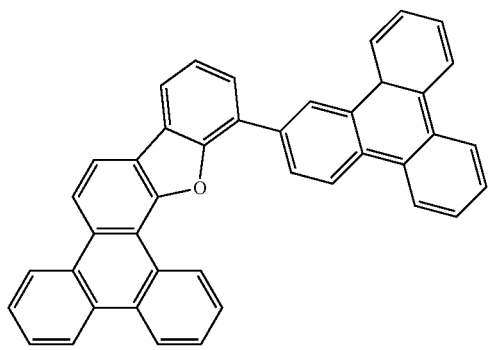
H-639
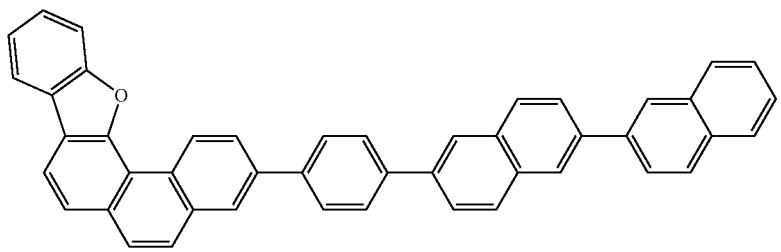
H-640
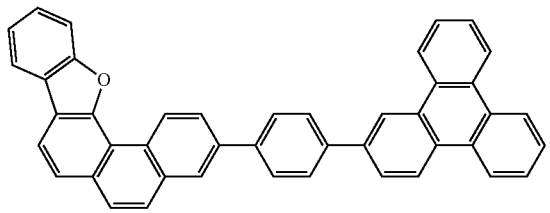
H-641
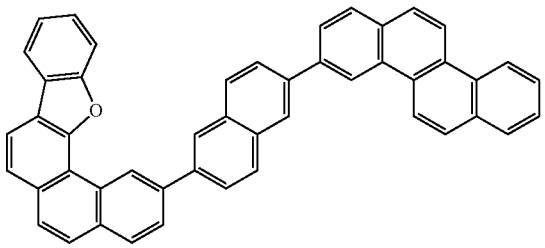
H-642
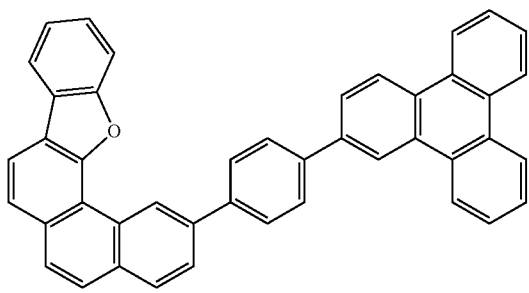

Group 7 Compound
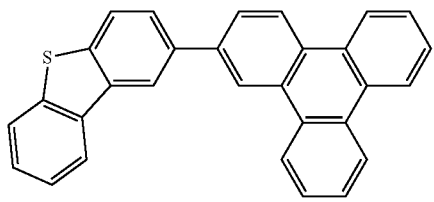 H-701
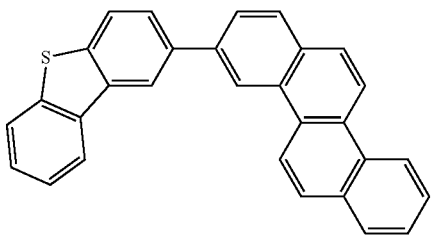 H-702
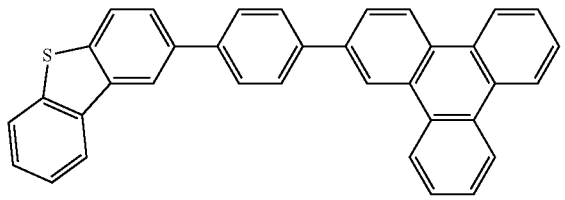 H-703
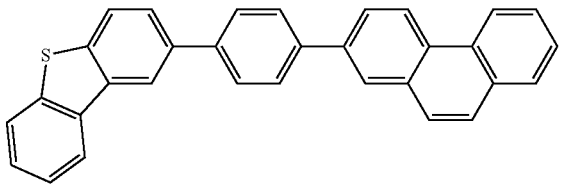 H-704
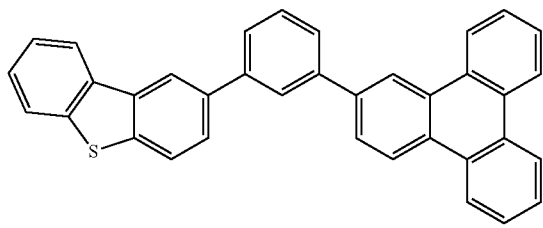 H-705
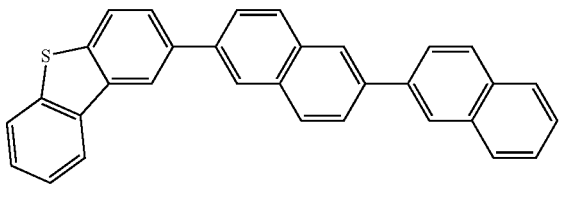 H-706
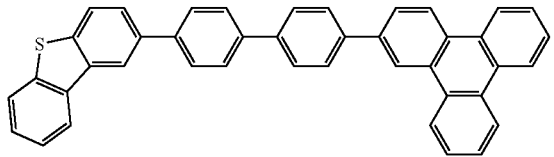 H-707
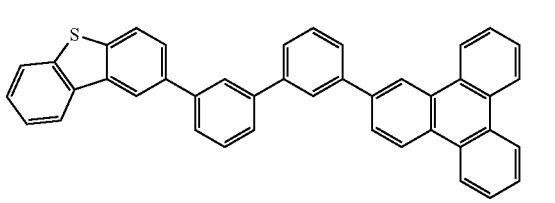 H-708
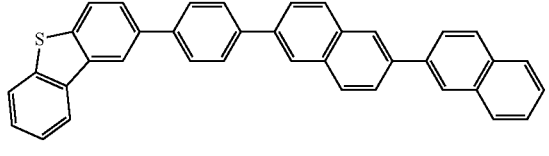 H-709
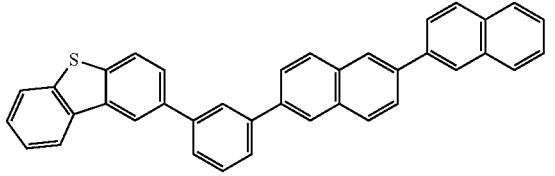 H-710
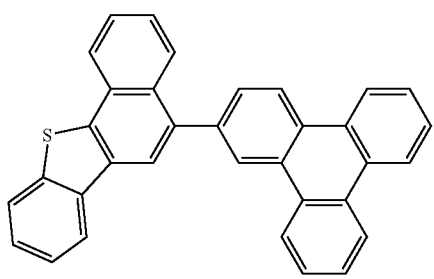 H-711
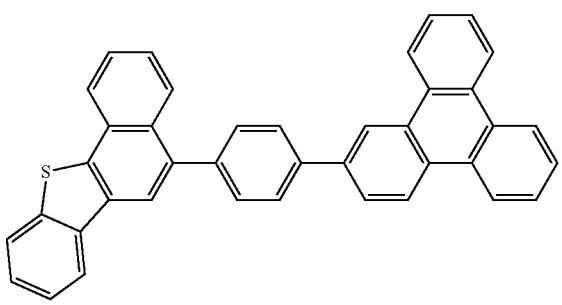 H-712

-continued
H-713
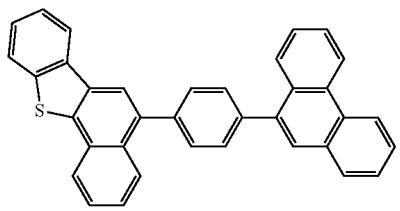
H-714
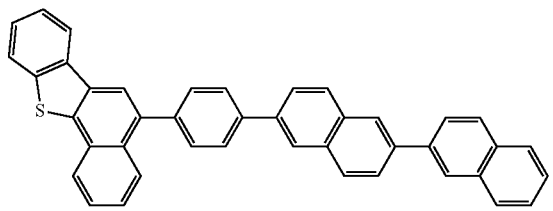
H-715
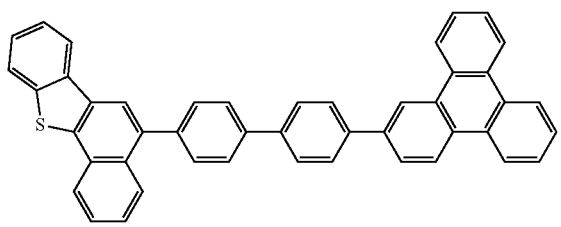
H-716
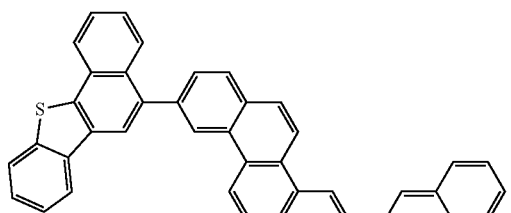
H-717
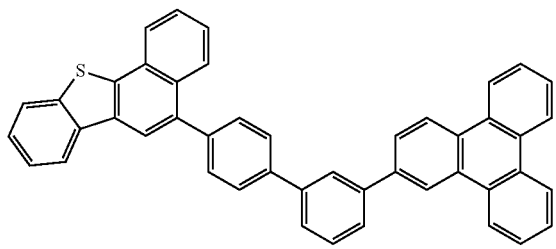
H-718
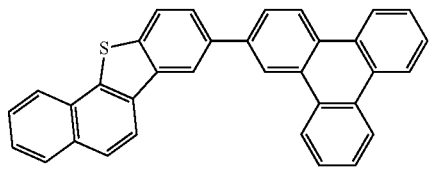
H-719
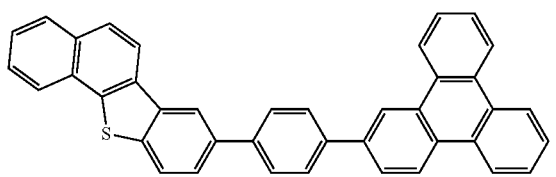
H-720
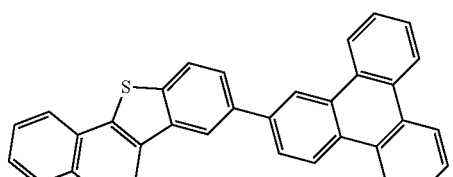
H-721
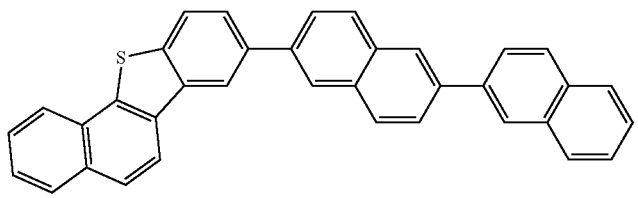
H-722
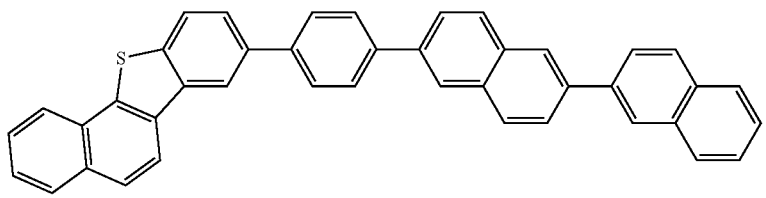
H-723
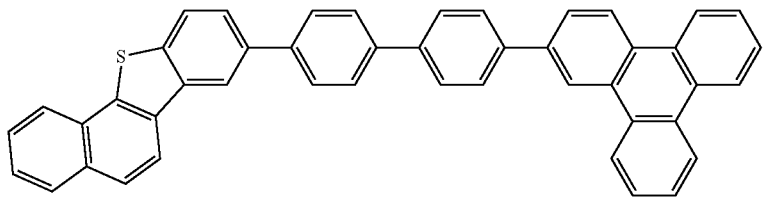

-continued
H-724
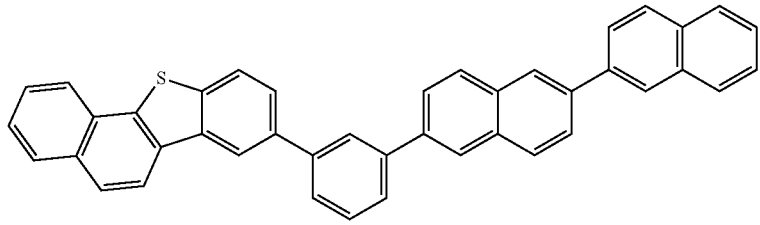
H-725
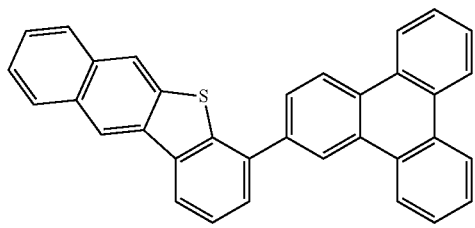
H-726
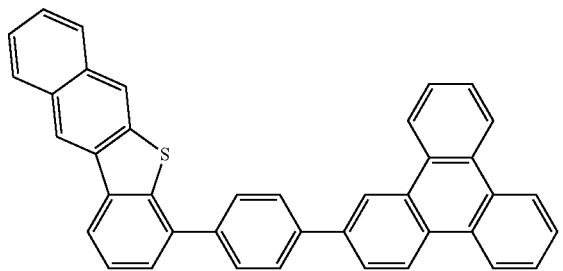
H-727
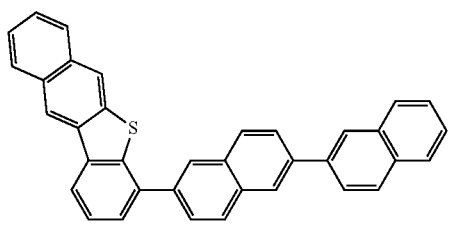
H-728
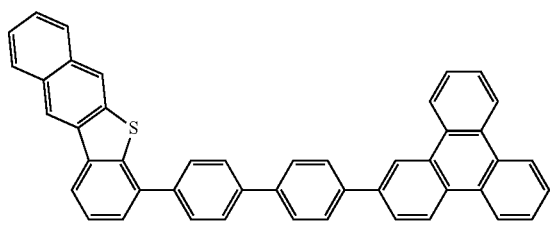
H-729
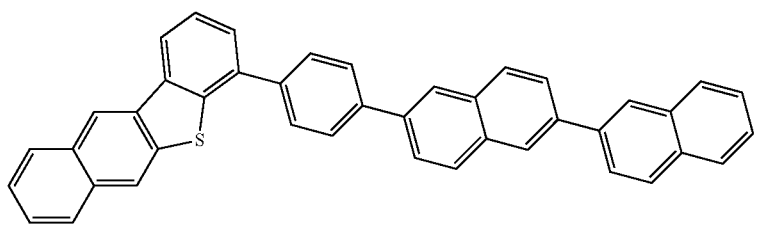
H-730
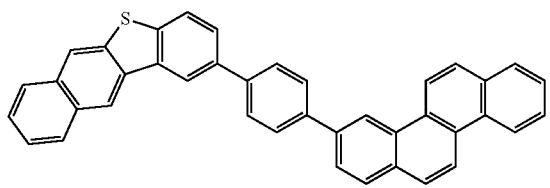
H-731
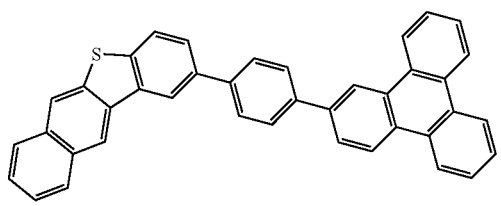
H-732
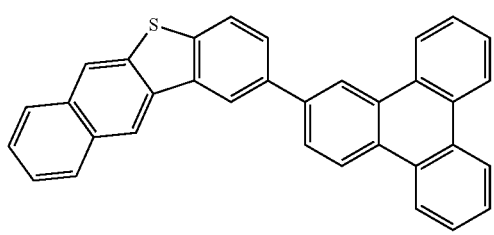
H-733
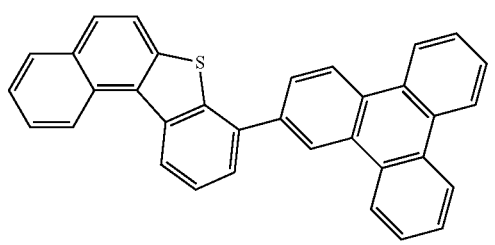

-continued
H-734
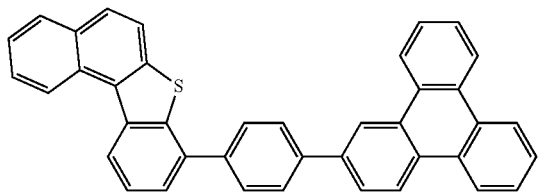
H-735
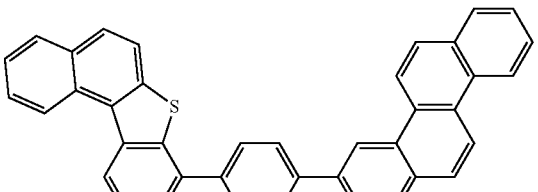
H-736
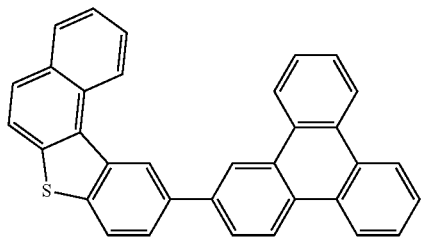
H-737
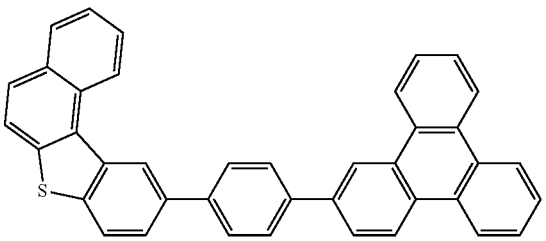
H-738
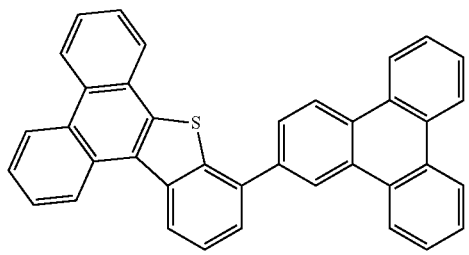
H-739
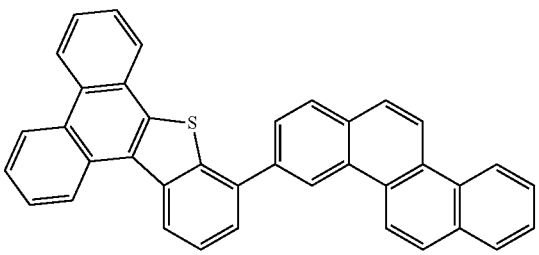
H-740
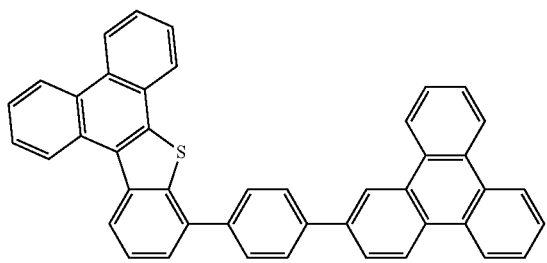
H-741
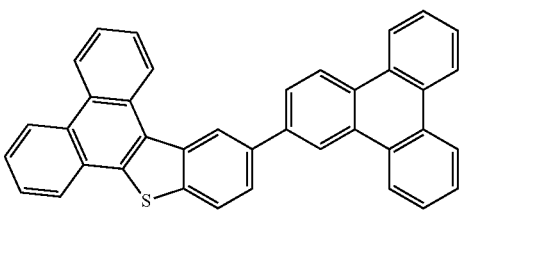
H-742
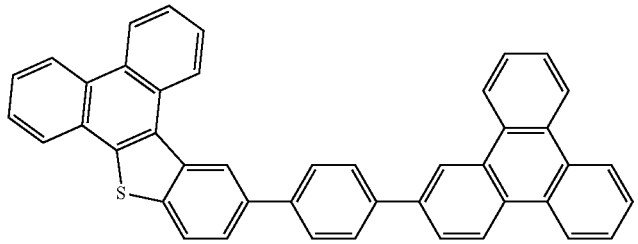
H-743
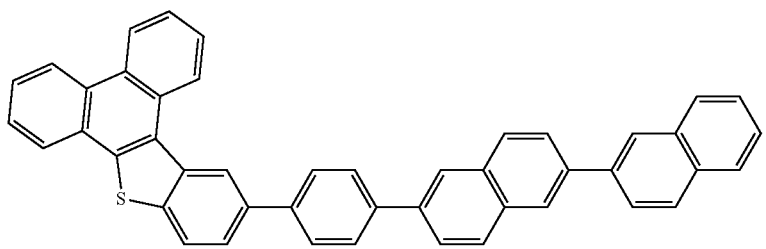

H-744
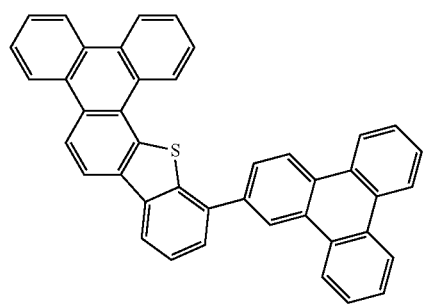
H-745
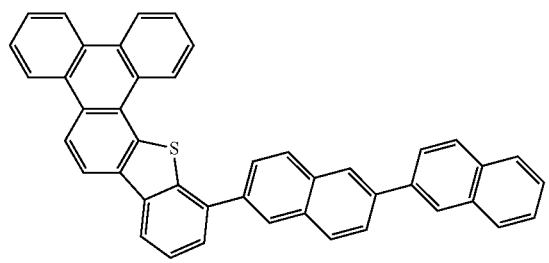
H-746
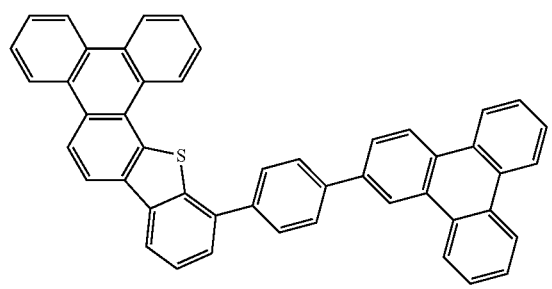
H-747
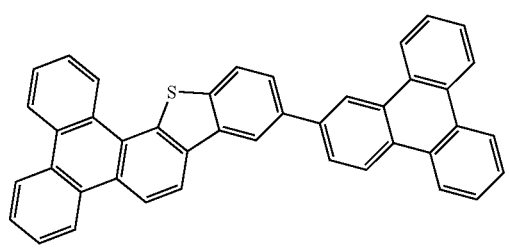
H-748
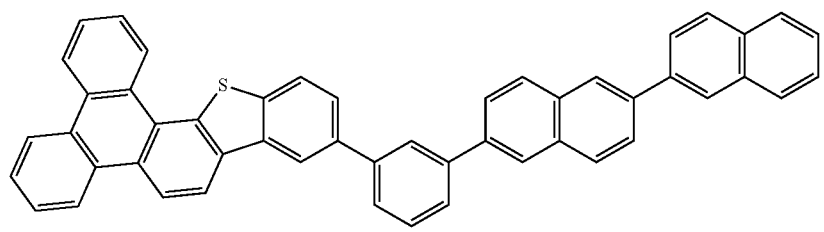
Group 8 Compound
H-801
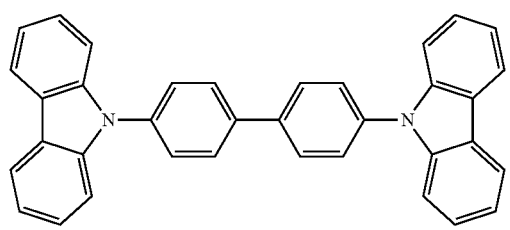
H-802
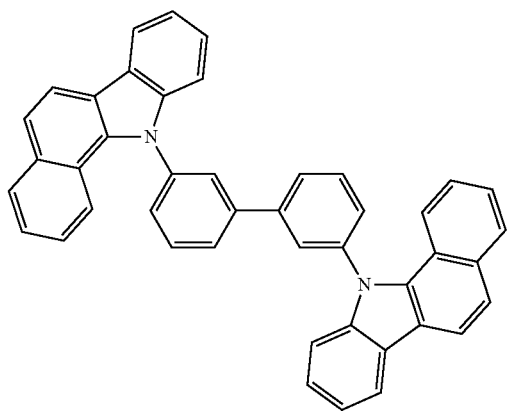

-continued
H-803
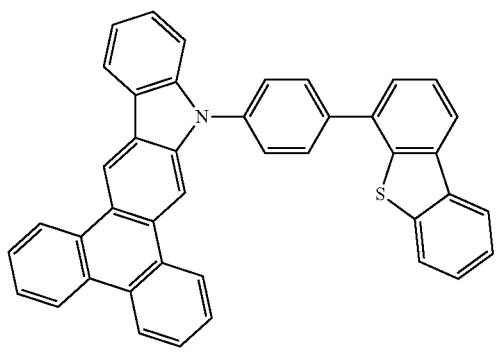
H-804
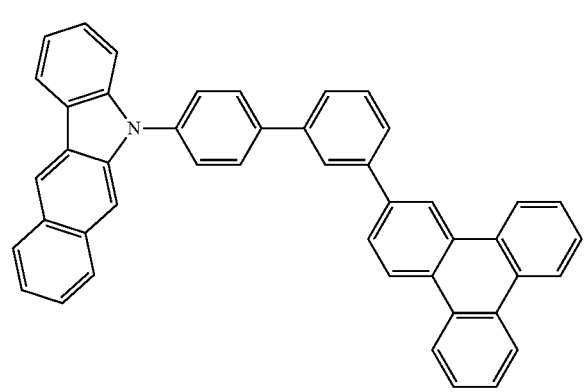
-continued
H-805
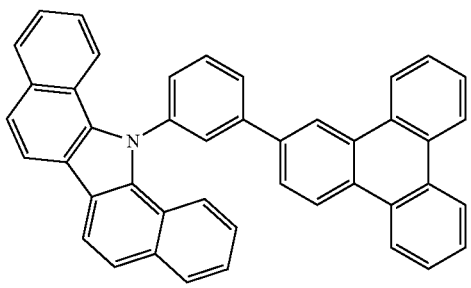
H-806
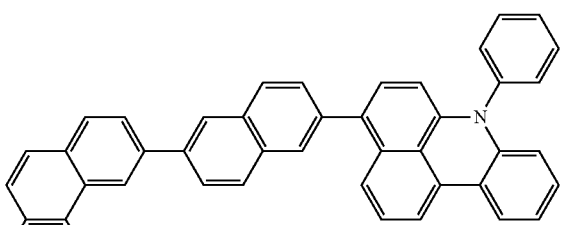
Group 9 Compound
H-901
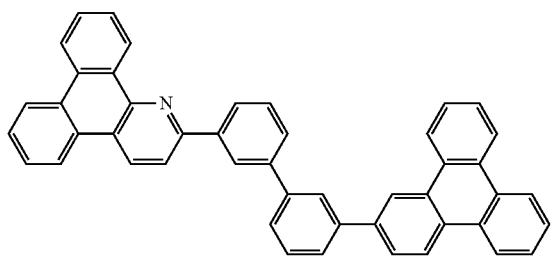
H-902
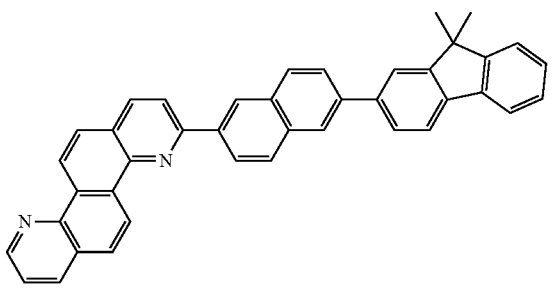
H-903
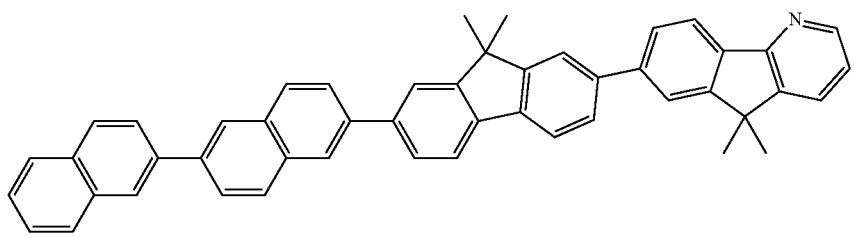

-continued

H-904

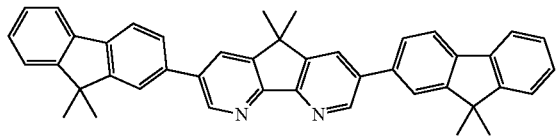

H-905

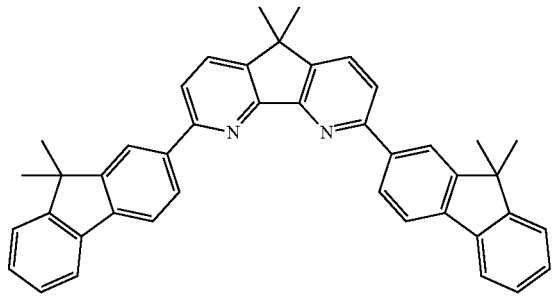

Of the exemplified compounds, the heterocycle-containing compounds represented by H-101 to H-158 are each a dibenzothiophene compound represented by the general formula [17]. Each of those heterocycle-containing compounds in the group 1 has a moderately low hole mobility and high structural stability because the advantages of dibenzothiophene are exploited. Therefore, the incorporation of any one of those heterocycle-containing compounds in the group 1 as the host into the emission layer optimizes a carrier balance between the host and guest (iridium complex represented by the general formula [1]) in the emission layer. Therefore, an organic light-emitting element having high light-emitting efficiency and a long lifetime is obtained.

Of the exemplified compounds, the heterocycle-containing compounds represented by H-201 to H-229 are each a benzonaphthothiophene compound represented by the general formula [18]. As in the heterocycle-containing compounds in the group 1, those heterocycle-containing compounds in the group 2 can each also optimize the carrier balance between the host and guest (iridium complex represented by the general formula [1]) in the emission layer. Therefore, an organic light-emitting element having high light-emitting efficiency and a long lifetime is obtained. In addition, the $S_1$ energy (HOMO-LUMO energy gap) of each heterocycle-containing compound in the group 2 is smaller than that of each heterocycle-containing compound in the group 1 because the π conjugation of benzonaphthothiophene is larger than that of dibenzothiophene. Therefore, the incorporation of the compound as the host into the emission layer can reduce the driving voltage of the light-emitting element because the incorporation reduces a carrier injection barrier from the carrier transport layer.

Of the exemplified compounds, the heterocycle-containing compounds represented by H-301 to H-329 are each a benzophenanthrothiophene compound represented by the general formula [19]. As in the heterocycle-containing compounds in the group 1 and the group 2, those heterocycle-containing compounds in the group 3 can each also optimize the carrier balance between the host and guest (iridium complex represented by the general formula [1]) in the emission layer. Therefore, an organic light-emitting element having high light-emitting efficiency and a long lifetime is obtained. In addition, the π conjugation of benzophenanthrothiophene is larger than those of benzonaphthothiophene and dibenzothiophene. Accordingly, by the same reason as the foregoing, the driving voltage of the light-emitting element can be additionally reduced.

Of the exemplified compounds, the heterocycle-containing compounds represented by H-401 to H-444 are each a dibenzoxanthene compound represented by the general formula [20]. Each of those heterocycle-containing compounds in the group 4 has a moderately low hole mobility, high structural stability, and a relatively shallow HOMO level because the advantages of dibenzoxanthene are exploited.

As in the heterocycle-containing compounds in the group 1 to the group 3, the incorporation of any one of those heterocycle-containing compounds in the group 4 as the host into the emission layer can also optimize the carrier balance between the host and guest (iridium complex represented by the general formula [1]) in the emission layer. Therefore, an organic light-emitting element having high light-emitting efficiency and a long lifetime is obtained.

Of the exemplified compounds, the heterocycle-containing compounds represented by H-501 to H-518 are each a dibenzoxanthene compound represented by the general formula [21]. As in the heterocycle-containing compounds in the group 4, the incorporation of any one of those heterocycle-containing compounds in the group 5 as the host into the emission layer can also optimize the carrier balance between the host and guest (iridium complex represented by the general formula [1]) in the emission layer. Therefore, an organic light-emitting element having high light-emitting efficiency and a long lifetime is obtained.

Of the exemplified compounds, the heterocycle-containing compounds represented by H-601 to H-642 are each a compound having an oxygen-containing heterocycle in which Z represents an oxygen atom out of the heterocycle-containing compounds each represented by the general formula [8]. It is to be noted that the compounds in the group (group 6) are each an oxygen-containing heterocycle-containing compound except the dibenzoxanthene compounds represented by the general formulae [20] and [21]. Those heterocycle-containing compounds in the group 6 are each a compound having high structural stability as in the heterocycle-containing compounds in the group 1 to the group 5, and are each a compound having a relatively shallow HOMO level because the electron-donating property of the oxygen atom comes into play. As in the heterocycle-containing compounds in the group 1 to the group 5, the incorporation of any one of those heterocycle-containing compounds in the group 6 as the host into the emission layer can also optimize the carrier balance between the host and guest (iridium complex represented by the general formula [1]) in the emission layer. Therefore, an organic light-emitting element having high light-emitting efficiency and a long lifetime is obtained.

Of the exemplified compounds, the heterocycle-containing compounds represented by H-701 to H-748 are each a compound in which Z in the formula [8] represents a sulfur atom, and which does not correspond to the benzo-fused thiophene compounds represented by the general formulae [17] to [19] out of the heterocycle-containing compounds each represented by the general formula [8]. As in the heterocycle-containing compounds in the group 1 to the group 5, those heterocycle-containing compounds in the group 7 are each a compound having high structural stability. In addition, the compounds are each a compound having a relatively small $S_1$ energy because the compound contains the sulfur atom in a molecule thereof. As in the heterocycle-containing compounds in the group 1 to the group 6, the incorporation of any one of those heterocycle-containing compounds in the group 7 as the host into the emission layer can also optimize the carrier balance between the host and guest (iridium complex represented by the general formula [1]) in the emission layer. Therefore, an organic light-emitting element having high light-emitting efficiency and a long lifetime is obtained. In addition, the incorporation of any one of the heterocycle-containing compounds in the group 7 as the host into the emission layer can reduce the driving voltage.

Of the exemplified compounds, the heterocycle-containing compounds represented by H-801 to H-806 are each a carbazole compound represented by the general formula [7]. Each of those heterocycle-containing compounds in the group 8 has a relatively high HOMO and a relatively high LUMO, and has high hole transportability. For example, when any one of the carbazole compounds in the group 8 is used in such an organic light-emitting element that the amount of electrons to be injected from a cathode is large, a carrier balance in its emission layer is adjusted, whereby its light-emitting efficiency and lifetime characteristic improve.

Of the exemplified compounds, the heterocycle-containing compounds represented by H-901 to H-905 are each a nitrogen-containing six-membered ring aromatic compound. Each of those heterocycle-containing compounds in the group 9 has a relatively low HOMO and a relatively low LUMO, and has high electron transportability. For example, when any one of the nitrogen-containing six-membered ring aromatic compounds in the group 9 is used in such an organic light-emitting element that the amount of holes to be injected from an anode is large, a carrier balance in its emission layer is adjusted, whereby its light-emitting efficiency and lifetime characteristic improve.

(8) Specific Examples of Third Component

Specific structural formulae of the third component that can be incorporated into the organic light-emitting element of the present invention are exemplified below. However, the present invention is not limited thereto.

Group M

M-101

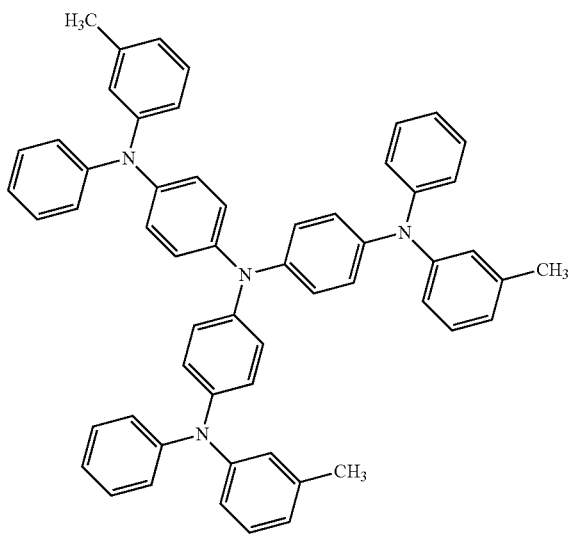

M-102

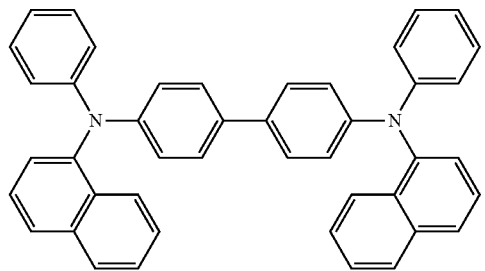

M-103

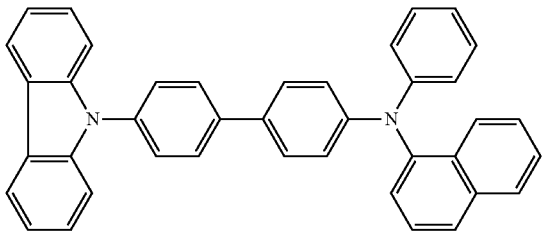

M-104

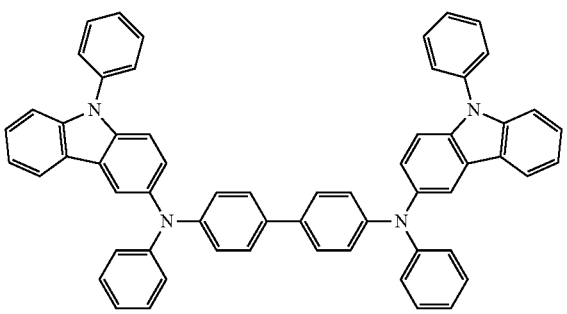

M-105

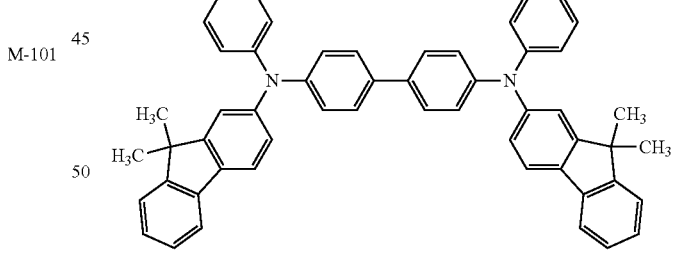

Group N

N-101

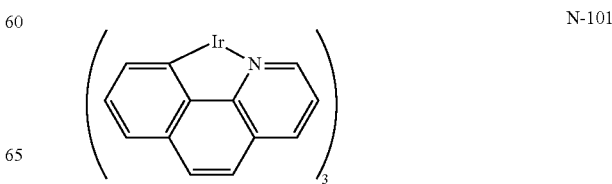

N-102
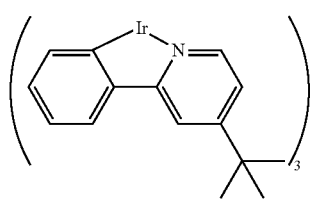
N-103
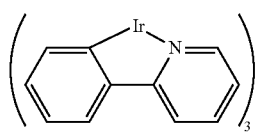
N-104
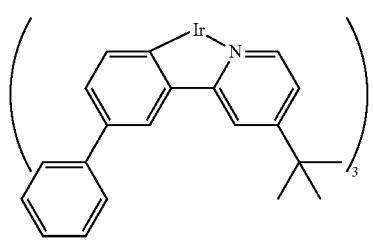
Group O
O-101
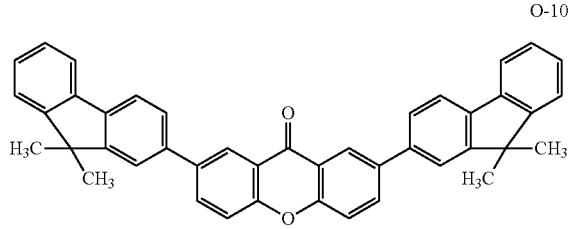
O-102
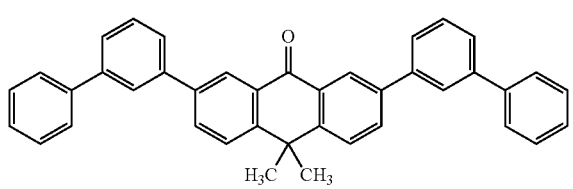
O-103
O-104
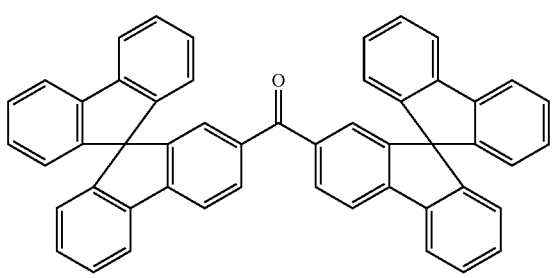
O-105
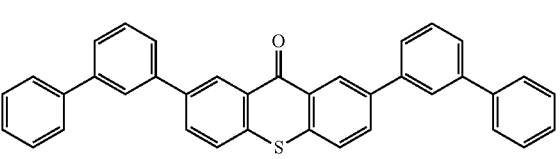
O-106
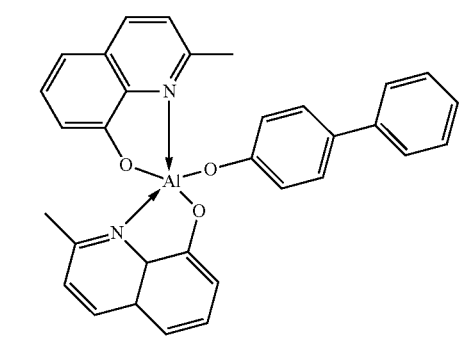
O-107
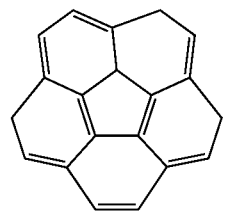
Group P
P-101
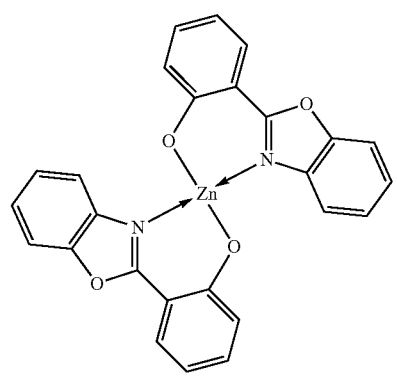

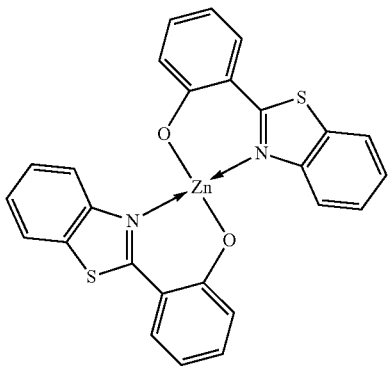

P-102

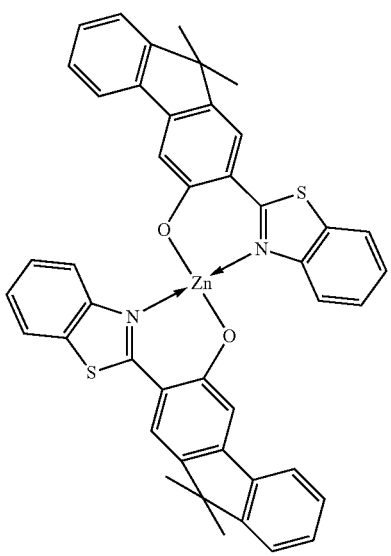

P-103

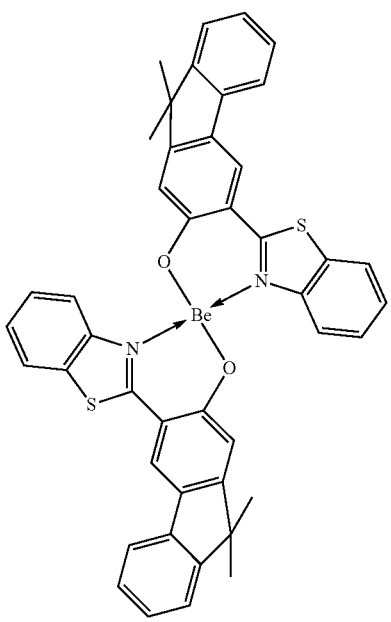

P-104

Each compound belonging to the group M is an amine-containing compound and a compound having a high hole injection/transport ability.

Each compound belonging to the group N is a metal complex (iridium complex) and is a compound having a smaller ΔS–T value than that of the hydrocarbon compound as the host. Accordingly, the incorporation of the compound as the third component can reduce the band gap and hence improves a charge transport ability. Further, each compound belonging to the group L is a metal complex containing a heavy metal (iridium) and has a long retention time of the triplet excited state ($T_1$). Accordingly, the compound can efficiently transfer an energy obtained from the host to the light-emitting material.

The compounds belonging to the group O are a group of compounds each having the feature (2b). In addition, the compounds belonging to the group P are a group of compounds each having the feature (2c).

(9) Other Materials

As described above, in the organic light-emitting element of the present invention, the emission layer contains at least the iridium complex represented by the general formula [1] as a guest and the heterocycle-containing compound as a host. It is to be noted that in the present invention, conventionally known low-molecular weight and high-molecular weight materials can each be used as required in addition to those compounds. More specifically, a hole-injectable/transportable material, a host, a light emission assist material, an electron-injectable/transportable material, or the like can be used together with the iridium complex and the heterocycle-containing compound.

Examples of those materials are listed below.

The hole-injectable/transportable material is preferably a material having a high hole mobility so that the injection of a hole from the anode may be facilitated and the injected hole can be transported to the emission layer. In addition, the material is preferably a material having a high glass transition point for preventing the deterioration of film quality such as crystallization in the organic light-emitting element. Examples of the low-molecular weight and high-molecular weight materials each having hole-injecting/transporting performance include a triarylamine derivative, an arylcarbazole derivative, a phenylenediamine derivative, a stilbene derivative, a phthalocyanine derivative, a porphyrin derivative, poly(vinyl carbazole), poly(thiophene), and other conductive polymers. Further, the hole-injectable/transportable material is suitably used for the electron blocking layer as well.

Specific examples of a compound to be used as the hole-injectable/transportable material are shown below. However, the compound is of course not limited thereto.

117
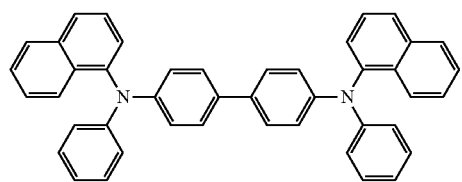
118
HT1
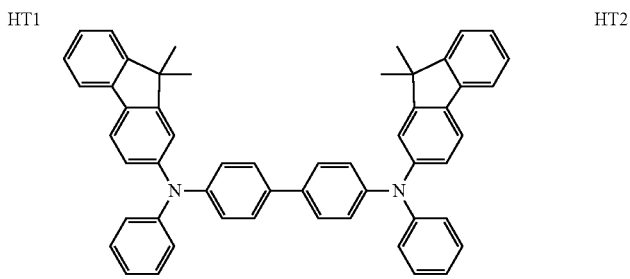
HT2
HT3
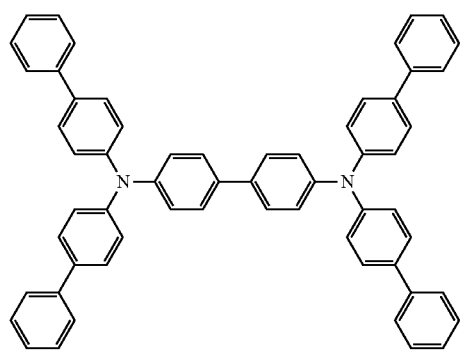
HT4
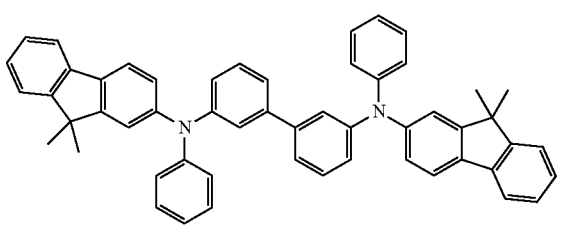
HT5
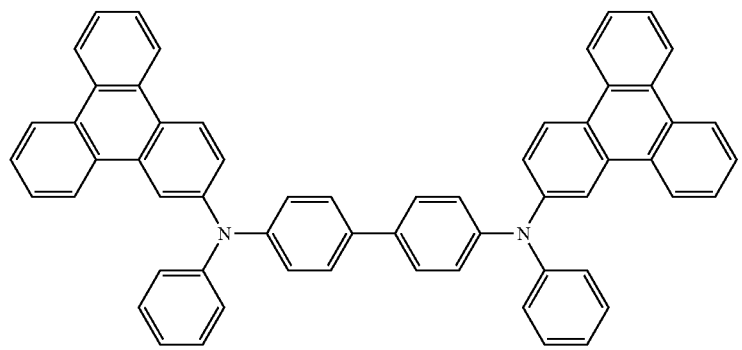
HT6
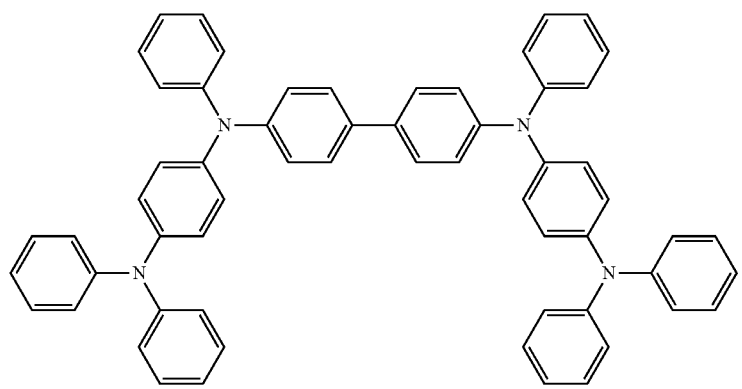

-continued
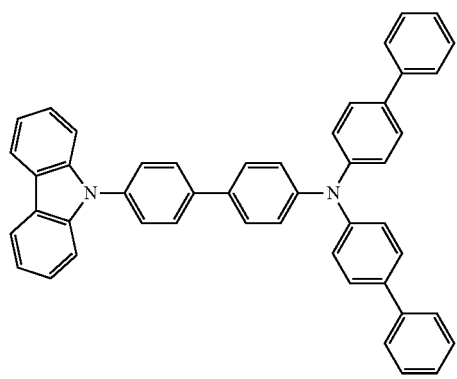
HT7
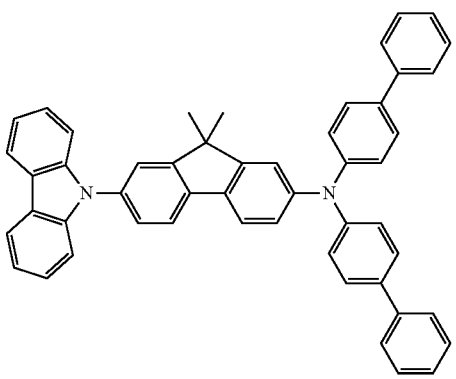
HT8
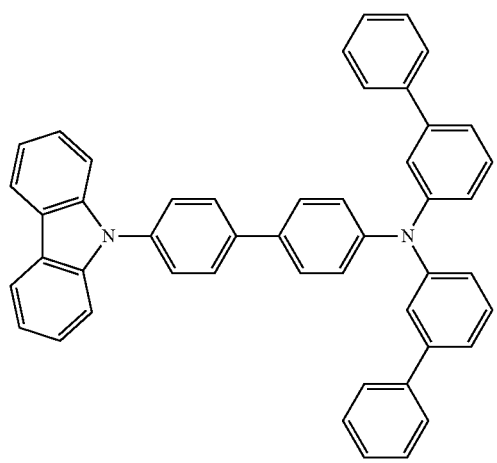
HT9
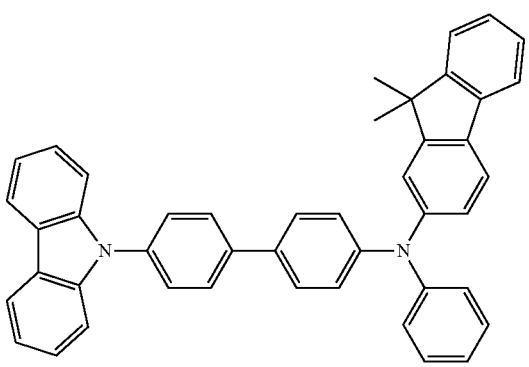
HT10
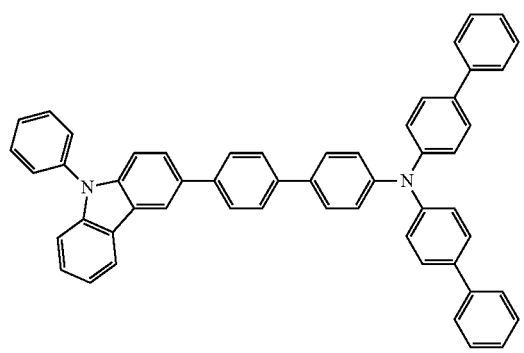
HT11
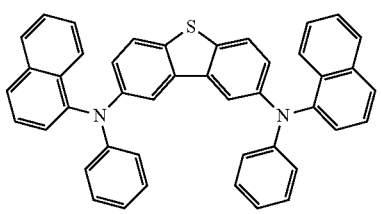
HT12
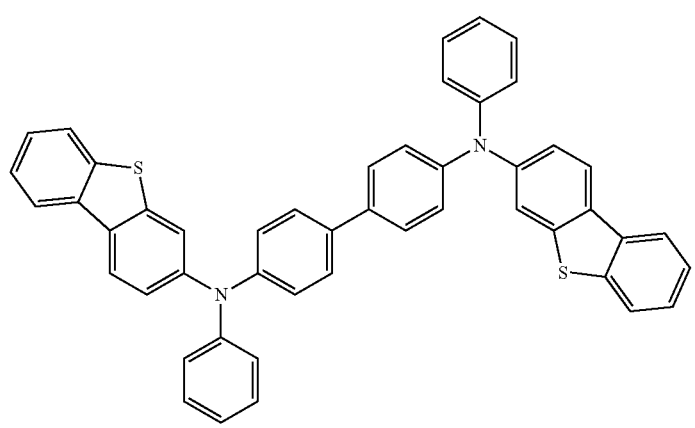
HT13

HT14

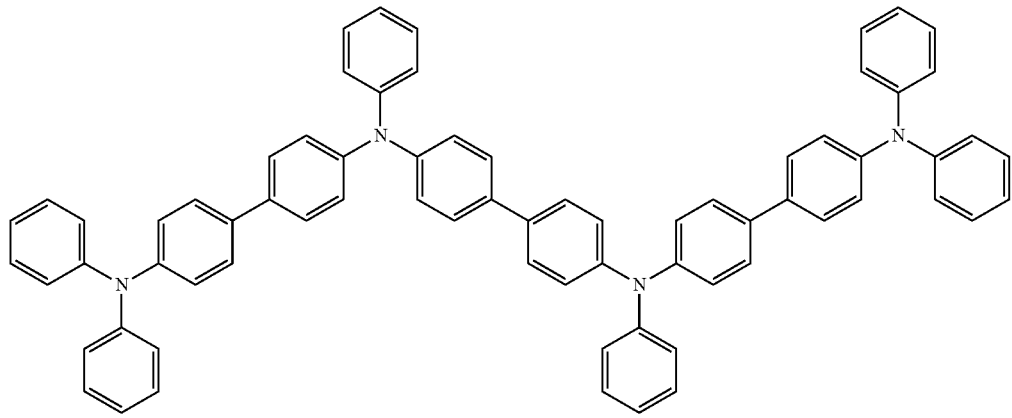

Examples of the light-emitting material mainly involved in a light-emitting function include: condensed ring compounds (such as a fluorene derivative, a naphthalene derivative, a pyrene derivative, a perylene derivative, a tetracene derivative, an anthracene derivative, and rubrene); a quinacridone derivative; a coumarin derivative; a stilbene derivative; an organic aluminum complex such as tris(8-quinolinolato)aluminum; a platinum complex; a rhenium complex; a copper complex; a europium complex; a ruthenium complex; and polymer derivatives such as a poly(phenylene vinylene) derivative, a poly(fluorene) derivative, and a poly(phenylene) derivative in addition to the iridium complex represented by the general formula [1] or a derivative thereof.

Specific examples of a compound to be used as the light-emitting material are shown below. However, the compound is of course not limited thereto.

BD1

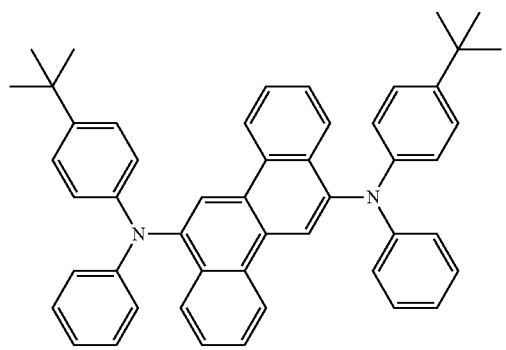

BD2

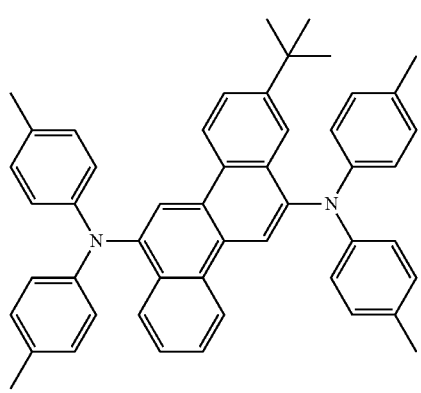

BD3

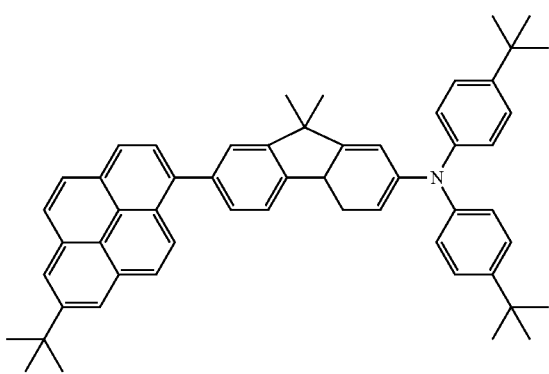

BD4

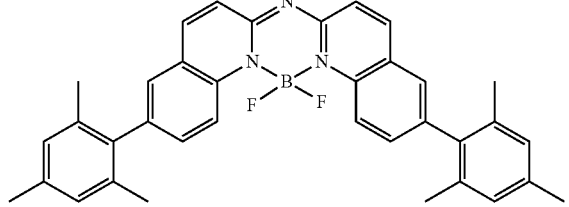

BD5

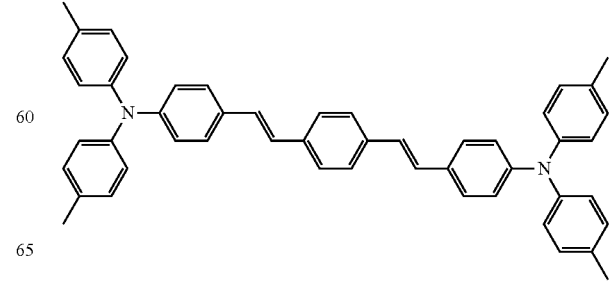

BD6 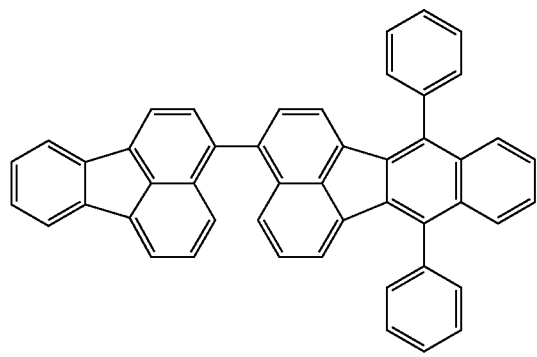
BD7 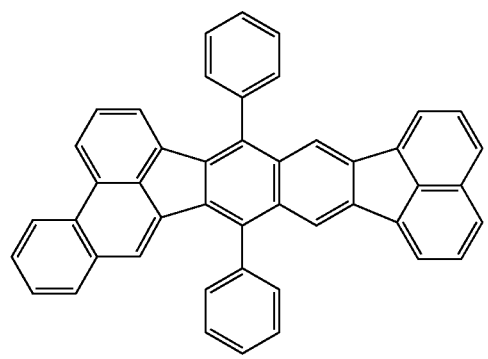
BD8 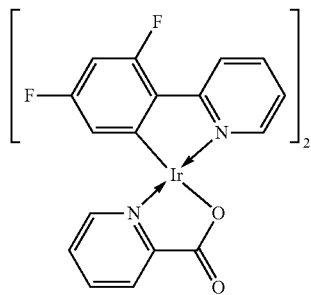
GD1 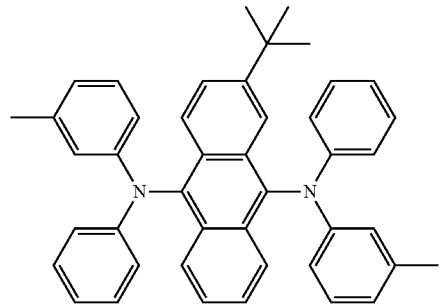
GD2 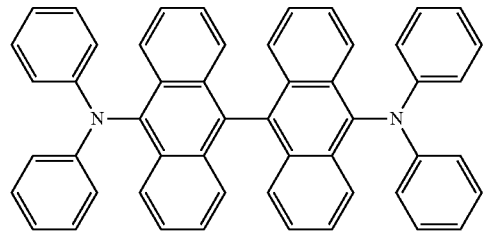
GD3 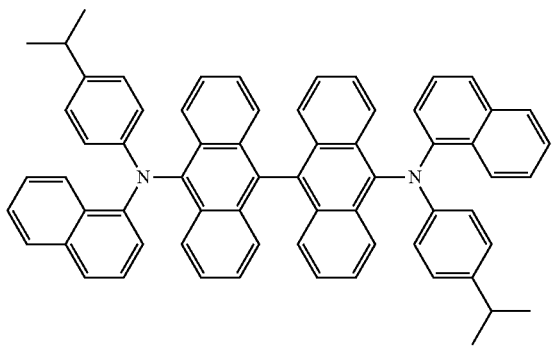
GD4 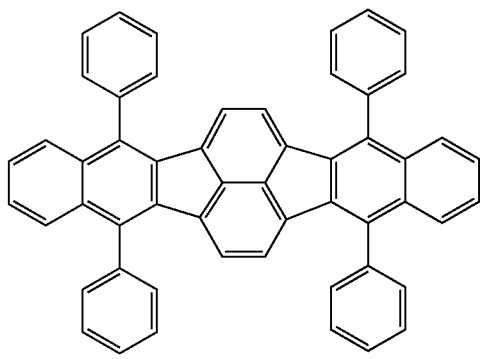
GD5 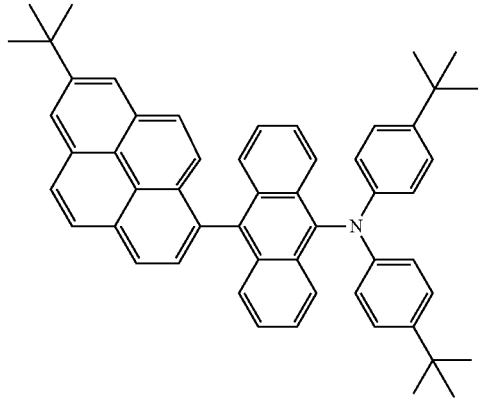
GD6 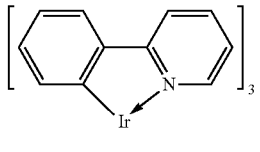
GD7 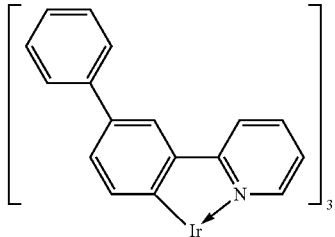

GD8
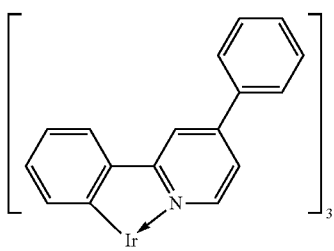

RD1
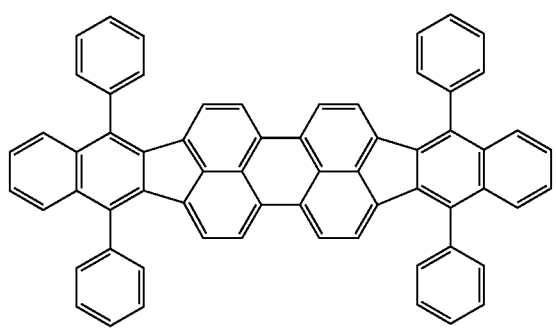

RD2
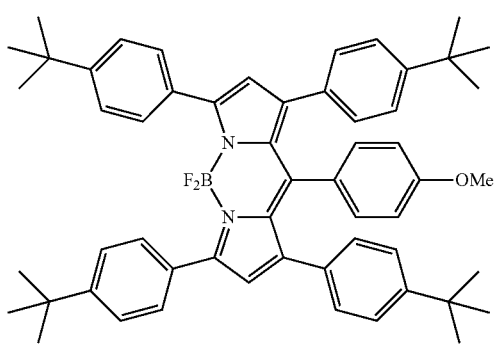

RD3
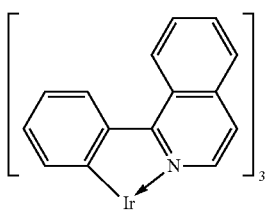

RD4
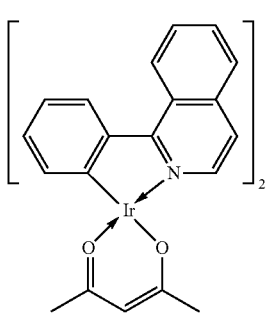

RD5
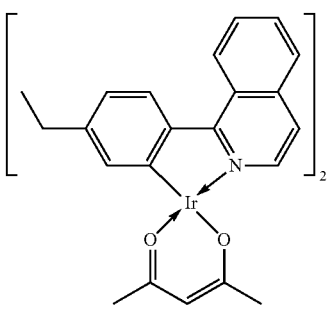

RD6
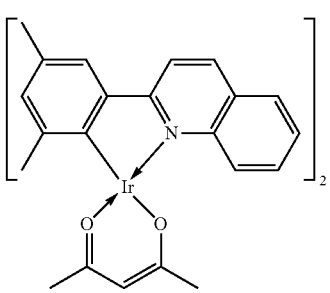

RD7
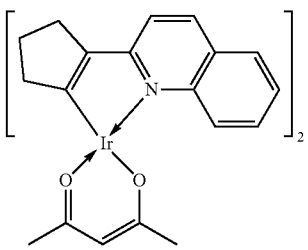

RD8
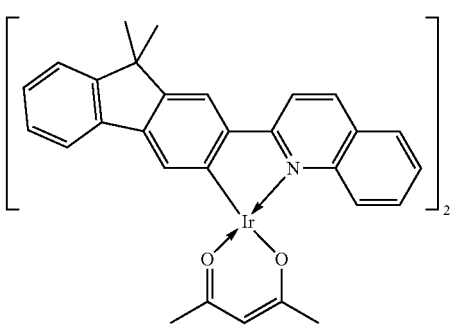

Examples of the host or assist material to be incorporated into the emission layer include: an aromatic hydrocarbon compound or a derivative thereof; a carbazole derivative; a dibenzofuran derivative; a dibenzothiophene derivative; an organic aluminum complex such as tris(8-quinolinolato) aluminum; and an organic beryllium complex in addition to the heterocycle-containing compound.

Specific examples of a compound to be used as the host or assist material to be incorporated into the emission layer are shown below. However, the compound is of course not limited thereto.

EM1
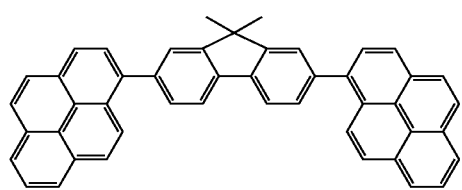
EM2
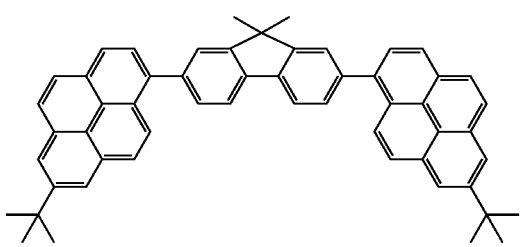
EM3
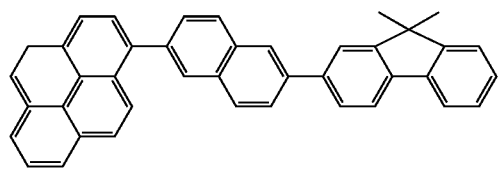
EM4
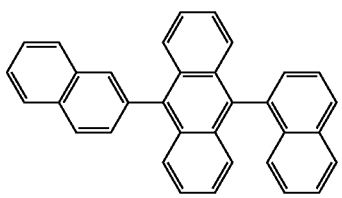
EM5
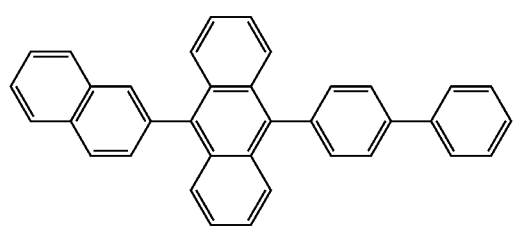
EM6
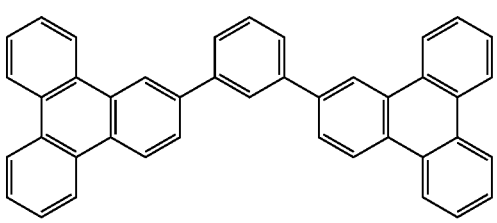
EM7
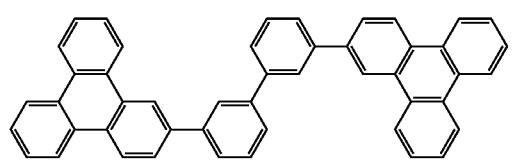
EM8
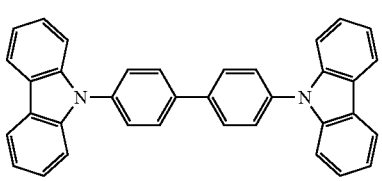
EM9
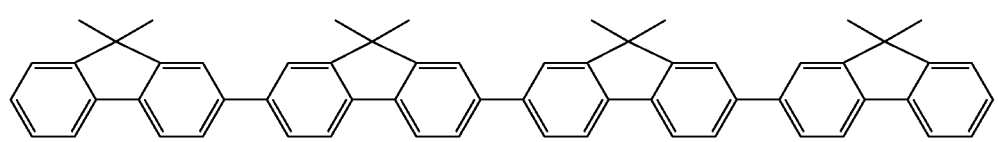
EM10
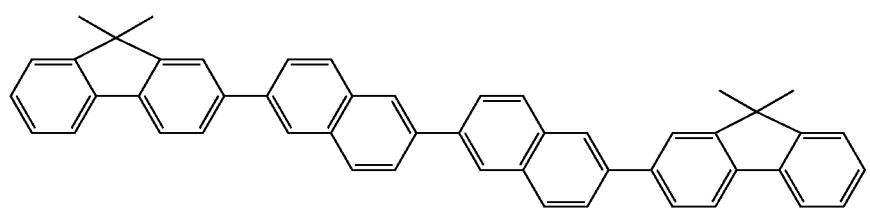
EM11
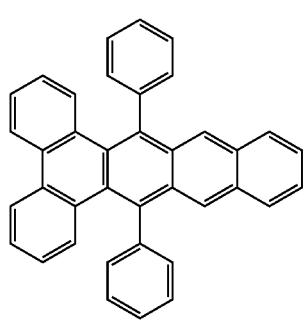
EM12
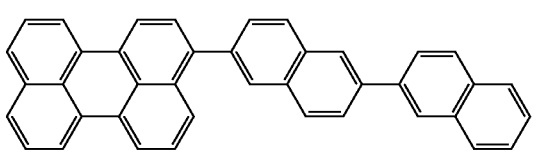

-continued

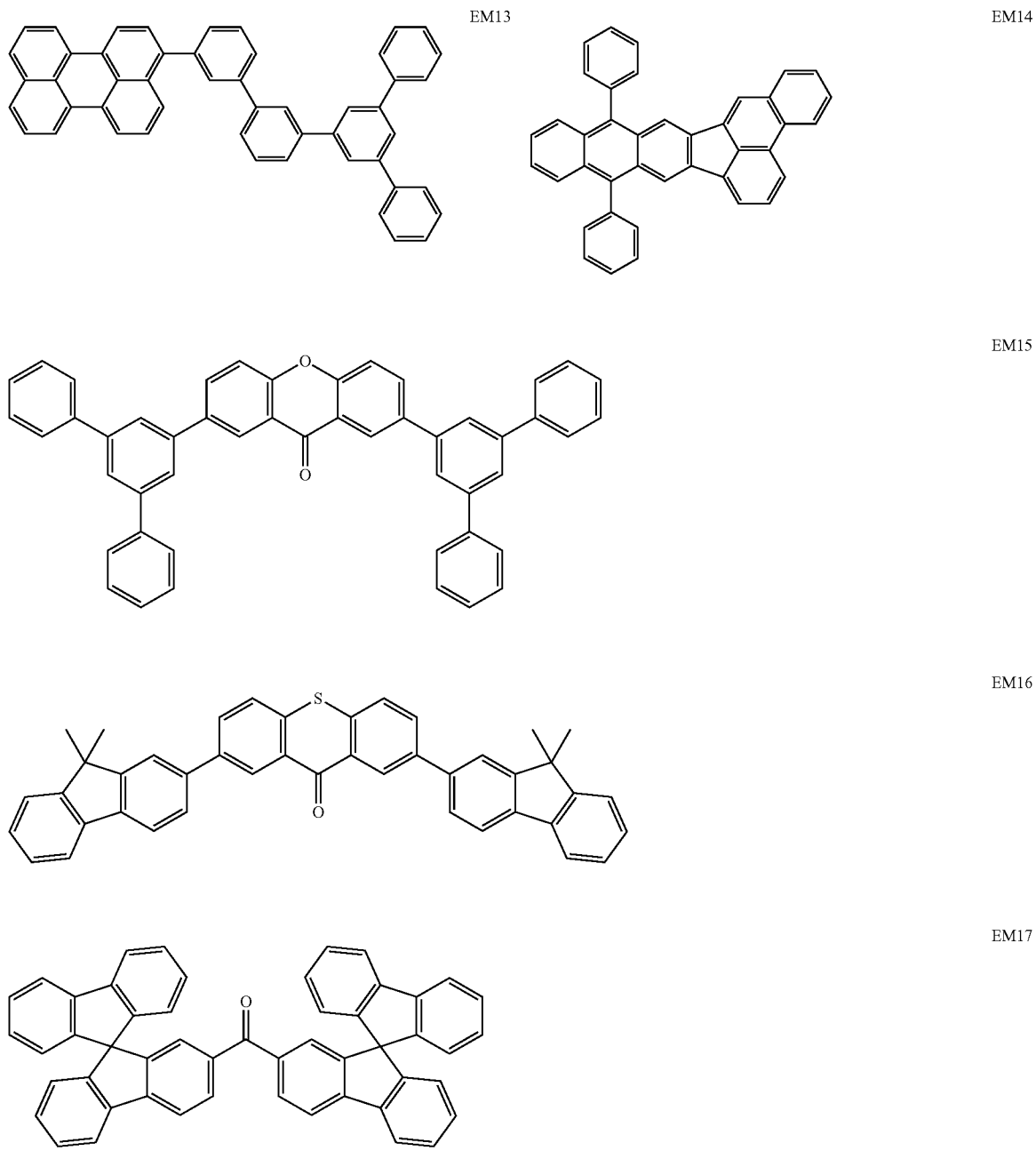

The electron-injectable/transportable material can be arbitrarily selected from materials that allow electrons to be easily injected from the cathode and can transport the injected electrons to the emission layer in consideration of, for example, the balance with the hole mobility of the hole-transportable material. Examples of the material having electron-injecting performance and electron-transporting performance include an oxadiazole derivative, an oxazole derivative, a pyrazine derivative, a triazole derivative, a triazine derivative, a quinoline derivative, a quinoxaline derivative, a phenanthroline derivative, and an organic aluminum complex. Further, the electron-injectable/transportable material is suitably used for the hole blocking layer as well.

Specific examples of a compound to be used as the electron-injectable/transportable material are shown below. However, the compound is of course not limited thereto.

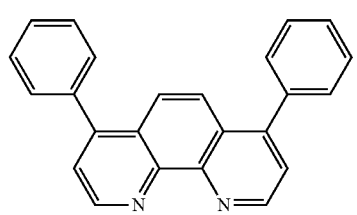

ET2
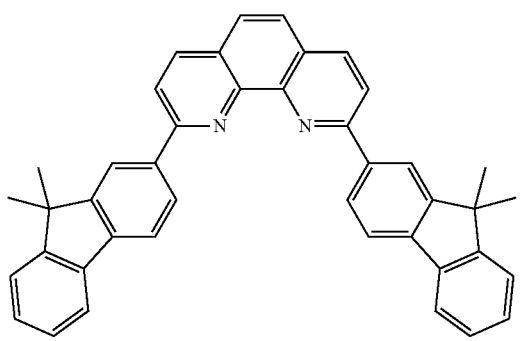

ET3
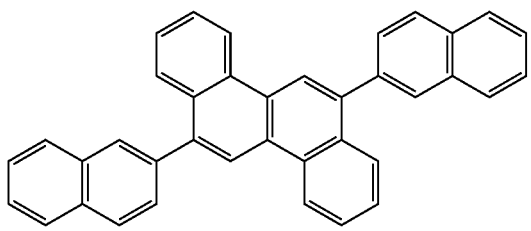

ET4
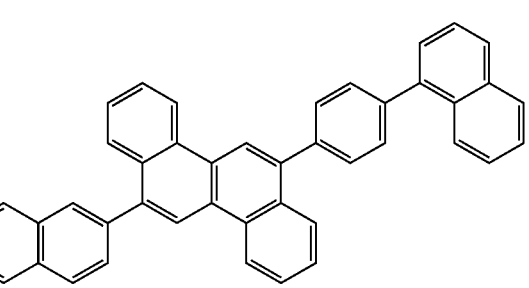

ET5
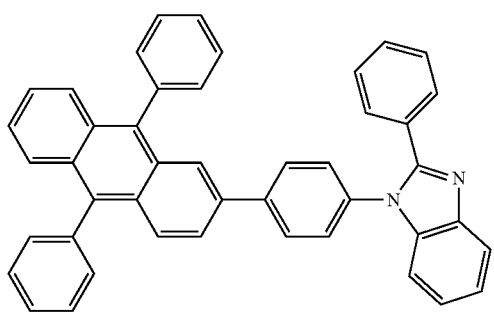

ET6
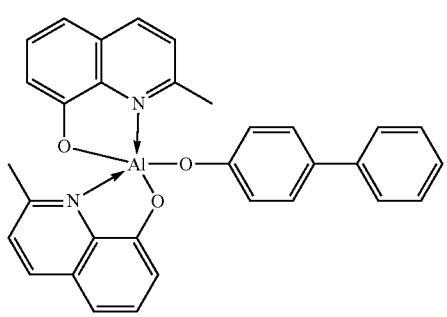

ET7
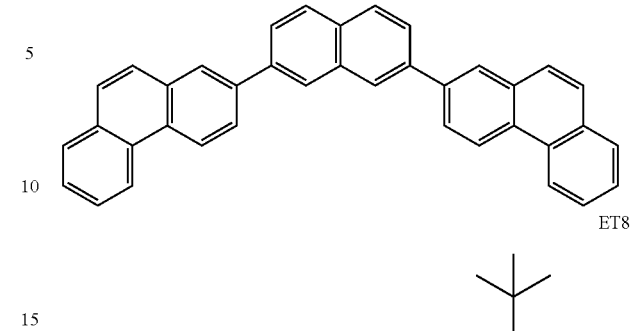

ET8
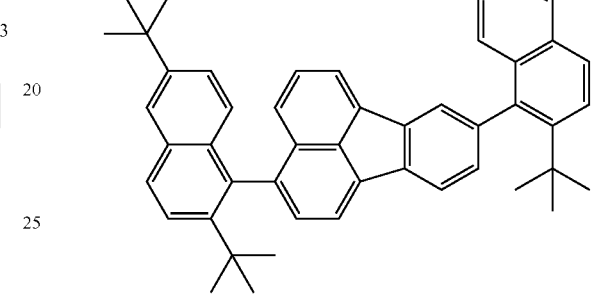

In addition, a mixture obtained by mixing the electron-injectable/transportable material and a compound of an alkali metal or an alkaline earth metal may be used as the electron-injectable/transportable material. Examples of the metal compound to be mixed with the electron-injectable/transportable material include LiF, KF, $Cs_2CO_3$, and CsF.

A constituent material for the anode desirably has as large a work function as possible. For example, there can be used: metal simple substances such as gold, platinum, silver, copper, nickel, palladium, cobalt, selenium, vanadium, and tungsten or alloys obtained by combining these metal simple substances; metal oxides such as tin oxide, zinc oxide, indium oxide, indium tin oxide (ITO), indium zinc oxide, gallium zinc oxide, and indium gallium zinc oxide; and conductive polymers such as polyaniline, polypyrrole, and polythiophene. In particular, a transparent oxide semiconductor (e.g., indium tin oxide (ITO), indium zinc oxide, or indium gallium zinc oxide) has a high mobility, and hence is suitable for an electrode material.

One kind of those electrode substances may be used alone, or two or more kinds thereof may be used in combination. In addition, the anode may be of a single-layer construction or may be of a multilayer construction.

On the other hand, a constituent material for the cathode desirably has as small a work function as possible. Examples thereof include: alkali metals such as lithium; alkaline earth metals such as calcium; and metal simple substances such as aluminum, titanium, manganese, silver, lead, and chromium. Alternatively, alloys obtained by combining those metal simple substances can be used. For example, a magnesium-silver alloy, an aluminum-lithium alloy, or an aluminum-magnesium alloy can be used. A metal oxide such as indium tin oxide (ITO) can also be utilized. One kind of those electrode substances may be used alone, or two or more kinds thereof may be used in combination. In addition, the cathode may be of a single-layer construction or may be of a multilayer construction.

The organic compound layer (such as the hole injection layer, the hole transport layer, the electron blocking layer, the emission layer, the hole blocking layer, the electron transport layer, or the electron injection layer) for forming the organic light-emitting element of the present invention is formed by the following method.

A dry process such as a vacuum vapor deposition method, an ionized vapor deposition method, sputtering, or a plasma process can be used for the formation of the organic compound layer for forming the organic light-emitting element of the present invention. In addition, a wet process involving dissolving the constituent materials in an appropriate solvent and forming a layer by a known application method (such as spin coating, dipping, a casting method, an LB method, or an ink jet method) can be used instead of the dry process.

Here, when the layer is formed by the vacuum vapor deposition method, the solution application method, or the like, the layer hardly undergoes crystallization or the like and is excellent in stability over time. In addition, when the layer is formed by the application method, the film can be formed by using the constituent materials in combination with an appropriate binder resin.

Examples of the binder resin include, but not limited to, a polyvinyl carbazole resin, a polycarbonate resin, a polyester resin, an ABS resin, an acrylic resin, a polyimide resin, a phenol resin, an epoxy resin, a silicone resin, and a urea resin.

In addition, one kind of those binder resins may be used alone as a homopolymer or a copolymer, or two or more kinds thereof may be used as a mixture. Further, a known additive such as a plasticizer, an antioxidant, or a UV absorber may be used in combination as required.

(10) Application of Organic Light-Emitting Element of the Present Invention

The organic light-emitting element of the present invention can be used as a constituent member for a display apparatus or lighting apparatus. In addition, the element finds use in applications such as an exposure light source for an image-forming apparatus of an electrophotographic system, a backlight for a liquid crystal display apparatus, and a light-emitting apparatus including a white light source and a color filter. Examples of the color filter include filters that transmit light beams having three colors, i.e., red, green, and blue colors.

A display apparatus of the present invention includes the organic light-emitting element of the present invention in its display portion. It is to be noted that the display portion includes multiple pixels.

In addition, the pixels each have the organic light-emitting element of the present invention and a transistor as an example of an active element (switching element) or amplifying element for controlling emission luminance, and the anode or cathode of the organic light-emitting element and the drain electrode or source electrode of the transistor are electrically connected to each other. Here, the display apparatus can be used as an image display apparatus for a PC or the like. The transistor is, for example, a TFT element and the TFT element is, for example, an element formed of a transparent oxide semiconductor and is provided on the insulating surface of a substrate.

The display apparatus may be an information processing apparatus that includes an image input portion for inputting image information from, for example, an area CCD, a linear CCD, or a memory card, and displays an input image on its display portion.

In addition, the display portion of an imaging apparatus or inkjet printer may have a touch panel function. The drive system of the touch panel function is not particularly limited.

In addition, the display apparatus may be used in the display portion of a multifunction printer.

A lighting apparatus is an apparatus for lighting, for example, the inside of a room. The lighting apparatus may emit light having any one of the following colors: a white color (having a color temperature of 4,200 K), a daylight color (having a color temperature of 5,000 K), and colors ranging from blue to red colors.

A lighting apparatus of the present invention includes the organic light-emitting element of the present invention and an inverter circuit connected to the organic light-emitting element. It is to be noted that the lighting apparatus may further include a color filter.

An image-forming apparatus of the present invention is an image-forming apparatus including: a photosensitive member; a charging unit for charging the surface of the photosensitive member; an exposing unit for exposing the photosensitive member to form an electrostatic latent image; and a developing unit for developing the electrostatic latent image formed on the surface of the photosensitive member. Here, the exposing unit to be provided in the image-forming apparatus includes the organic light-emitting element of the present invention.

In addition, the organic light-emitting element of the present invention can be used as a constituent member for an exposing apparatus for exposing a photosensitive member. An exposing apparatus including a plurality of the organic light-emitting elements of the present invention is, for example, an exposing apparatus in which the organic light-emitting elements of the present invention are placed to form a line along a predetermined direction.

Next, the display apparatus of the present invention is described with reference to the drawing. FIG. 1 is a schematic sectional view illustrating an example of a display apparatus including an organic light-emitting element and a TFT element connected to the organic light-emitting element. It is to be noted that the organic light-emitting element of the present invention is used as the organic light-emitting element constituting a display apparatus 1 of FIG. 1.

The display apparatus 1 of FIG. 1 includes a substrate 11 made of glass or the like and a moisture-proof film 12 for protecting a TFT element or organic compound layer, the film being provided on the substrate. In addition, a metal gate electrode 13 is represented by reference numeral 13, a gate insulating film 14 is represented by reference numeral 14, and a semiconductor layer is represented by reference numeral 15.

A TFT element 18 includes the semiconductor layer 15, a drain electrode 16, and a source electrode 17. An insulating film 19 is provided on the TFT element 18. An anode 21 constituting the organic light-emitting element and the source electrode 17 are connected to each other through a contact hole 20.

It is to be noted that a system for the electrical connection between the electrode (anode or cathode) in the organic light-emitting element and the electrode (source electrode or drain electrode) in the TFT is not limited to the aspect illustrated in FIG. 1. In other words, one of the anode and the cathode, and one of the source electrode and drain electrode of the TFT element have only to be electrically connected to each other.

Although multiple organic compound layers are illustrated like one layer in the display apparatus 1 of FIG. 1, an organic compound layer 22 may be multiple layers. A first protective layer 24 and second protective layer 25 for suppressing the deterioration of the organic light-emitting element are provided on a cathode 23.

When the display apparatus 1 of FIG. 1 is a display apparatus that emits white light, an emission layer in the organic compound layer 22 in FIG. 1 may be a layer obtained by mixing a red light-emitting material, a green light-emitting material, and a blue light-emitting material. In addition, the layer may be a stacked emission layer obtained by stacking a layer formed of the red light-emitting material, a layer formed of the green light-emitting material, and a layer formed of the blue light-emitting material. Further, alternatively, the following aspect is permitted: the layer formed of the red light-emitting material, the layer formed of the green light-emitting material, and the layer formed of the blue light-emitting material are, for example, arranged side by side to form domains in one emission layer.

Although the transistor is used as a switching element in the display apparatus 1 of FIG. 1, an MIM element may be used instead of the transistor as the switching element.

In addition, the transistor to be used in the display apparatus 1 of FIG. 1 is not limited to a transistor using a monocrystalline silicon wafer and may be a thin-film transistor including an active layer on the insulating surface of a substrate. A thin-film transistor using monocrystalline silicon as the active layer, a thin-film transistor using non-monocrystalline silicon such as amorphous silicon or microcrystalline silicon as the active layer, or a thin-film transistor using a non-monocrystalline oxide semiconductor such as an indium zinc oxide or an indium gallium zinc oxide as the active layer is also permitted. It is to be noted that the thin-film transistor is also called a TFT element.

The transistor in the display apparatus 1 of FIG. 1 may be formed in a substrate such as an Si substrate. Here, the phrase "formed in a substrate" means that the transistor is produced by processing the substrate itself such as an Si substrate. In other words, the presence of the transistor in the substrate can be regarded as follows: the substrate and the transistor are integrally formed.

Whether the transistor is provided in the substrate is selected depending on definition. In the case of, for example, a definition of about a QVGA per inch, the organic light-emitting element is preferably provided in the Si substrate.

As described above, the driving of the display apparatus using the organic light-emitting element of the present invention enables display that has good image quality and is stable over a long time period.

EXAMPLES

Hereinafter, the present invention is described in detail by way of Examples. However, the present invention is not limited to Examples below.

[Synthesis Example 1] Synthesis of Exemplified Compound Ir-113

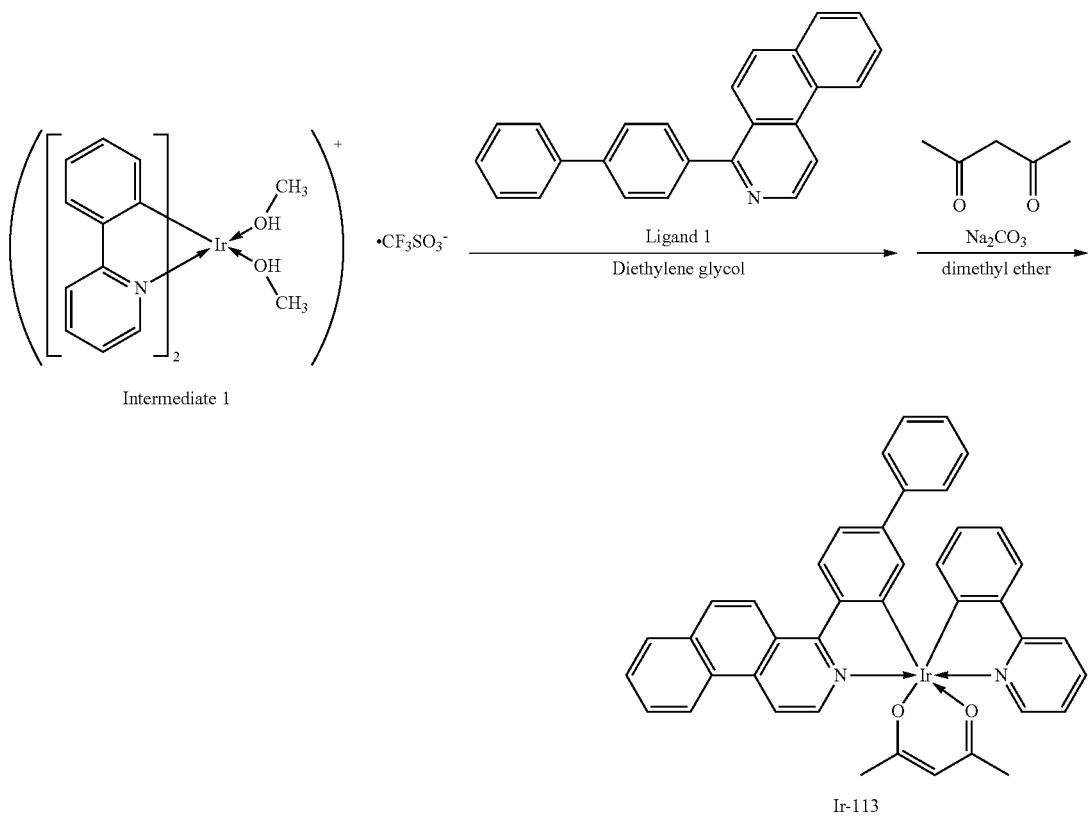

(1) Synthesis of Intermediate 1 and Ligand 1
Intermediate 1 was synthesized according to a method described in PTL 2. In addition, Ligand 1 was synthesized according to a method described in PTL 3.
(2) Synthesis of Exemplified Compound Ir-113
The following reagents and solvent were loaded in a 100-ml recovery flask.

Intermediate 1: 0.864 g (1.21 mmol)
Ligand 1: 0.802 g (2.42 mmol)
Diethylene glycol dimethyl ether: 50 ml Next, the reaction solution was heated to 160° C. under nitrogen. After that, the reaction solution was stirred at the temperature (160° C.) for 6 hours. At this time, the color of the reaction solution changed from a yellow color to a dark red color. Next, the temperature of the reaction solution was reduced to 120° C. and then the following reagents were added.
Acetylacetone (manufactured by Tokyo Chemical Industry Co., Ltd.): 0.606 g (6.05 mmol)
Sodium carbonate: 0.641 g (6.05 mmol)

Next, the reaction solution was heated to 120° C. under nitrogen. After that, the reaction solution was stirred at the temperature (120° C.) for 2 hours. Next, water was added to a viscous body, which had been produced by removing the solvent of the reaction solution by distillation under reduced pressure, to precipitate a solid. Next, the solid was filtered and then vacuum-dried, followed by purification with a neutral alumina gel column (toluene:ethyl acetate=10:1). Thus, 0.160 g of Exemplified Compound Ir-113 was obtained (yield: 17%).

Matrix-assisted laser desorption/ionization time-of-flight mass spectrometry (MALDI-TOF MS, Autoflex LRF manufactured by Bruker) confirmed that the compound had an M$^+$ of 776.2.

Further, the structure of the compound was identified by $^1$H-NMR measurement.

$^1$H-NMR {(CD$_3$)$_2$S=O, 500 MHz} δ (ppm): 8.98-8.96 (1H, m), 8.86 (1H, d), 8.73 (1H, d), 8.60 (1H, d), 8.51 (1H, d), 8.26 (1H, d), 8.20-8.17 (3H, m), 7.99 (1H, t), 7.89-7.85 (2H, m), 7.70 (1H, d), 7.45 (1H, t), 7.36-7.33 (2H, m), 7.28-7.24 (3H, m), 7.20 (1H, dd), 6.74 (1H, t), 6.54 (1H, t), 6.48 (1H, d), 5.99 (1H, d), 5.30 (1H, s), 1.77 (3H, s), 1.70 (3H, s)

The phosphorescence spectrum of a dilute toluene solution (1×10$^{-5}$ M) of Exemplified Compound Ir-113 was measured with an F-4500 manufactured by Hitachi, Ltd. It is to be noted that the measurement was performed under the following conditions: the measurement was performed under a nitrogen atmosphere at room temperature and an excitation wavelength was set to 450 nm. As a result of the measurement, the peak wavelength of the phosphorescence spectrum was 609 nm.

The vacuum thermogravimetric analysis of Exemplified Compound Ir-113 was performed with a TG-DTA 2410SA manufactured by Bruker AXS and then its sublimation temperature ($T_{sub}$) was determined by the following procedure. First, the thermogravimetric change of the sample was measured under a vacuum of 1×10$^{-3}$ Pa. Next, the resultant measured result was substituted into the following calculation equation (i) to determine a change in saturated vapor pressure P [Pa] with temperature:

$$P=m/\{4.38\times10^{-3}\cdot(M/T)^{1/2}\} \quad (i)$$

(m: an evaporation rate per unit area [kg/m$^2$·s], M: the molecular weight of the complex, T: the temperature of an evaporation surface [K]).

It is to be noted that m is determined from the following equation (ii):

$$m=(1/U)\cdot(d\Delta W/dt) \quad (ii)$$

(U: the area of a sample dish [m$^2$], dΔW/dt: the first derivation of a thermogravimetric curve with respect to time).

Here, a weight change rate within 20 seconds {(amount of weight change)/(20 seconds)} was used as the dΔW/dt. In addition, a temperature after a lapse of 20 seconds was used as the temperature T.

A saturated vapor pressure curve is obtained by plotting the P obtained by the calculation against the T. In the saturated vapor pressure curve, the P starts to increase immediately after the initiation of the sublimation of the complex. Here, the temperature at which the P exceeded 5×10$^{-4}$ Pa was defined as the $T_{sub}$. As a result, the $T_{sub}$ in Exemplified Compound Ir-113 was 300° C.

The atmospheric thermogravimetric/differential thermal analysis of Exemplified Compound Ir-113 was performed with a TG-DTA 2000SA manufactured by Bruker AXS. In the resultant differential thermal curve, the temperature at which an exothermic peak started to appear was defined as the decomposition temperature ($T_d$). It is to be noted that a weight reduction simultaneously occurred at the $T_d$ and hence the reaction was confirmed to be a decomposition reaction. As a result, in Exemplified Compound Ir-113, the $T_d$ was 355° C.

[Synthesis Example 2] Synthesis of Exemplified Compound Ir-114

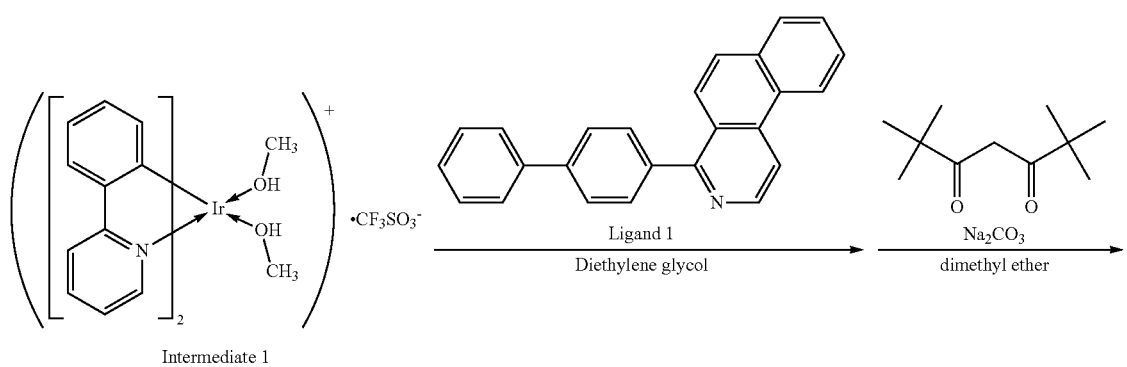

Intermediate 1

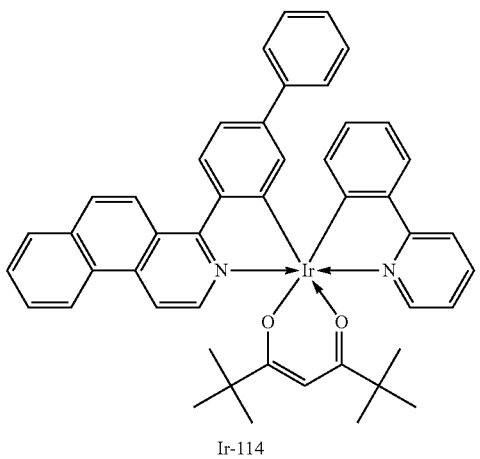

Ir-114

Exemplified Compound Ir-114 was obtained by the same method as that of Synthesis Example 1 with the exception that in the section (2) of Synthesis Example 1, dipivaloylmethane (manufactured by Tokyo Chemical Industry Co., Ltd.) was used instead of acetylacetone.

MALDI-TOF MS confirmed that the compound had an $M^+$ of 860.3.

Further, the structure of the compound was identified by $^1$H-NMR measurement.

$^1$H-NMR {(CD$_3$)$_2$S=O, 500 MHz} δ (ppm): 8.99-8.97 (1H, m), 8.86 (1H, d), 8.70 (1H, d), 8.50 (1H, d), 8.37 (1H, d), 8.26 (1H, d), 8.19-8.15 (3H, m), 7.96 (1H, t), 7.86-7.83 (2H, m), 7.73 (1H, d), 7.40 (1H, t), 7.36-7.28 (4H, m), 7.25 (1H, t), 7.20 (1H, dd), 6.75 (1H, t), 6.58-6.55 (2H, m), 6.20 (1H, d), 5.50 (1H, s), 0.89 (9H, s), 0.77 (9H, s)

In addition, the phosphorescence spectrum of Exemplified Compound Ir-114 in a dilute toluene solution state was measured in the same manner as in Synthesis Example 1. As a result, its peak wavelength was 612 nm. Further, the $T_{sub}$ of Exemplified Compound Ir-114 was determined in the same manner as in Example 1. As a result, the $T_{sub}$ was 270° C.

[Synthesis Example 3] Synthesis of Exemplified Compound Ir-125

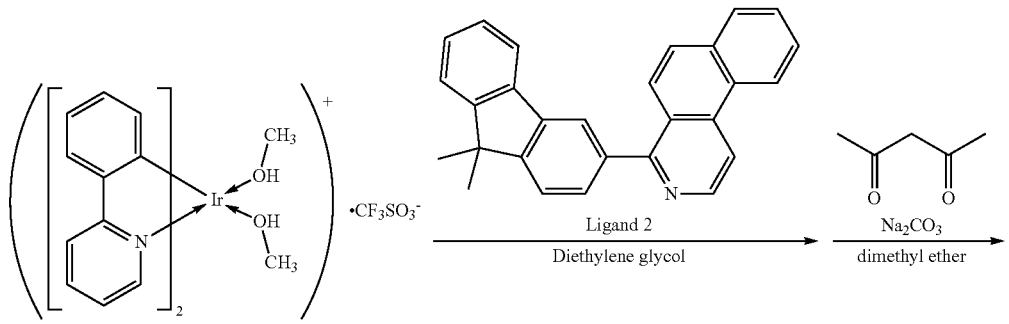

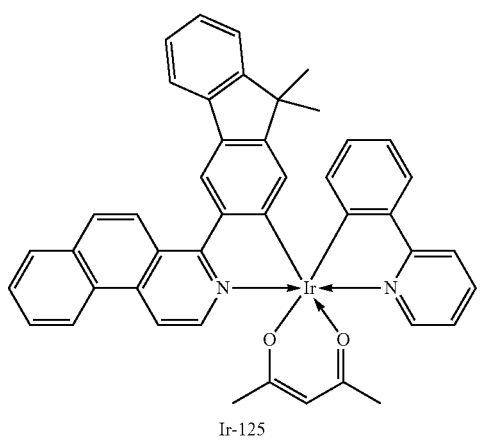

Ir-125

Exemplified Compound Ir-125 was obtained by the same method as that of Synthesis Example 1 with the exception that in Synthesis Example 1, Ligand 2 was used instead of Ligand 1. It is to be noted that Ligand 2 is a ligand synthesized with reference to PTL 3.

MALDI-TOF MS confirmed that the compound had an M$^+$ of 816.2.

In addition, the phosphorescence spectrum of Exemplified Compound Ir-125 in a dilute toluene solution state was measured in the same manner as in Synthesis Example 1. As a result, its peak wavelength was 613 nm.

[Synthesis Example 4] Synthesis of Exemplified Compound Ir-106 that in the section (2) of Synthesis Example 1, Intermediate 2 was used instead of Intermediate 1 and Ligand 3 was used instead of Ligand 1.

MALDI-TOF MS confirmed that the compound had an M$^+$ of 846.3.

Further, the structure of the compound was identified by $^1$H-NMR measurement.

$^1$H-NMR {(CD$_3$)$_2$S=O, 500 MHz} δ (ppm): 8.96-8.94 (1H, m), 8.85 (1H, d), 8.69 (1H, d), 8.58 (1H, d), 8.35 (1H, d), 8.28 (1H, d), 8.18-8.15 (2H, m), 8.06 (1H, d), 7.99 (1H, s), 7.87-7.85 (2H, m), 7.59 (2H, d), 7.48 (1H, dd), 7.36 (2H, t), 7.23 (1H, t), 6.82 (1H, dd), 6.53 (1H, d), 6.18 (1H, d), 6.03 (1H, d), 5.27 (1H, s), 2.23 (3H, s), 1.75 (3H, s), 1.68 (3H, s), 1.47 (9H, s)

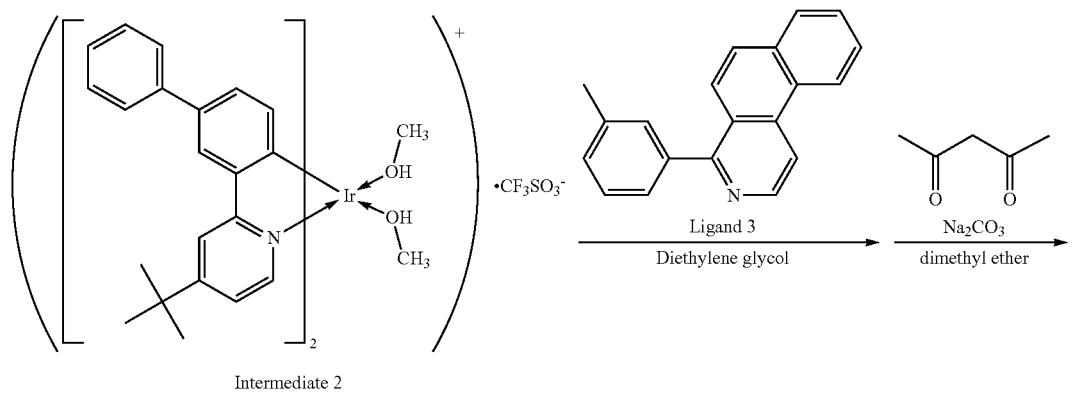

Intermediate 2

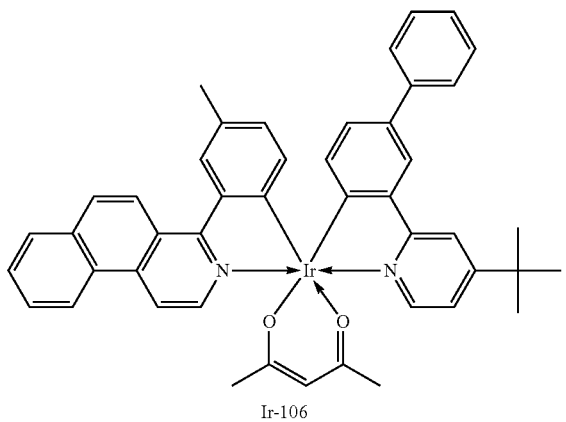

Ir-106

(1) Synthesis of Intermediate 2 and Ligand 3

Intermediate 2 (2-(biphenyl-3-yl)-4-tert-butylpyridine) was synthesized according to a method described in PTL 4. In addition, Ligand 3 was synthesized according to the method described in PTL 3.

(2) Synthesis of Exemplified Compound Ir-106

Exemplified Compound Ir-106 was obtained by the same method as that of Synthesis Example 1 with the exception In addition, the phosphorescence spectrum of Exemplified Compound Ir-106 in a dilute toluene solution state was measured in the same manner as in Synthesis Example 1. As a result, its peak wavelength was 606 nm.

Further, the T$_{sub}$ and T$_d$ of Exemplified Compound Ir-106 were determined in the same manner as in Synthesis Example 1. As a result, the T$_{sub}$ and the T$_d$ were 290° C. and 375° C., respectively.

[Synthesis Example 5] Synthesis of Exemplified Compound Ir-136

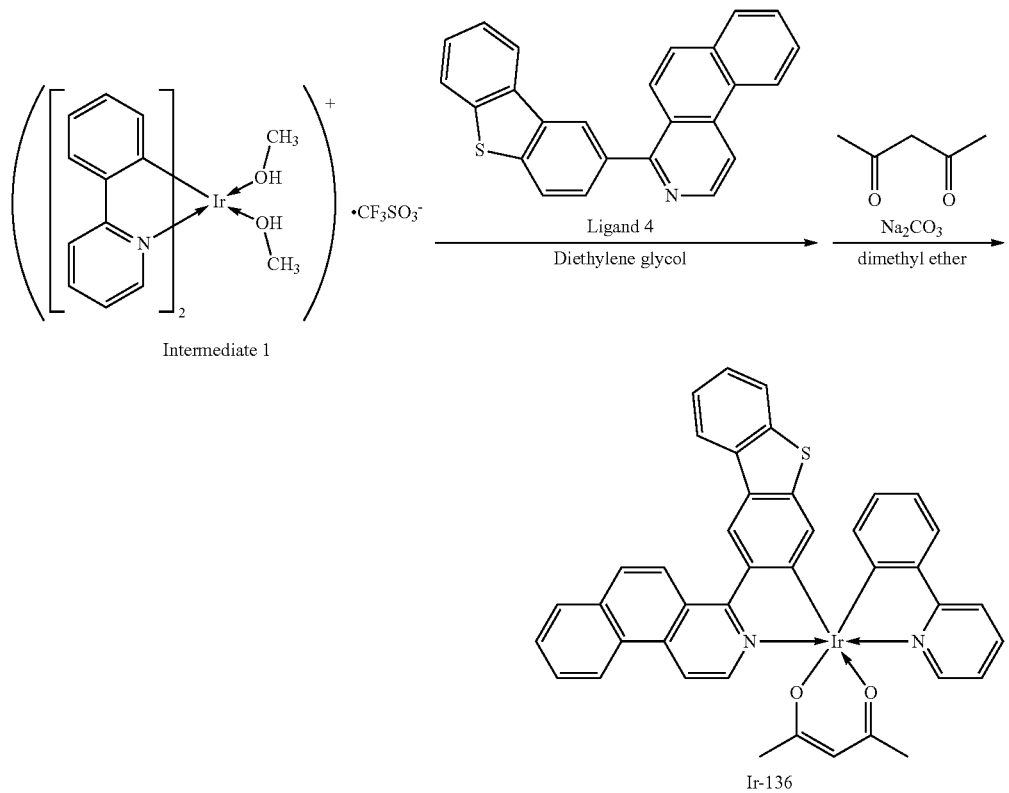

Intermediate 1

Ir-136

Exemplified Compound Ir-136 was obtained by the same method as that of Synthesis Example 1 with the exception that in Synthesis Example 1, Ligand 4 was used instead of Ligand 1. It is to be noted that Ligand 4 was synthesized according to the method described in PTL 3.

MALDI-TOF MS confirmed that the compound had an $M^+$ of 806.2.

In addition, the phosphorescence spectrum of Exemplified Compound Ir-136 in a dilute toluene solution state was measured in the same manner as in Synthesis Example 1. As a result, its peak wavelength was 610 nm.

[Synthesis Example 6] Synthesis of Exemplified Compound Ir-108

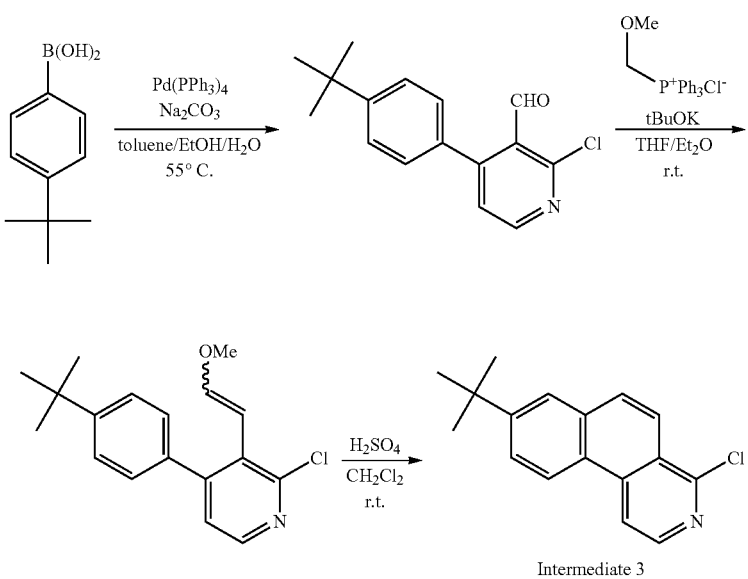

Intermediate 3

145

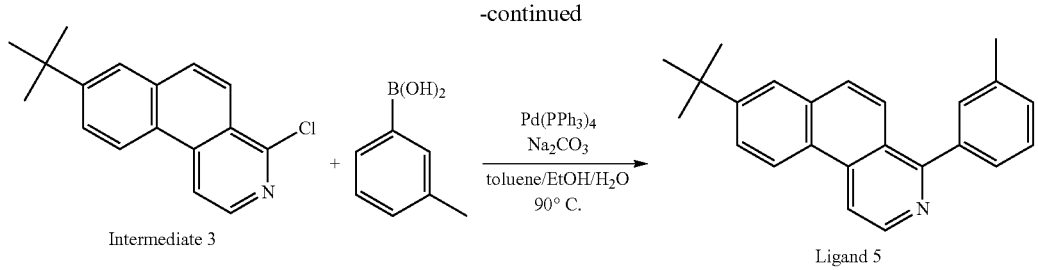

Intermediate 3

-continued

Ligand 5

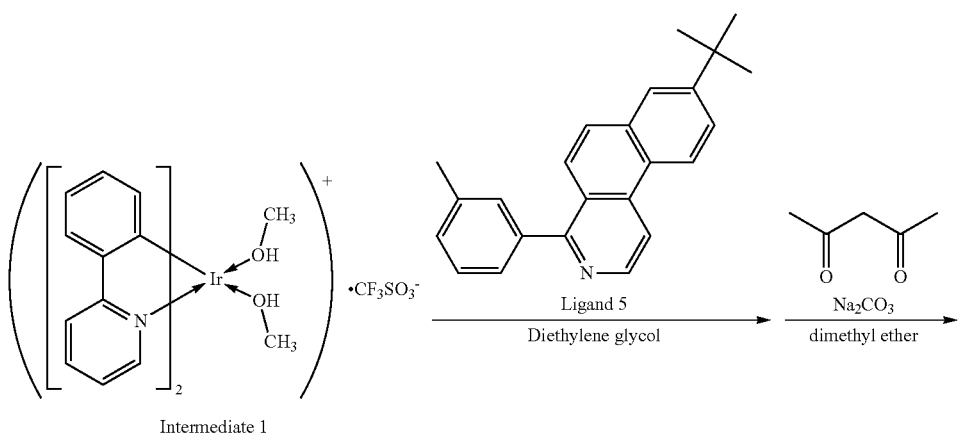

Intermediate 1

Ligand 5

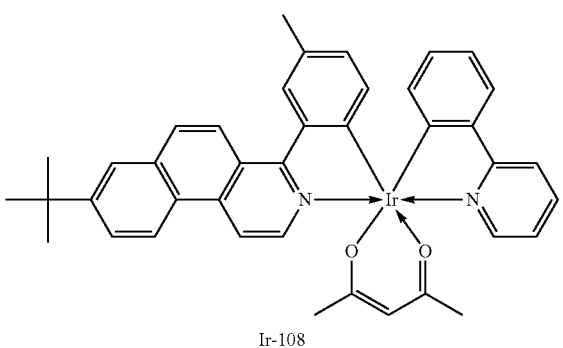

Ir-108

(1) Synthesis of Intermediate 3

Intermediate 3 was synthesized according to the synthesis scheme by using 2-chloro-4-iodonicotinaldehyde (manufactured by Shanghai P&T Fine Chemical) and 4-tert-butylphenylboronic acid (manufactured by Tokyo Chemical Industry Co., Ltd.) as starting raw materials.

(2) Synthesis of Ligand 5

Ligand 5 was synthesized according to the scheme by using Intermediate 3 and 3-methylphenylboronic acid (manufactured by Tokyo Chemical Industry Co., Ltd.).

(3) Synthesis of Exemplified Compound Ir-108

Exemplified Compound Ir-108 was obtained by the same method as that of Synthesis Example 1 with the exception that in the section (2) of Synthesis Example 1, Ligand 5 was used instead of Ligand 1.

MALDI-TOF MS confirmed that the compound had an $M^+$ of 770.3.

In addition, the phosphorescence spectrum of Exemplified Compound Ir-108 in a dilute toluene solution state was measured in the same manner as in Synthesis Example 1. As a result, its peak wavelength was 605 nm.

[Synthesis Example 7] Synthesis of Exemplified Compound Ir-134

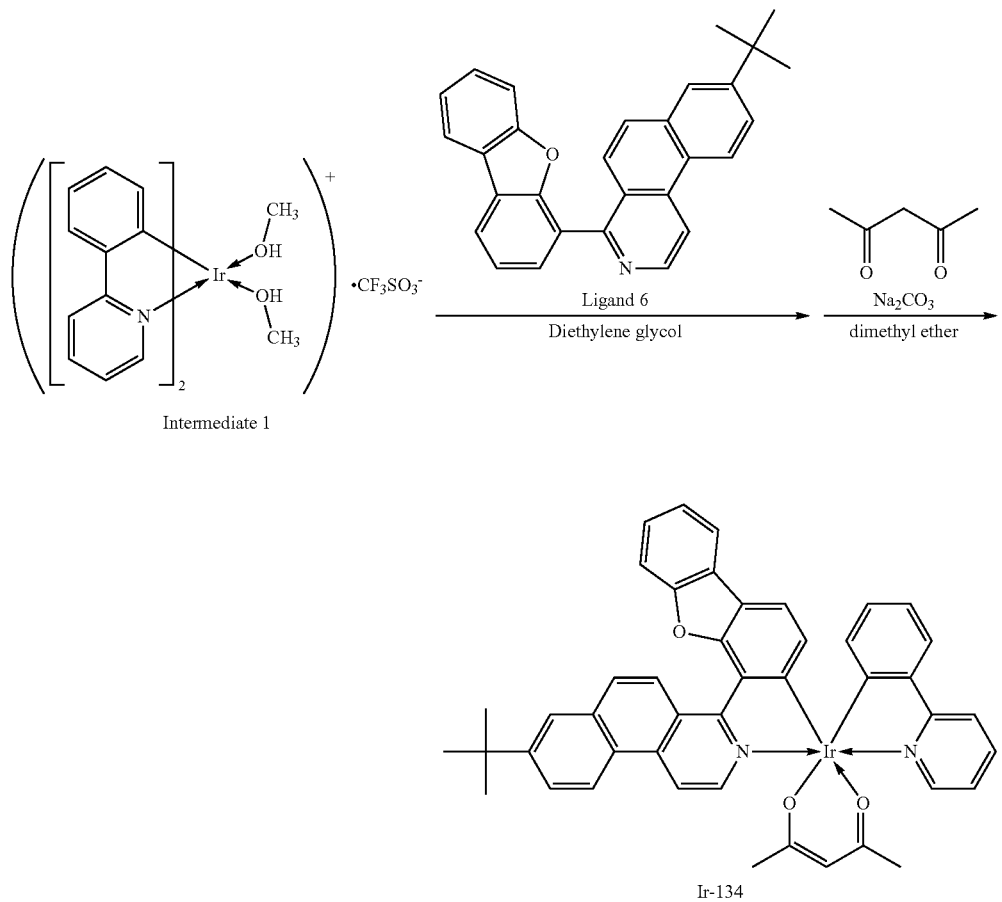

(1) Synthesis of Ligand 6

Ligand 6 was obtained by the same method as that of the section (2) of Synthesis Example 6 with the exception that in the section (2) of Synthesis Example 6, 4-(dibenzofuranyl)boronic acid (manufactured by Sigma-Aldrich) was used instead of 3-methylphenylboronic acid.

(2) Synthesis of Exemplified Compound Ir-134

Exemplified Compound Ir-134 was obtained by the same method as that of Synthesis Example 1 with the exception that in the section (2) of Synthesis Example 1, Ligand 6 was used instead of Ligand 1.

MALDI-TOF MS confirmed that the compound had an $M^+$ of 846.2.

In addition, the phosphorescence spectrum of Exemplified Compound Ir-134 in a dilute toluene solution state was measured in the same manner as in Synthesis Example 1. As a result, its peak wavelength was 608 nm.

[Synthesis Example 8] Synthesis of Exemplified Compound Ir-116

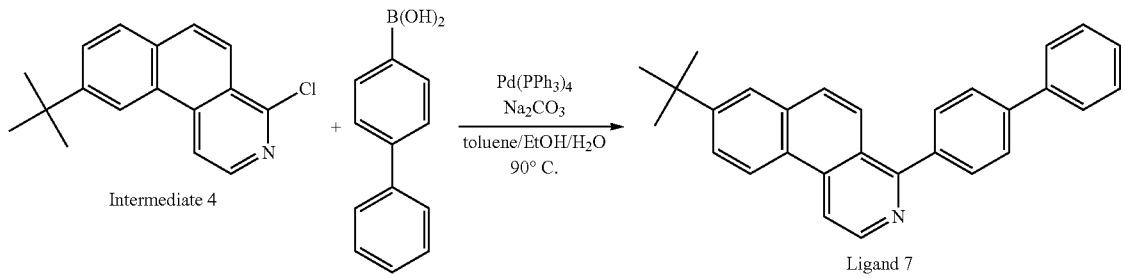

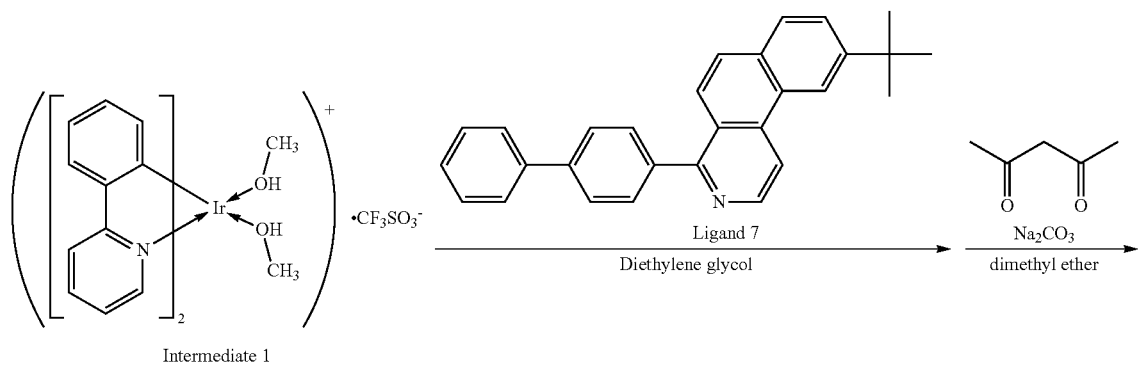

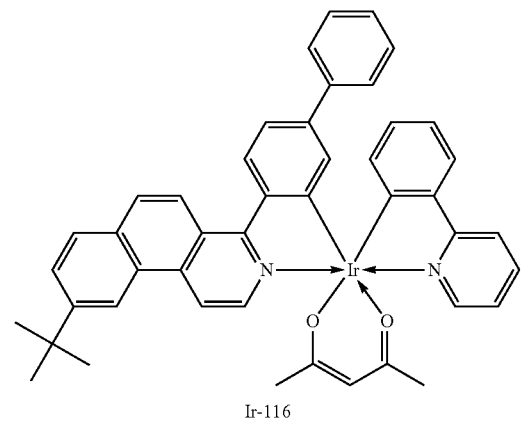

(1) Synthesis of Ligand 7

Intermediate 4 was obtained by the same method as that of the section (1) of Synthesis Example 6 with the exception that in the section (1) of Synthesis Example 6, 3-tert-butylphenylboronic acid (manufactured by Wako Pure Chemical Industries, Ltd.) was used instead of 4-tert-butylphenylboronic acid.

Next, Ligand 7 was obtained by the same method as that of the section (2) of Synthesis Example 6 with the exception that in the section (2) of Synthesis Example 6, Intermediate 4 was used instead of Intermediate 3 and 4-biphenylboronic acid (manufactured by Tokyo Chemical Industry Co., Ltd.) was used instead of 3-methylphenylboronic acid.

(2) Synthesis of Exemplified Compound Ir-116

Exemplified Compound Ir-116 was obtained by the same method as that of Synthesis Example 1 with the exception that in Synthesis Example 1, Ligand 7 was used instead of Ligand 1.

MALDI-TOF MS confirmed that the compound had an $M^+$ of 832.3.

In addition, the phosphorescence spectrum of Exemplified Compound Ir-116 in a dilute toluene solution state was measured in the same manner as in Synthesis Example 1. As a result, its peak wavelength was 609 nm.

[Synthesis Example 9] Synthesis of Exemplified Compound Ir-201

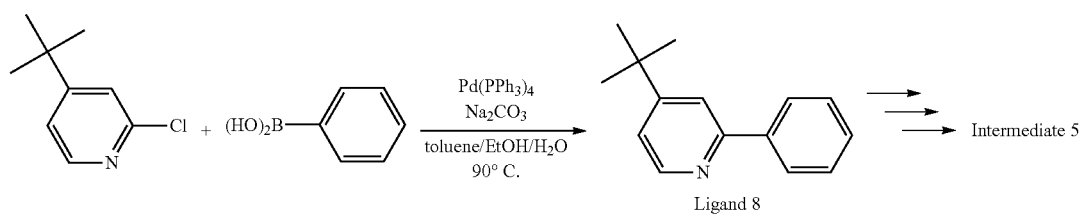

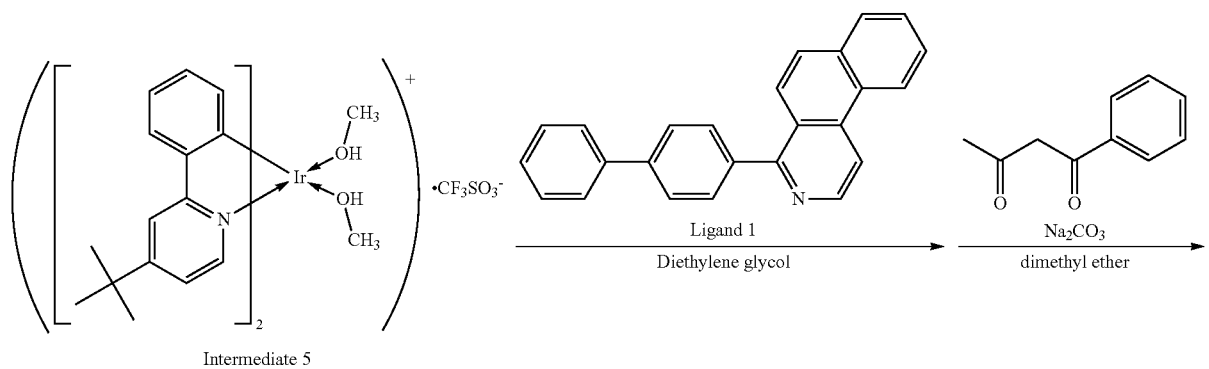

Intermediate 5

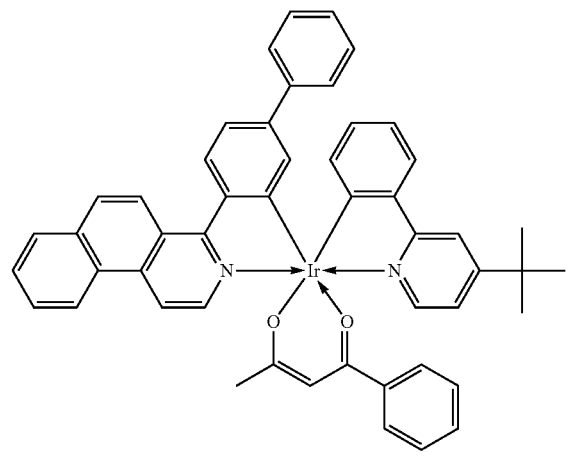

Ir-201

(1) Synthesis of Ligand 8

Ligand 8 was synthesized according to the scheme by using 2-chloro-4-tert-butylpyridine synthesized by the method described in NPL 1 and phenylboronic acid (Tokyo Chemical Industry Co., Ltd.) as starting raw materials.

(2) Synthesis of Exemplified Compound Ir-201

Intermediate 5 was obtained by the same method as that of the section (1) of Synthesis Example 1 with the exception that in the section (1) of Synthesis Example 1, 2-phenyl-4-tert-butylpyridine was used instead of 2-phenylpyridine.

Next, Exemplified Compound Ir-201 was obtained by the same method as that of Synthesis Example 1 with the exception that in the section (2) of Synthesis Example 1, Intermediate 5 was used instead of Intermediate 1 and 1-phenyl-1,3-butanedione (manufactured by Tokyo Chemical Industry Co., Ltd.) was used instead of acetylacetone.

MALDI-TOF MS confirmed that the compound had an M⁺ of 894.3.

In addition, the phosphorescence spectrum of Exemplified Compound Ir-201 in a dilute toluene solution state was measured in the same manner as in Synthesis Example 1. As a result, its peak wavelength was 610 nm.

[Synthesis Example 10] Synthesis of Exemplified Compound Ir-204

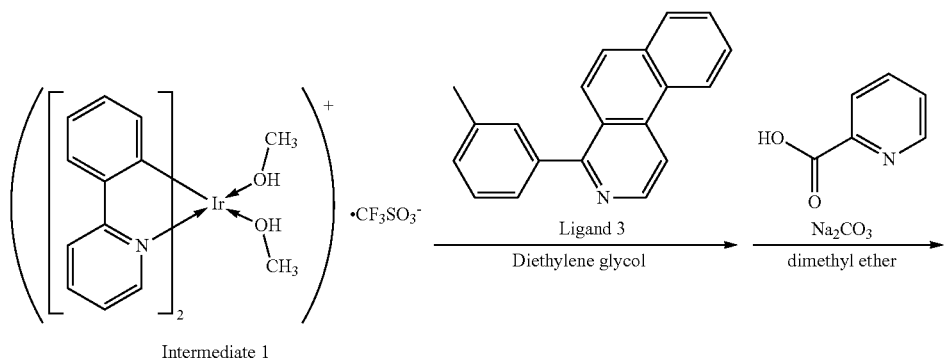

Intermediate 1

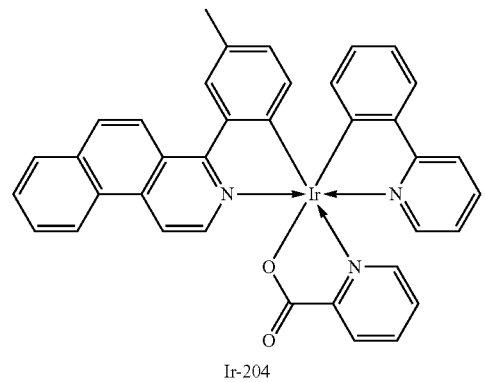

Ir-204

Exemplified Compound Ir-204 was obtained by the same method as that of Synthesis Example 1 with the exception that in the section (2) of Synthesis Example 1, Ligand 3 was used instead of Ligand 1 and pyridine-2-carboxylic acid (manufactured by Tokyo Chemical Industry Co., Ltd.) was used instead of acetylacetone.

MALDI-TOF MS confirmed that the compound had an $M^+$ of 737.2.

In addition, the phosphorescence spectrum of a dilute toluene solution of Exemplified Compound Ir-204 was measured in the same manner as in Synthesis Example 1. As a result, its peak wavelength was 597 nm.

[Synthesis Examples 11 to 13] Synthesis of Exemplified Compounds H-108, H-131, and H-139

Exemplified Compounds H-108, H-131, and H-139 were each synthesized according to the following synthesis scheme with 4-dibenzothiopheneboronic acid as a starting raw material by employing a cross-coupling reaction involving using a Pd catalyst.

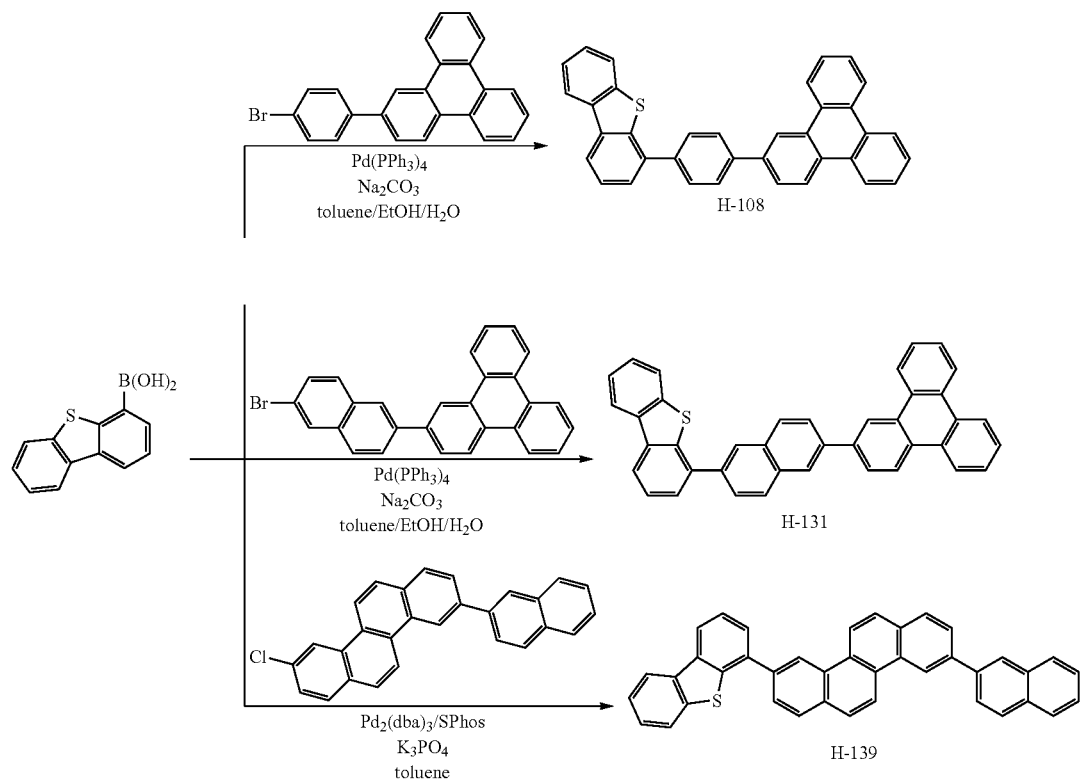

The resultant compounds (Exemplified Compounds H-108, H-131, and H-139) were identified by MALDI-TOF-MS. As a result, it was confirmed that Exemplified Compounds H-108, H-131, and H-139 had M$^+$'s of 486.1, 536.2, and 536.2, respectively.

<Synthesis Examples 14 and 15> Synthesis of Exemplified Compounds H-206 and H-210

Exemplified Compounds H-206 and H-210 were each synthesized according to the following synthesis scheme by synthesizing benzo[b]naphtho[2,1-d]thiophene-10-boronic acid and then performing a cross-coupling reaction involving using a Pd catalyst.

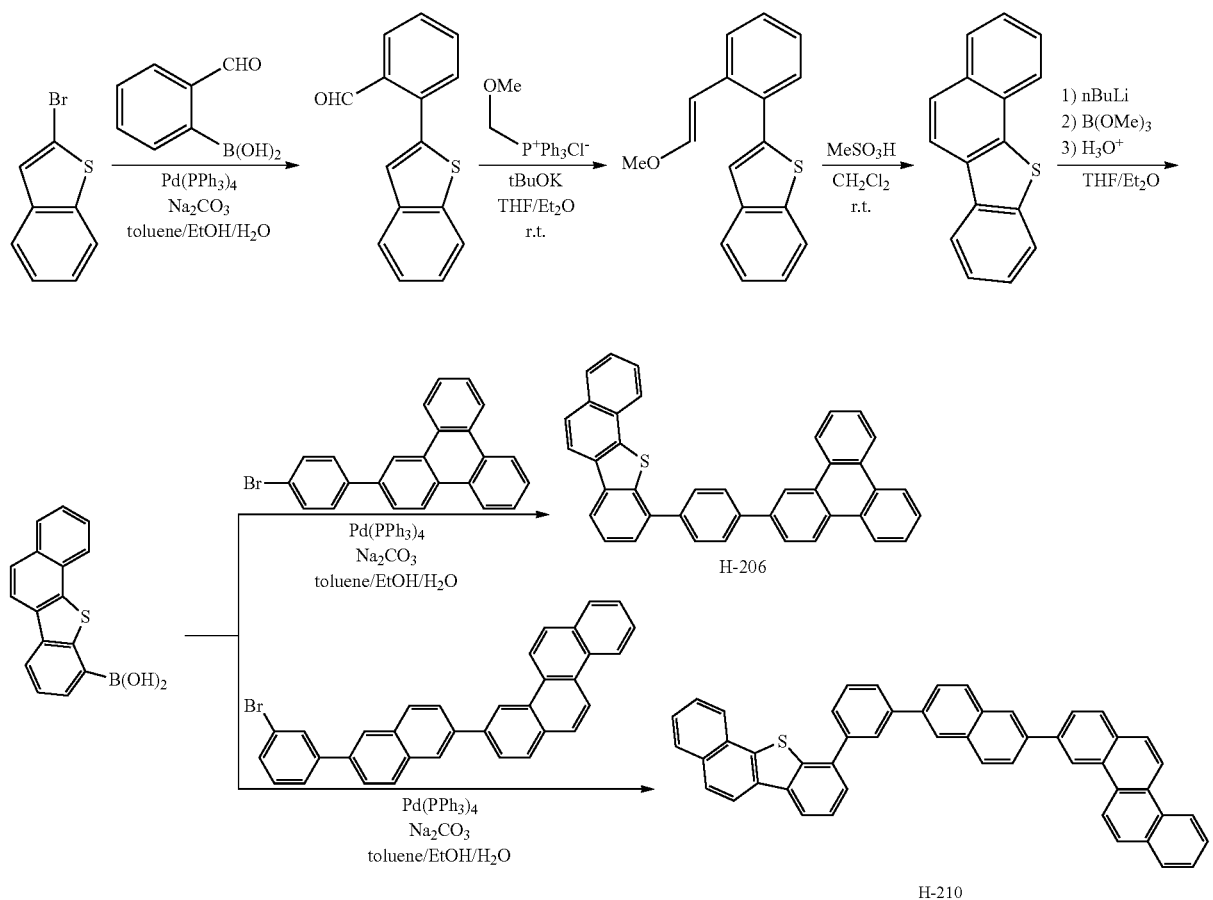

The resultant compounds (Exemplified Compounds H-206 and H-210) were identified by MALDI-TOF-MS. As a result, it was confirmed that Exemplified Compounds H-206 and H-210 had M$^+$'s of 536.2 and 662.2, respectively.

<Synthesis Examples 16 and 17> Synthesis of Exemplified Compounds H-317 and H-322

Exemplified Compounds H-317 and H-322 were each synthesized according to the following synthesis scheme by synthesizing 2-chrolobenzo[b]phenanthro[3,4-d]thiophene and then performing a cross-coupling reaction involving using a Pd catalyst.

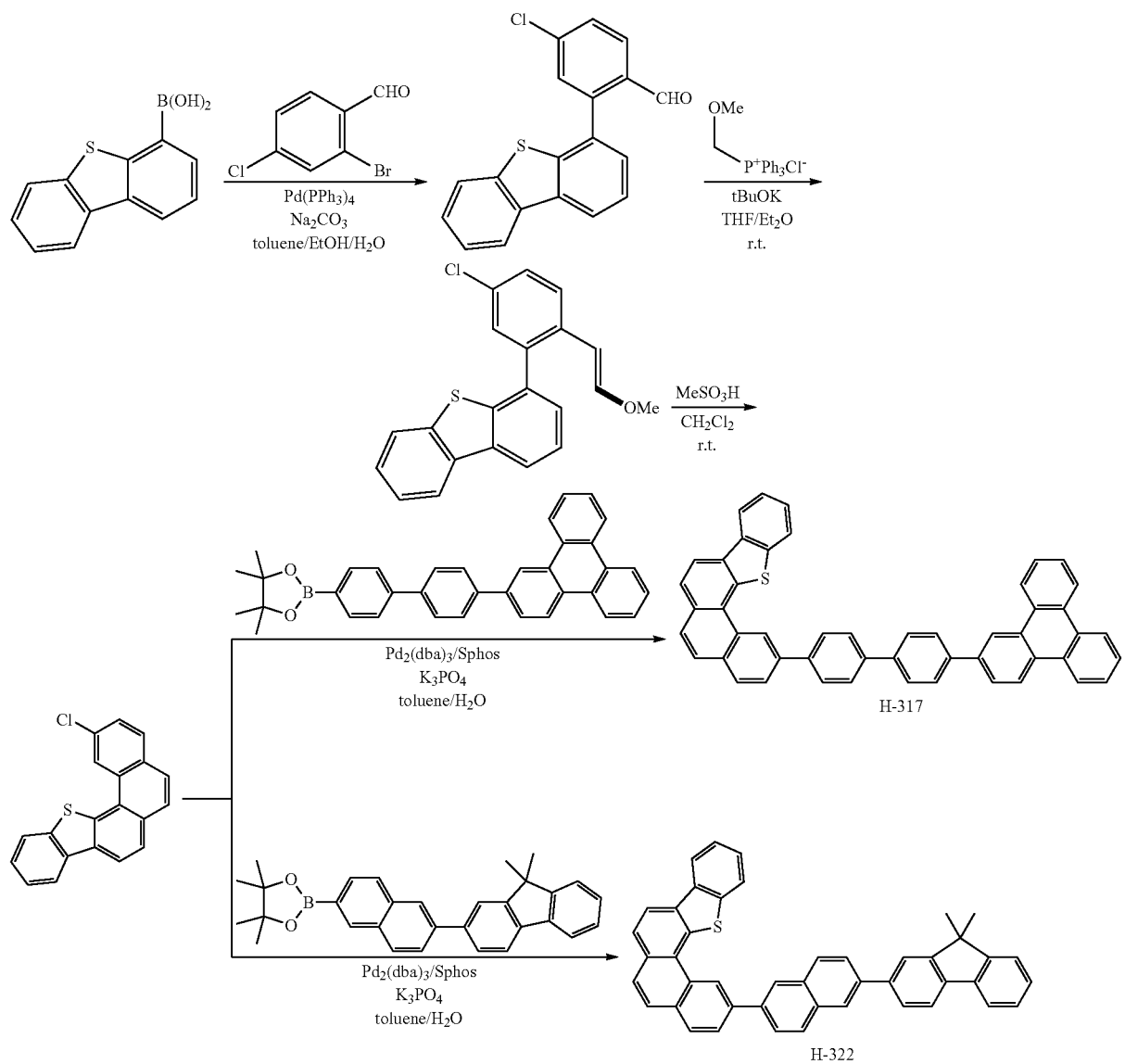

The resultant compounds (Exemplified Compounds H-317 and H-322) were identified by MALDI-TOF-MS. As a result, it was confirmed that Exemplified Compounds H-317 and H-322 had M+'s of 662.2 and 602.2, respectively.

[Synthesis Examples 18 to 20] Synthesis of Exemplified Compounds H-401, H-422, and H-424

Dibenzo[b,mn]xanthene-7-boronic acid was synthesized according to the following synthesis scheme with reference to NPL 1. Subsequently, Exemplified Compounds H-401, H-422, and H-424 were each synthesized by performing a cross-coupling reaction involving using a Pd catalyst.

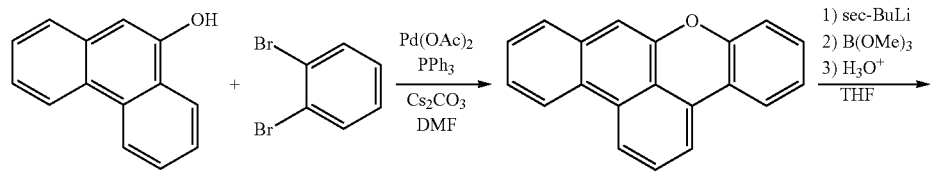

-continued

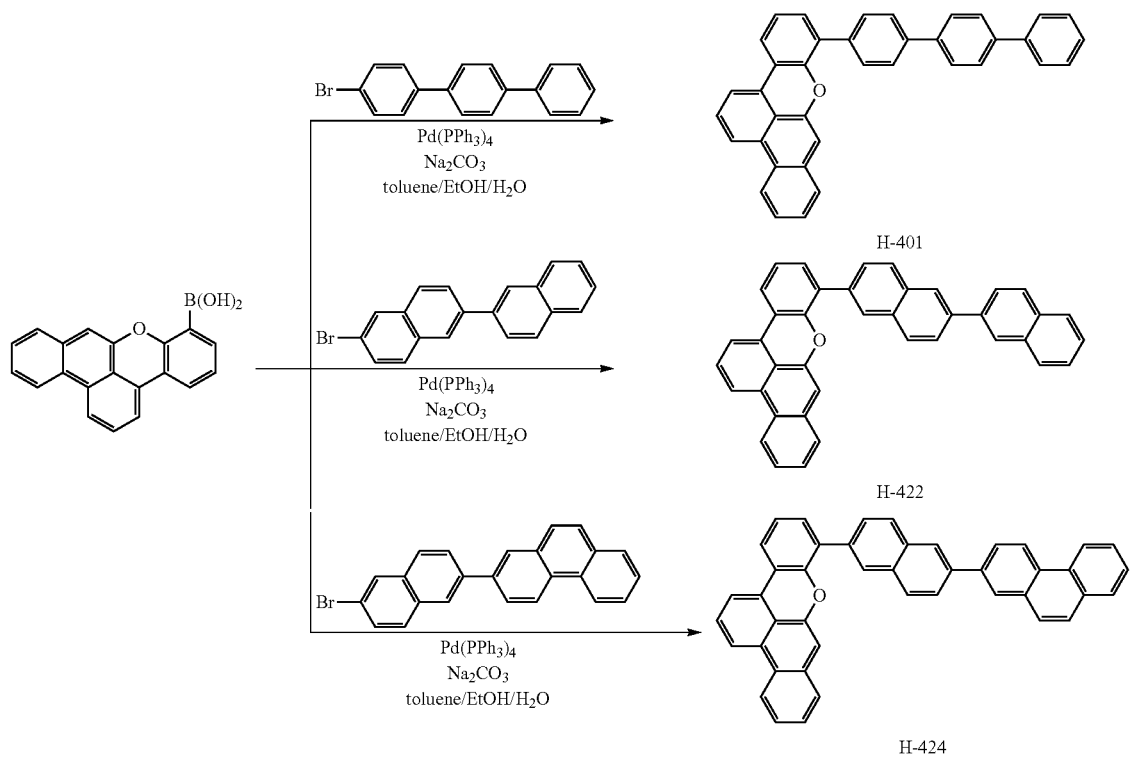

The resultant compounds (Exemplified Compounds H-401, H-422, and H-424) were identified by MALDI-TOF-MS. As a result, it was confirmed that Exemplified Compounds H-401, H-422, and H-424 had M$^+$'s of 496.2, 520.2, and 570.2, respectively.

[Synthesis Example 21] Synthesis of Exemplified Compound H-439

Exemplified Compound H-439 was synthesized by the same method as that of Synthesis Example 19 with the exception that in Synthesis Example 19, the starting raw material was changed from 9-hydroxyphenanthrene to 3,6-dimethylphenanthrene-9-ol. The resultant compound (Exemplified Compound H-439) was identified by MALDI-TOF-MS. As a result, it was confirmed that Exemplified Compound H-439 had an M$^+$ of 548.2.

[Synthesis Examples 22 to 24] Synthesis of Exemplified Compounds H-507, H-508, and H-509

Exemplified Compounds H-507, H-508, and H-509 were each synthesized according to the following synthesis scheme by synthesizing 5-chrolodibenzo[b,mn]xanthene and then performing a cross-coupling reaction involving using a Pd catalyst.

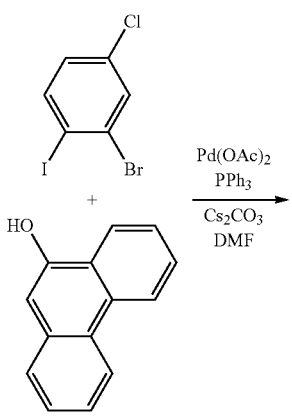

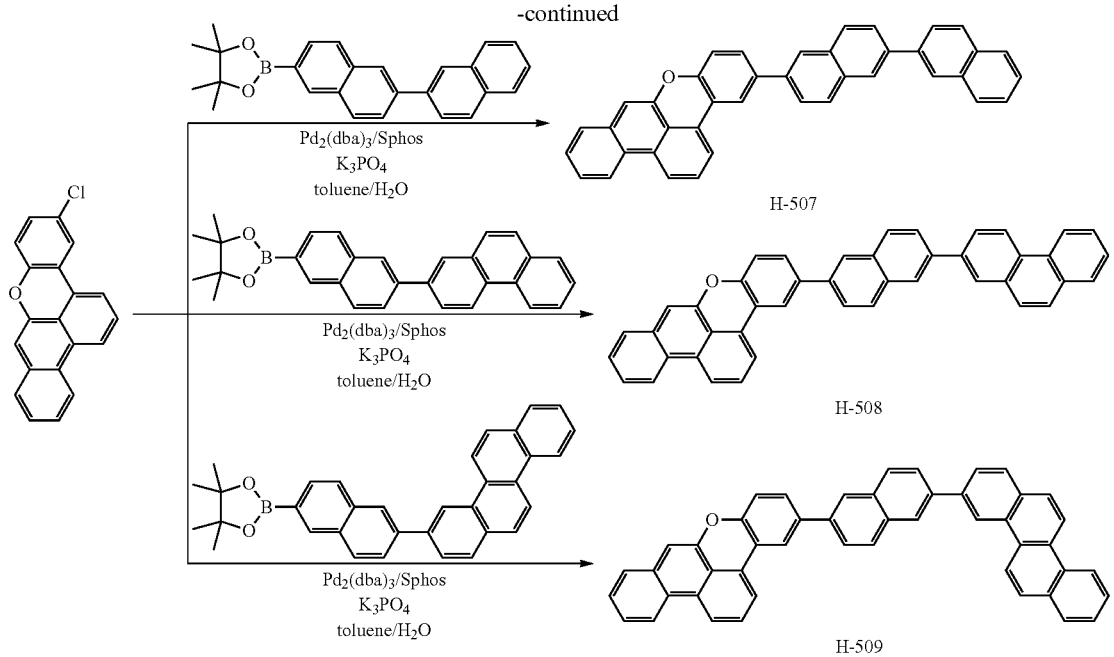

The resultant compounds (Exemplified Compounds H-507, H-508, and H-509) were identified by MALDI-TOF-MS. As a result, it was confirmed that Exemplified Compounds H-507, H-508, and H-509 had $M^+$'s of 520.2, 570.2, and 620.2, respectively.

[Synthesis Example 25] Synthesis of Exemplified Compound H-629

Exemplified Compound H-629 was synthesized by the same method as that of Synthesis Example 22 with the exception that in Synthesis Example 14, the starting raw material was changed from 2-bromobenzo[b]thiophene to 2-bromobenzofuran.

The resultant compound (Exemplified Compound H-629) was identified by MALDI-TOF-MS. As a result, it was confirmed that Exemplified Compound H-629 had an $M^+$ of 520.2.

[Synthesis Example 26] Synthesis of Exemplified Compound H-712

Exemplified Compound H-712 was synthesized according to the following synthesis scheme.

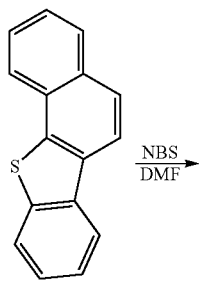

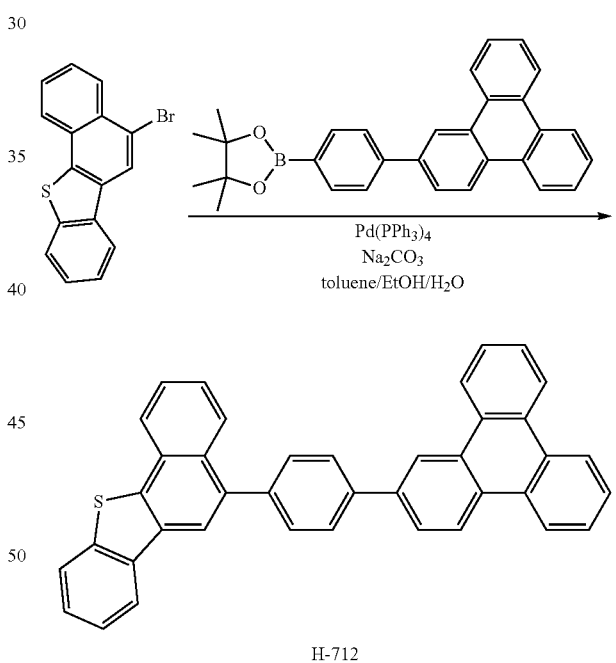

Specifically, 5-bromobenzo[b]naphtho[2,1-d]thiophene was synthesized from benzo[b]naphtho[2,1-d]thiophene obtained as an intermediate in each of Synthesis Examples 14 and 15 with reference to PTL 4. Subsequently, Exemplified Compound H-712 was synthesized by performing a cross-coupling reaction involving using a Pd catalyst.

The resultant compound (Exemplified Compound H-712) was identified by MALDI-TOF-MS. As a result, it was confirmed that Exemplified Compound H-712 had an $M^+$ of 536.2.

[Synthesis Example 27] Synthesis of Exemplified Compound H-905

Exemplified Compound H-905 was synthesized according to the method described in PTL 5.

Example 1

Production of Organic Light-Emitting Element

In this example, an organic light-emitting element having a construction in which an anode, a hole injection layer, a hole transport layer, an emission layer, a hole/exciton blocking layer, an electron transport layer, and a cathode were formed on a substrate in the stated order was produced by the following method.

ITO was formed into a film on a glass substrate by a sputtering method to form an anode. At this time, the thickness of the anode was set to 100 nm. The substrate on which the anode had been thus formed was used as a transparent conductive supporting substrate (ITO substrate) in the following steps.

Next, organic compound layers and electrode layers shown below were continuously formed on the ITO substrate by a vacuum deposition method involving utilizing resistance heating in a vacuum chamber at $1\times10^{-5}$ Pa. At this time, the formation was performed so that the electrode area of an opposing electrode (metal electrode layer or cathode) became 3 mm$^2$.

TABLE 3

|  | Material | Thickness (nm) |
|---|---|---|
| Hole injection layer | HT-1 | 50 |
| Hole transport layer | HT-8 | 10 |
| Emission layer | Host: H-108<br>Guest: Ir-113<br>(H-108:Ir-113 = 95:5<br>(weight ratio)) | 30 |
| Hole/exciton blocking layer | ET-3 | 10 |
| Electron transport layer | ET-2 | 50 |
| First metal electrode layer | LiF | 0.5 |
| Second metal electrode layer | Al | 100 |

Finally, the produced element was sealed with a glass cap with a moisture absorbent in an inert atmosphere to provide an organic light-emitting element.

The current-voltage characteristics of the resultant organic light-emitting element were measured with an ammeter 2700 manufactured by Keithley Instruments, and its emission luminance was measured with a BM7-fast manufactured by TOPCON CORPORATION. Table 4 shows a light-emitting efficiency when a current having a density of 10 mA/cm$^2$ was applied by using the ITO electrode as a positive electrode and the Al electrode as a negative electrode, and a luminance half-life when a current having a density of 100 mA/cm$^2$ was applied.

In addition, when a current having a density of 10 mA/cm$^2$ was applied, an emission peak wavelength was 616 nm and CIE chromaticity coordinates (x, y) were (0.66, 0.34). In other words, a good red color was shown.

Examples 2 to 12

Organic light-emitting elements were each obtained by the same method as that of Example 11 with the exception that in Example 11, the host and the guest were each changed to a material shown in Table 4.

The resultant organic light-emitting elements were evaluated in the same manner as in Example 11. As a result, good red light emission was observed in each of the elements. Here, Table 4 shows a light-emitting efficiency when a current having a density of 10 mA/cm$^2$ was applied and a luminance half-life when a current having a density of 100 mA/cm$^2$ was applied.

Examples 13 to 18

Organic light-emitting elements were each obtained by the same method as that of Example 1 with the exception that in Example 1, the host, guest, and third component shown in Table 4 below were used upon formation of the emission layer. It is to be noted that a weight ratio "host:guest:third component" among the host, guest, and third component in the emission layer is 75:5:20.

The resultant organic light-emitting elements were evaluated in the same manner as in Example 1. As a result, good red light emission was observed in each of the elements. Here, Table 4 shows a light-emitting efficiency when a current having a density of 10 mA/cm$^2$ was applied and a luminance half-life when a current having a density of 100 mA/cm$^2$ was applied.

TABLE 4

|  | Host | Guest | Third component | Light-emitting efficiency (cd/A) | Luminance half-life (h) |
|---|---|---|---|---|---|
| Example 1 | H-108 | Ir-113 | — | 24 | 410 |
| Example 2 | H-712 | Ir-114 | — | 24 | 140 |
| Example 3 | H-507 | Ir-125 | — | 27 | 580 |
| Example 4 | H-509 | Ir-106 | — | 28 | 360 |
| Example 5 | H-322 | Ir-136 | — | 22 | 370 |
| Example 6 | H-508 | Ir-108 | — | 28 | 600 |
| Example 7 | H-439 | Ir-134 | — | 20 | 180 |
| Example 8 | H-424 | Ir-116 | — | 23 | 620 |
| Example 9 | H-131 | Ir-201 | — | 22 | 290 |
| Example 10 | H-210 | Ir-204 | — | 21 | 150 |
| Example 11 | H-629 | Ir-106 | — | 27 | 300 |
| Example 12 | H-139 | Ir-125 | — | 26 | 530 |
| Example 13 | H-801 | Ir-113 | N-103 | 20 | 120 |
| Example 14 | H-401 | Ir-106 | M-103 | 31 | 460 |
| Example 15 | H-422 | Ir-113 | M-105 | 29 | 710 |
| Example 16 | H-905 | Ir-116 | N-104 | 21 | 120 |
| Example 17 | H-206 | Ir-125 | O-101 | 27 | 520 |
| Example 18 | H-317 | Ir-136 | O-104 | 25 | 480 |

Example 19

In this example, a top emission-type organic light-emitting element was produced by a method described below.

First, Al was formed into a film on a glass substrate (transparent substrate) by a sputtering method to produce an Al layer. Next, an indium zinc oxide was formed into a film on the Al layer by the sputtering method to form a transparent electrode layer. At this time, the thickness of the transparent electrode layer was set to 80 nm. It is to be noted that a stack formed of the Al layer and the transparent electrode layer functions as an anode. Next, an acrylic resin was formed into a film on the anode and then the acrylic resin was subjected to patterning to form a pixel separation film. Thus, the substrate with the anode was obtained. It is to be noted that the area of the anode became 3 mm$^2$ as a result of the formation of the pixel separation film. Next, organic compound layers and an electrode layer (cathode) shown in Table 5 below were formed on the substrate with the anode by a vacuum deposition method involving utilizing resistance heating in a vacuum chamber at $1 \times 10^{-5}$ Pa.

TABLE 5

| | Material | Thickness [nm] |
|---|---|---|
| Hole injection layer | HT-1 | 50 |
| Hole transport layer | HT-8 | 10 |
| Emission layer | Host: H-422 | 30 |
| | Guest: Ir-106 | |
| | Third component: M-103 | |
| | (Host:Guest:Third | |
| | component = 75:5:25 | |
| | (weight ratio)) | |
| Hole/exciton blocking layer | ET-3 | 10 |
| Electron transport layer | ET-2, cesium carbonate (ET-2:Cs$_2$CO$_3$ = 97:3) | 50 |
| Transparent electrode layer | Indium zinc oxide | 30 |

Finally, the produced element was sealed with a glass cap with a moisture absorbent in an inert atmosphere to provide an organic light-emitting element.

The element performance of the resultant organic light-emitting element was measured and evaluated in the same manner as in Example 1. As a result, its light-emitting efficiency when a current having a density of 10 mA/cm$^2$ was applied was 36 cd/A.

It was understood that an organic light-emitting element showing good light-emitting efficiency and a good element lifetime was obtained by incorporating, into its emission layer, the iridium complex according to the present invention as a guest and an aromatic hydrocarbon compound having a predetermined structure as a host as described above.

As described above with reference to the embodiments and Examples, according to the present invention, it is possible to provide the organic light-emitting element having high light-emitting efficiency and a long element lifetime.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-008464, filed on Jan. 21, 2013, which is hereby incorporated by reference herein in its entirety.

The invention claimed is:

1. An organic light-emitting element comprising:
an anode;
a cathode; and
an organic compound layer placed between the anode and the cathode,
wherein the organic compound layer includes an emission layer;
wherein the emission layer includes at least a host and a guest;
wherein the guest comprises an iridium complex represented by the following general formula [1];
wherein the host comprises a heterocycle-containing compound; and
wherein a content of the host is 50 wt % or more with reference to a total amount of constituent materials for the emission layer:

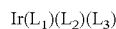
$$Ir(L_1)(L_2)(L_3) \qquad [1]$$

wherein in the general formula [1], a partial structure IrL$_1$ comprises a partial structure represented by the following general formula [2]:

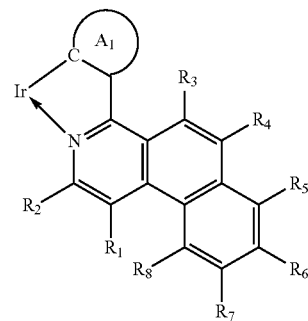

[2]

wherein in the general formula [2]:
a ring A$_1$ represents an aromatic ring or an aromatic heterocycle, and the aromatic ring and aromatic heterocycle each represented by the ring A$_1$ may each further have a substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group; and
R$_1$ to R$_8$ each represent a hydrogen atom, an alkyl group having 1 or more and 4 or less carbon atoms, an aralkyl group, an aryl group, a heterocyclic group, a substituted amino group, an alkoxy group, an aryloxy group, a halogen atom, or a cyano group, and may be identical to or different from one another, and when any one of substituents represented by the R$_1$ to R$_8$ is an alkyl group having 1 or more and 4 or less carbon atoms, an aralkyl group, an aryl group, a heterocyclic group, a substituted amino group, an alkoxy group, or an aryloxy group, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group;

wherein in the general formula [1], a partial structure IrL$_2$ comprises a partial structure represented by the following general formula [3]:

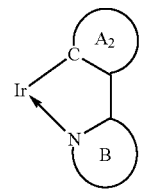

[3]

wherein in the general formula [3]:
  a ring $A_2$ represents an aromatic ring or an aromatic heterocycle, and the aromatic ring and aromatic heterocycle each represented by the ring $A_2$ may each further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group; and
  a ring B represents a nitrogen-containing aromatic heterocycle, and the nitrogen-containing aromatic heterocycle represented by the ring B may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group;
wherein $L_1$ and $L_2$ represent ligands that are different from each other;
wherein in the general formula [1], $L_3$ represents a monovalent bidentate ligand having a first atom that forms a coordinate bond with iridium and is selected from N, O, S, and P, and a second atom that forms a coordinate bond with iridium and is selected from N, O, S, and P, and the first atom and the second atom may be identical to or different from each other.

2. The organic light-emitting element according to claim 1, wherein the ring $A_1$ is a benzene ring, a naphthalene ring, a fluorene ring, a phenanthrene ring, a carbazole ring, a dibenzofuran ring, or a dibenzothiophene ring; and
  wherein the ring $A_1$ may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

3. The organic light-emitting element according to claim 1, wherein the partial structure represented by the general formula [2] comprises a partial structure represented by the following general formula [4]:

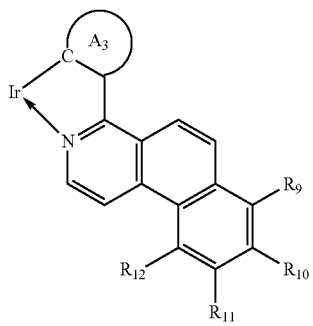

[4]

wherein in the general formula [4]:
  a ring $A_3$ is a benzene ring, a naphthalene ring, a fluorene ring, a phenanthrene ring, a carbazole ring, a dibenzofuran ring, or a dibenzothiophene ring, and the ring $A_3$ may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group; and $R_9$ to $R_{12}$ each represent a hydrogen atom, an alkyl group having 1 or more and 4 or less carbon atoms, or a phenyl group, and when any one of substituents represented by $R_9$ to $R_{12}$ is an alkyl group having 1 or more and 4 or less carbon atoms, or a phenyl group, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group, and $R_9$ to $R_{12}$ may be identical to or different from one another.

4. The organic light-emitting element according to claim 1, wherein the ring $A_2$ is a benzene ring, a naphthalene ring, a fluorene ring, a phenanthrene ring, a carbazole ring, a dibenzofuran ring, or a dibenzothiophene ring;
  wherein the ring $A_2$ may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group;
  wherein the ring B is a pyridine ring, a quinoline ring, an isoquinoline ring, a benzo[f]quinoline ring, a benzo[h]quinoline ring, a benzo[f]isoquinoline ring, a benzo[h]isoquinoline ring, an oxazole ring, a benzo[d]oxazole ring, a benzo[d]thiazole ring, or an imidazole ring; and
  wherein the ring B may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

5. The organic light-emitting element according to claim 1, wherein the partial structure represented by $IrL_1$ comprises a partial structure represented by the following general formula [22]:

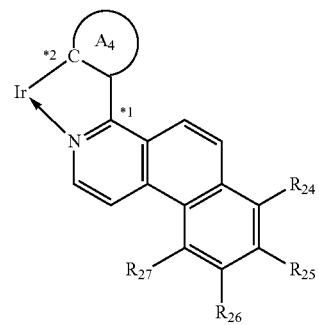

[22]

wherein in the general formula [22]:
  a ring $A_4$ represents any one of partial structures represented by the following general formulae [23] to [27];
  *1 represents a bond between the ring $A_4$ and a benzo[f]isoquinoline skeleton and *2 represents a bond between the ring $A_4$ and an Ir metal; and
  $R_{24}$ to $R_{27}$ each represent a hydrogen atom, an alkyl group having 1 or more and 4 or less carbon atoms, or a phenyl group, and may be identical to or different from one another, and when any one of substituents represented by $R_{24}$ to $R_{27}$ is an alkyl group having 1 or more and 4 or less carbon atoms or a phenyl group, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group:

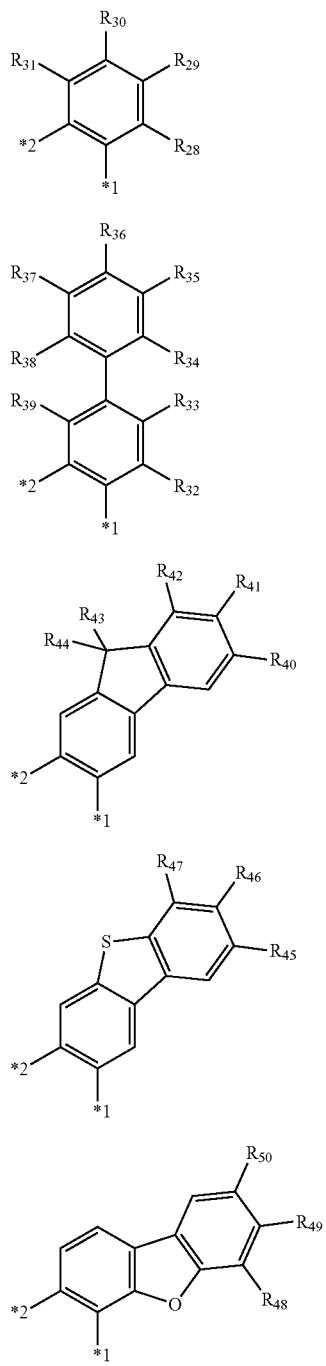

wherein in the general formulae [23] to [27], $R_{28}$ to $R_{50}$ each represent a hydrogen atom, an alkyl group having 1 or more and 4 or less carbon atoms, an aralkyl group, an aryl group, a heterocyclic group, a substituted amino group, an alkoxy group, an aryloxy group, a halogen atom, or a cyano group, and when any one of substituents represented by $R_{28}$ to $R_{50}$ is an alkyl group having 1 or more and 4 or less carbon atoms, an aralkyl group, an aryl group, a heterocyclic group, a substituted amino group, an alkoxy group, or an aryloxy group, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

6. The organic light-emitting element according to claim 1, wherein the partial structure represented by the general formula [3] comprises a partial structure represented by the following general formula [5]:

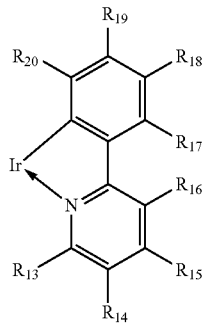

wherein in the general formula [5], $R_{13}$ to $R_{20}$ each represent a hydrogen atom, an alkyl group having 1 or more and 4 or less carbon atoms, an aralkyl group, an aryl group, a heterocyclic group, a substituted amino group, an alkoxy group, an aryloxy group, a halogen atom, or a cyano group, and may be identical to or different from one another, and when any one of substituents represented by $R_{13}$ to $R_{20}$ is an alkyl group having 1 or more and 4 or less carbon atoms, an aralkyl group, an aryl group, a heterocyclic group, a substituted amino group, an alkoxy group, or an aryloxy group, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

7. The organic light-emitting element according to claim 6, wherein the $R_{13}$ to $R_{20}$ each represent a hydrogen atom, an alkyl group having 1 or more and 4 or less carbon atoms, or a phenyl group; and wherein the $R_{13}$ to $R_{20}$ may be identical to or different from one another, and when any one of the substituents represented by the $R_{13}$ to $R_{20}$ is an alkyl group having 1 or more and 4 or less carbon atoms, or a phenyl group, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

8. The organic light-emitting element according to claim 1, wherein in the general formula [1], a partial structure $IrL_3$ comprises a partial structure represented by the following general formula [6]:

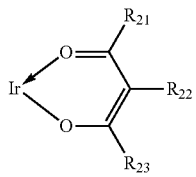

[6]

wherein in the general formula [6], $R_{21}$ to $R_{23}$ each represent a hydrogen atom, an alkyl group having 1 or more and 4 or less carbon atoms, an aralkyl group, an aryl group, a heterocyclic group, a substituted amino group, an alkoxy group, an aryloxy group, a halogen atom, or a cyano group, and may be identical to or different from one another, and when any one of substituents represented by $R_{21}$ to $R_{23}$ is an alkyl group having 1 or more and 4 or less carbon atoms, an aralkyl group, an aryl group, a heterocyclic group, a substituted amino group, an alkoxy group, or an aryloxy group, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

9. The organic light-emitting element according to claim 8, wherein the $R_{21}$ to $R_{23}$ each represent a hydrogen atom or an alkyl group having 1 or more and 4 or less carbon atoms; and wherein when any one of the substituents represented by the $R_{21}$ to $R_{23}$ is an alkyl group having 1 or more and 4 or less carbon atoms, the substituent may further have any substituent selected from an alkyl group having 1 or more and 4 or less carbon atoms, an aralkyl group, an aryl group, a heterocyclic group, a substituted amino group, an alkoxy group, an aryloxy group, a halogen atom, and a cyano group.

10. The organic light-emitting element according to claim 1, wherein the host comprises a heterocycle-containing compound represented by the following general formula [7] or the following general formula [8]:

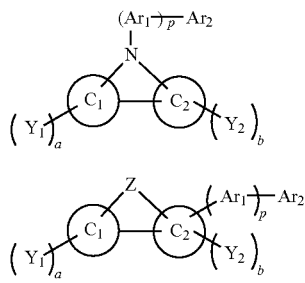

[7]

[8]

wherein in the general formulae [7] and [8]:
a ring $C_1$ and a ring $C_2$ each represent a cyclic structure selected from a benzene ring, a naphthalene ring, a phenanthrene ring, a triphenylene ring, and a chrysene ring, and may be identical to or different from each other, and the cyclic structure represented by any one of the ring $C_1$ and the ring $C_2$ may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group;

$Y_1$ and $Y_2$ each represent an alkyl group or an aromatic hydrocarbon group, and the alkyl group and aromatic hydrocarbon group represented by any one of $Y_1$ and $Y_2$ may each further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group;

a represents an integer of 0 to 4, and when a represents 2 or more, multiple $Y_1$'s may be identical to or different from each other;

b represents an integer of 0 to 4, provided that when the ring $C_2$ comprises a benzene ring, b represents an integer of 0 to 3, and when b represents 2 or more, multiple $Y_2$'s may be identical to or different from each other;

$Ar_1$ represents a divalent aromatic hydrocarbon group, and the divalent aromatic hydrocarbon group represented by $Ar_1$ may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group;

$Ar_2$ represents a monovalent aromatic hydrocarbon group, and the monovalent aromatic hydrocarbon group represented by $Ar_2$ may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group; and p represents an integer of 0 to 4, and when p represents 2 or more, multiple $Ar_1$'s may be identical to or different from each other; and wherein in the general formula [8], Z represents an oxygen atom or a sulfur atom.

11. The organic light-emitting element according to claim 10, wherein in the heterocycle-containing compound represented by the general formula [8], a heterocycle formed of Z, the ring $C_1$, and the ring $C_2$ comprises any one of heterocycles represented by the following general formulae [9] to [16]:

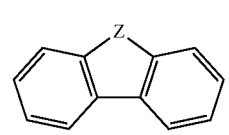

[9]

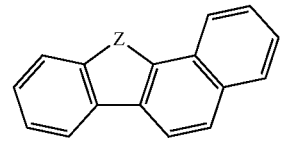

[10]

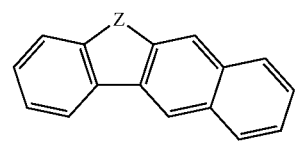

[11]

173
-continued

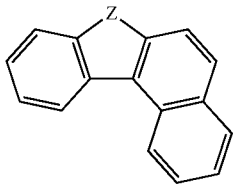 [12]

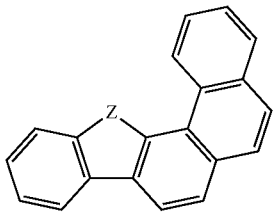 [13]

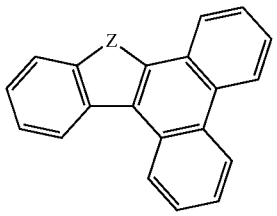 [14]

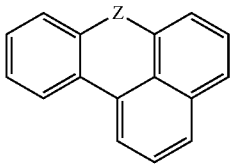 [15]

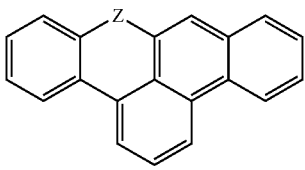 [16]

wherein in the general formulae [9] to [16], Z represents an oxygen atom or a sulfur atom.

12. The organic light-emitting element according to claim 10, wherein the heterocycle-containing compound represented by the general formula [8] comprises a benzophenanthrothiophene compound represented by the following general formula [17]:

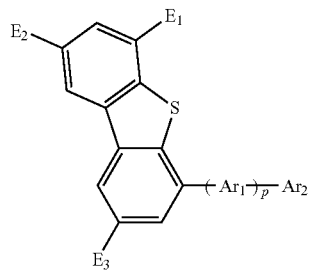 [17]

wherein in the general formula [17], $E_1$ to $E_3$ each represent a hydrogen atom, an alkyl group having 1 or more and 4 or less carbon atoms, or an aromatic hydrocarbon group, and when any one of substituents represented by $E_1$ to $E_3$ is an alkyl group having 1 or more and 4 or less carbon atoms or an aromatic hydrocarbon group, the substituent may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group.

13. The organic light-emitting element according to claim 10, wherein the heterocycle-containing compound represented by the general formula [8] comprises a benzonaphthothiophene compound represented by the following general formula [18]:

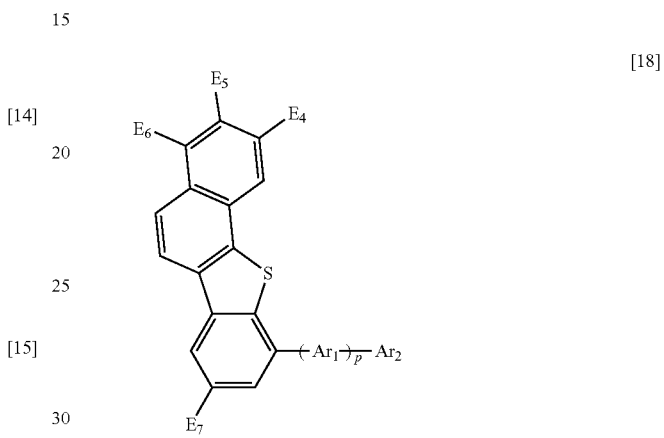 [18]

wherein in the general formula [18], $E_4$ to $E_7$ each represent a hydrogen atom, an alkyl group having 1 or more and 4 or less carbon atoms, or an aromatic hydrocarbon group, and when any one of substituents represented by $E_4$ to $E_7$ is an alkyl group having 1 or more and 4 or less carbon atoms, or an aromatic hydrocarbon group, the substituent may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group.

14. The organic light-emitting element according to claim 10, wherein the heterocycle-containing compound represented by the general formula [8] comprises a benzophenanthrothiophene compound represented by the following general formula [19]:

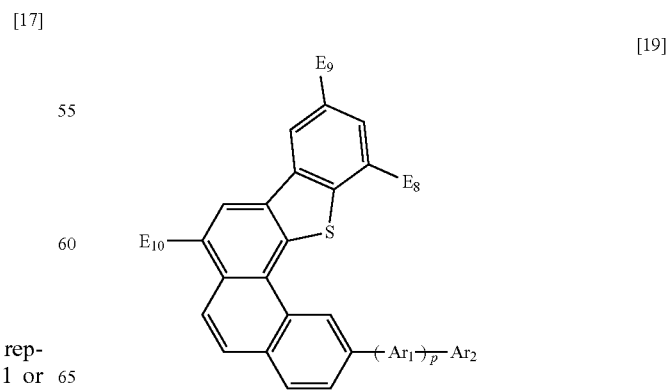 [19]

wherein in the general formula [19], $E_8$ to $E_{10}$ each represent a hydrogen atom, an alkyl group having 1 or more and 4 or less carbon atoms, or an aromatic hydrocarbon group, and when any one of substituents represented by $E_8$ to $E_{10}$ is an alkyl group having 1 or more and 4 or less carbon atoms or an aromatic hydrocarbon group, the substituent may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group.

15. The organic light-emitting element according to claim 10, wherein the heterocycle-containing compound represented by the general formula [8] comprises a dibenzoxanthene compound represented by the following general formula [20]:

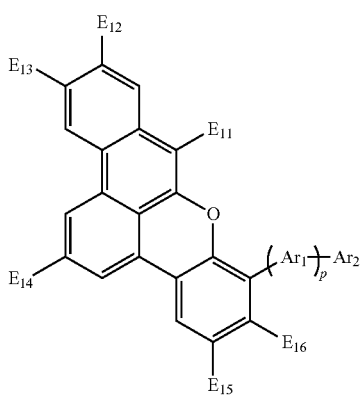

[20]

wherein in the general formula [20], $E_{11}$ to $E_{16}$ each represent a hydrogen atom, an alkyl group having 1 or more and 4 or less carbon atoms, or an aromatic hydrocarbon group, and when any one of substituents represented by $E_{11}$ to $E_{16}$ is an alkyl group having 1 or more and 4 or less carbon atoms or an aromatic hydrocarbon group, the substituent may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group.

16. The organic light-emitting element according to claim 10, wherein the heterocycle-containing compound represented by the general formula [8] comprises a dibenzoxanthene compound represented by the following general formula [21]:

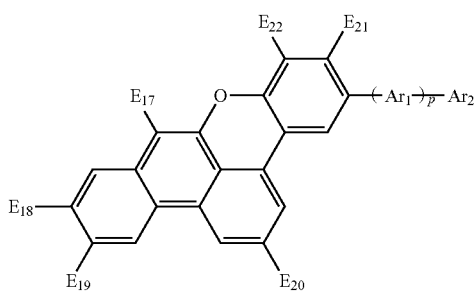

[21]

wherein in the general formula [21], $E_{17}$ to $E_{22}$ each represent a hydrogen atom, an alkyl group having 1 or more and 4 or less carbon atoms, or an aromatic hydrocarbon group, and when any one of substituents represented by $E_{17}$ to $E_{22}$ is an alkyl group having 1 or more and 4 or less carbon atoms or an aromatic hydrocarbon group, the substituent may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group.

17. The organic light-emitting element according to claim 12, wherein in the heterocycle-containing compound represented by any one of the general formulae [17] to [21]:
the p represents 1;
the $Ar_1$ represents a phenylene group, a biphenylene group, a terphenylene group, a naphthalenediyl group, a fluorenediyl group, a phenanthrenediyl group, a chrysenediyl group, or a triphenylenediyl group;
the $Ar_1$ may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group;
the $Ar_2$ represents a phenyl group, a biphenyl group, a terphenyl group, a naphthyl group, a fluorenyl group, a phenanthrenyl group, a chrysenyl group, or a triphenylenyl group; and
the $Ar_2$ may further have a substituent selected from an alkyl group having 1 or more and 4 or less carbon atoms, a halogen atom, an alkoxy group, a substituted amino group, a cyano group, a trifluoromethyl group, a heteroaromatic group, and an aromatic hydrocarbon group.

18. The organic light-emitting element according to claim 12, wherein in the heterocycle-containing compound represented by any one of the general formulae [17] to [21], each of the $E_1$ to $E_{22}$ represents a hydrogen atom.

19. The organic light-emitting element according to claim 1, wherein the emission layer includes the iridium complex represented by the general formula [1], the heterocycle-containing compound, and a third component; and
wherein a content of the third component is less than 50 wt % with reference to the total amount of the constituent materials for the emission layer.

20. The organic light-emitting element according to claim 19, wherein a highest occupied molecular orbital (HOMO) of the third component is higher than an HOMO of the heterocycle-containing compound.

21. The organic light-emitting element according to claim 19, wherein a lowest unoccupied molecular orbital (LUMO) of the third component is higher than an LUMO of the heterocycle-containing compound.

22. The organic light-emitting element according to claim 19, wherein the third component comprises an iridium complex.

23. The organic light-emitting element according to claim 1, wherein a maximum peak wavelength of an emission spectrum of light output from the emission layer is 580 nm or more and 650 nm or less.

24. A display apparatus comprising multiple pixels, wherein the pixels each have the organic light-emitting element according to claim 1 and an active element connected to the organic light-emitting element.

25. The display apparatus according to claim 24, wherein an electrode of the active element is formed of a transparent oxide semiconductor.

26. The display apparatus according to claim 24, further comprising a color filter.

27. A display apparatus, which is formed by stacking the organic light-emitting element according to claim 1, to thereby output white light as a whole.

28. A lighting apparatus comprising:
the organic light-emitting element according to claim 1; and
an inverter circuit connected to the organic light-emitting element.

* * * * *